United States Patent [19]

Nishiyama et al.

[11] Patent Number: 5,600,569
[45] Date of Patent: Feb. 4, 1997

[54] METHOD, SYSTEM, AND APPARATUS FOR AUTOMATICALLY DESIGNING LOGIC CIRCUIT, AND MULTIPLIER

[75] Inventors: Tamotsu Nishiyama; Shintaro Tsubata, both of Osaka, Japan

[73] Assignee: Matsushita Electric Industrial Co., Ltd., Kadoma, Japan

[21] Appl. No.: 300,802

[22] Filed: Sep. 2, 1994

[30] Foreign Application Priority Data

Sep. 2, 1993 [JP] Japan .................................. 5-218780

[51] Int. Cl.$^6$ .................................................. G06F 17/50
[52] U.S. Cl. ........................... 364/489; 364/754; 364/757
[58] Field of Search ..................... 364/488, 489, 364/490, 736, 754, 757

[56] References Cited

U.S. PATENT DOCUMENTS

| | | | |
|---|---|---|---|
| 4,792,909 | 12/1988 | Serlet ....................... | 364/491 |
| 5,043,914 | 8/1991 | Nishiyama et al. ............ | 364/513 |
| 5,146,583 | 9/1992 | Matsunaka et al. ............ | 395/500 |
| 5,200,907 | 4/1993 | Tran ......................... | 364/490 |
| 5,313,414 | 5/1994 | Yang et al. .................. | 364/757 |
| 5,412,591 | 5/1995 | Bapst ........................ | 364/757 |

FOREIGN PATENT DOCUMENTS

| | | |
|---|---|---|
| 0309292 | 3/1989 | European Pat. Off. . |
| 0447244 | 3/1991 | European Pat. Off. . |
| 0605885 | 7/1994 | European Pat. Off. . |
| 51-64844 | 6/1976 | Japan . |
| 3-15984 | 1/1991 | Japan . |
| 3-17737 | 1/1991 | Japan . |

OTHER PUBLICATIONS

NIKKEI Electronics, May 29, 1978, pp. 76–89.
Patent Abstracts of Japan, vol. 18, No. 606 (P–1827) (Aug. 12, 1994).
Patent Abstracts of Japan, vol. 18, No. 631 (P–1836) (Sep. 2, 1994).
Patent Abstracts of Japan, vol. 15, No. 136 (P–1187) (Jan. 24 1991).
Patent Abstracts of Japan, vol. 15, No. 140 (P–1188) (Jan. 25, 1991).

*Primary Examiner*—Vincent N. Trans
*Attorney, Agent, or Firm*—McDermott, Will & Emery

[57] ABSTRACT

With respect to each bit of a multiplier factor, it is judged whether or not the multiplier factor is a variable or a constant. If the multiplier factor is a constant, it is judged whether or not a bit of concern in the multiplier factor has the value of 1. Only if the bit of concern in the multiplier factor is 1, there is generated a circuit for outputting, as a partial product, a signal indicating a multiplicand. The signal indicating the multiplicand is then shifted by one bit so that the resulting signal is newly set as the signal indicating the multiplicand. By repeatedly executing the foregoing process with respect to all the bits of the multiplier factor, a circuit for calculating a partial product with respect to each bit of the multiplier factor is generated.

44 Claims, 27 Drawing Sheets

```
wire    sig1,sig2,...,sig7;
assign  sig3=sig6 & sig7;
assign  {sig4,sig5}=sig1+sig2+sig3;
```

| 31 IDENTIFICATION NAME | 32 ATTRIBUTE CODE | 33 ATTRIBUTE VALUE |
|---|---|---|
| (gate01 ::: | a_kind_of :: | adder ; |
|  | input :: | [ sig1,sig2,sig3 ]; |
|  | output :: | [ sig4,sig5 ]) |
| (gate02 ::: | a_kind_of :: | and ; |
|  | input :: | [ sig6,sig7 ]; |
|  | output :: | sig3) |

```
wire [7:0]  a;
wire [15:0] b;
assign b=a*8'h82;
```

```
(gate1  :::  a_kind_of  ::  multiplier;
             input(i1)   ::  [a(7:0)];
             input(i2)   ::  [130];
             bitwidth(i1) :: 8 ;
             bitwidth(i2) :: 8 ;
             output(o)   ::  b(15:0)).
```

(STEP 1002)

(STEP 1008)

(STEP 1010)

Fig.20(a)
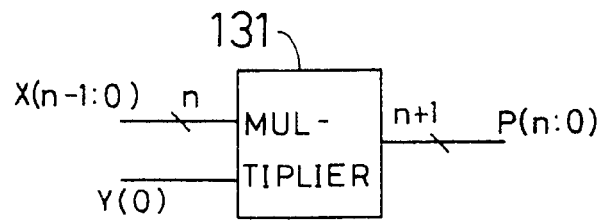
Fig.20(b)
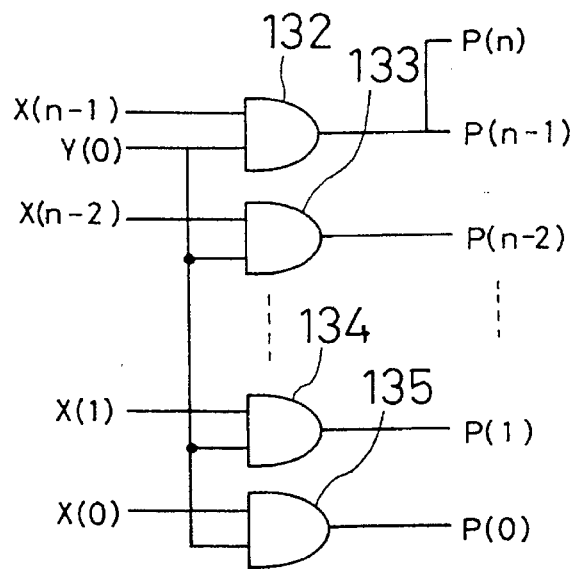
Fig.20(c)
```
(gate     :::  a_kind_of  ::  multiplier;
                input(i1)  ::  X(n-1:0);
                input(i2)  ::  Y(0);
                output     ::  P(n:0))
-->
(gate1    :::  a_kind_of  ::  and;
                input(i1)  ::  X(0);
                input(i2)  ::  Y(0);
                output     ::  P(0)).
                    .
                    .
                    .
(gate n   :::  a_kind_of  ::  and;
                input(i1)  ::  X(n-1);
                input(i2)  ::  Y(0);
                output     ::  P(n-1)).
(gate n+1:::  a_kind_of  ::  netcon;
                input(i)   ::  P(n-1);
                output  .  ::  P(n)).
```

FIG.21
CONVERSION RULE 2
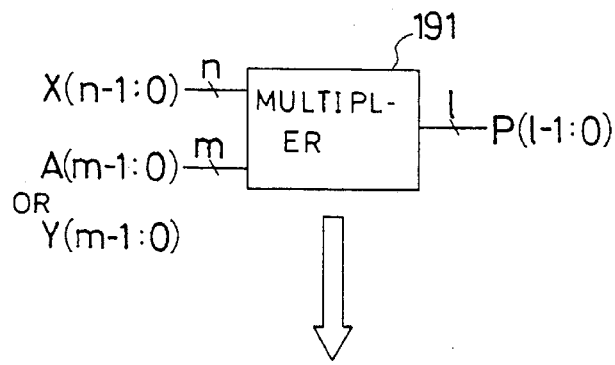
i) WHEN posibits(A) ≥ 3 OR MULTIPLIER FACTOR IS VARIABLE Y
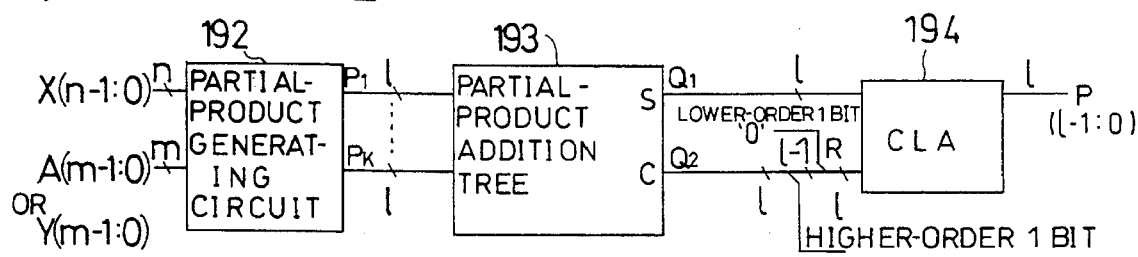
ii) WHEN posibits(A) = 2
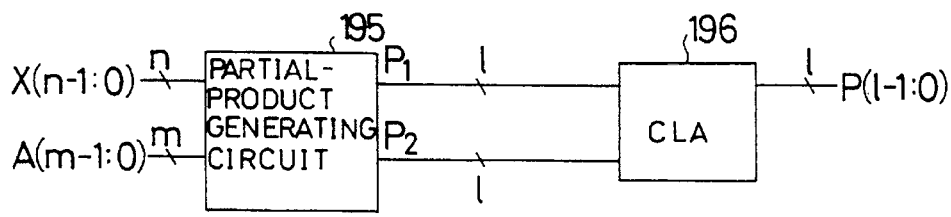
iii) WHEN posibits(A) = 1
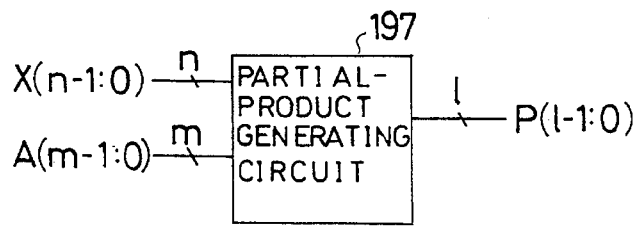

FIG. 22
CONVERSION RULE3
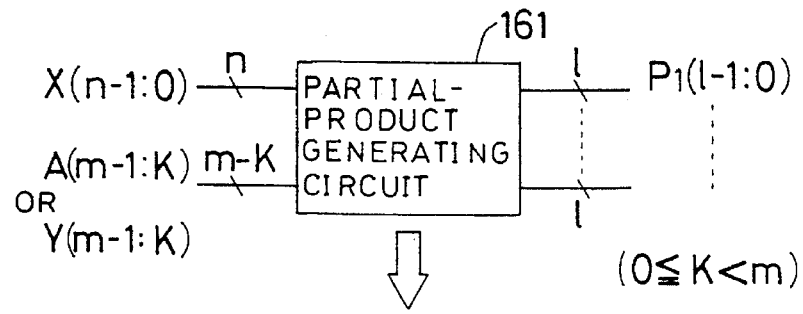
i) WHEN MULTIPLIER FACTOR IS VARIABLE
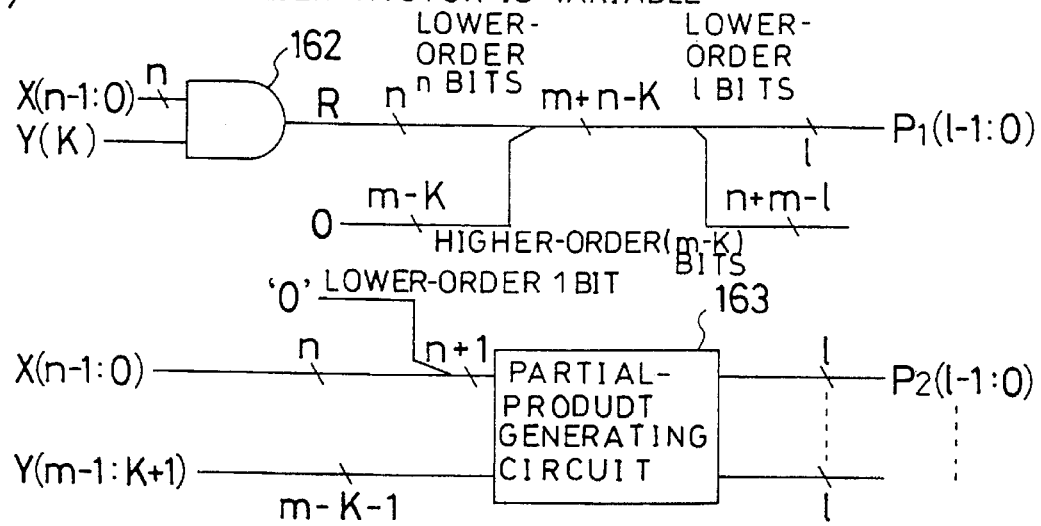
ii) WHEN MULTIPLIER FACTOR IS CONSTANT AND A(K)=1
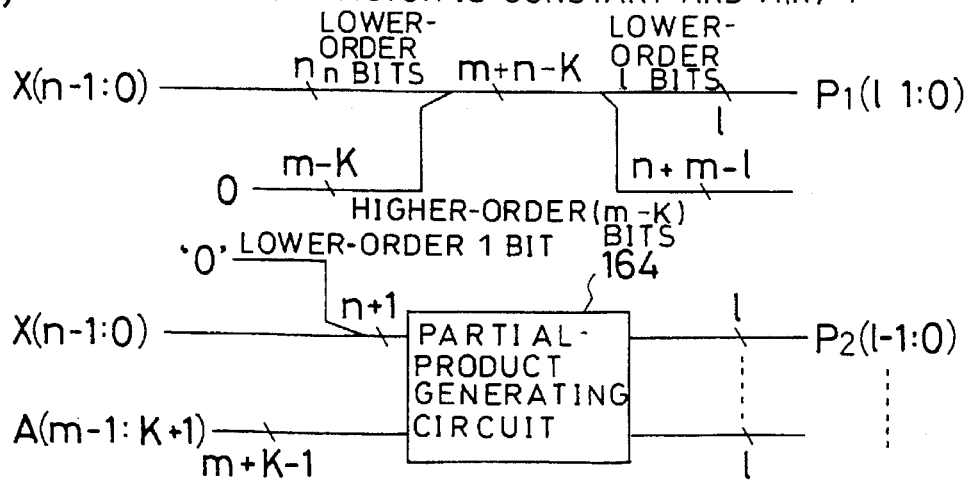

FIG. 23
CONVERSION RULE 4
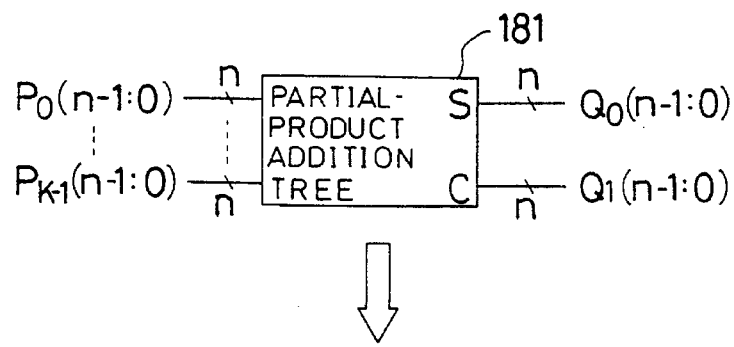
i) WHEN K>3
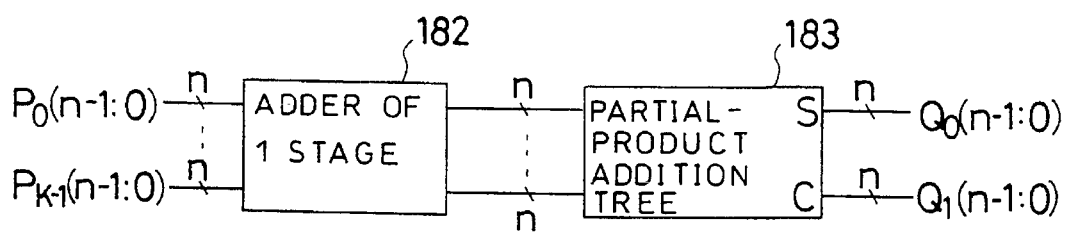
ii) WHEN K=3
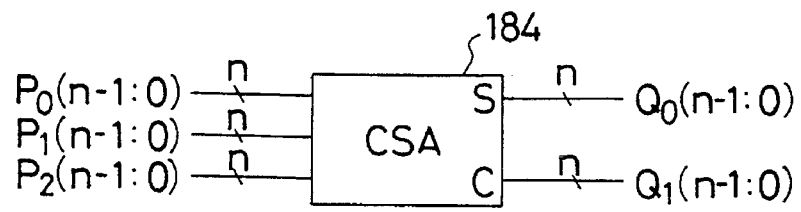

FIG. 24
CONVERSION RULE 5
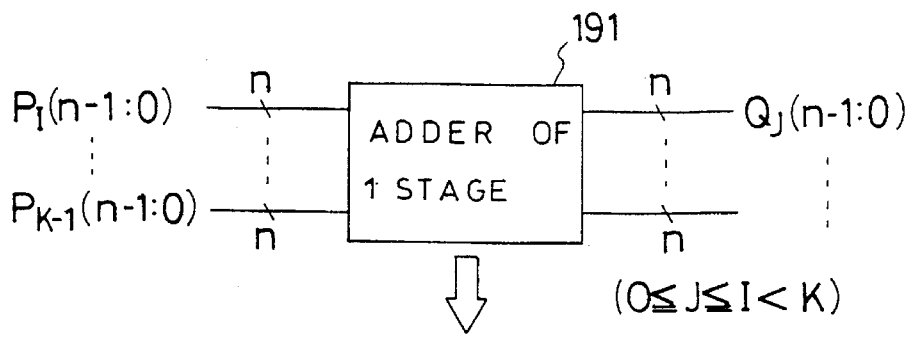
i) WHEN I < K−3
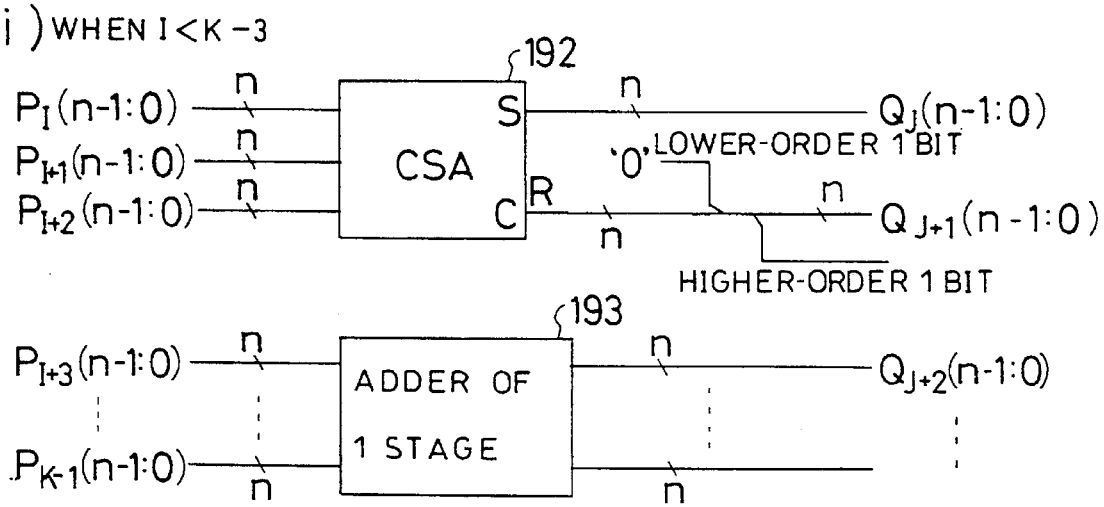
ii) WHEN I = K−3
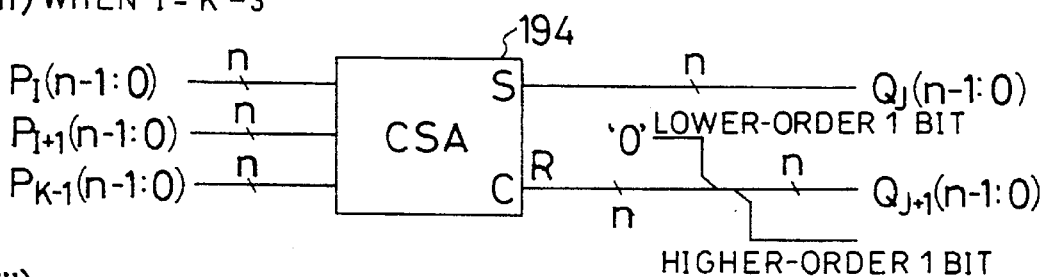
iii) WHEN I = K−2
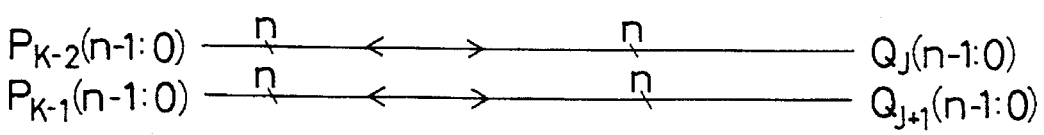
iv) WHEN I = K−1

FIG. 25
CONVERSION RULE 6
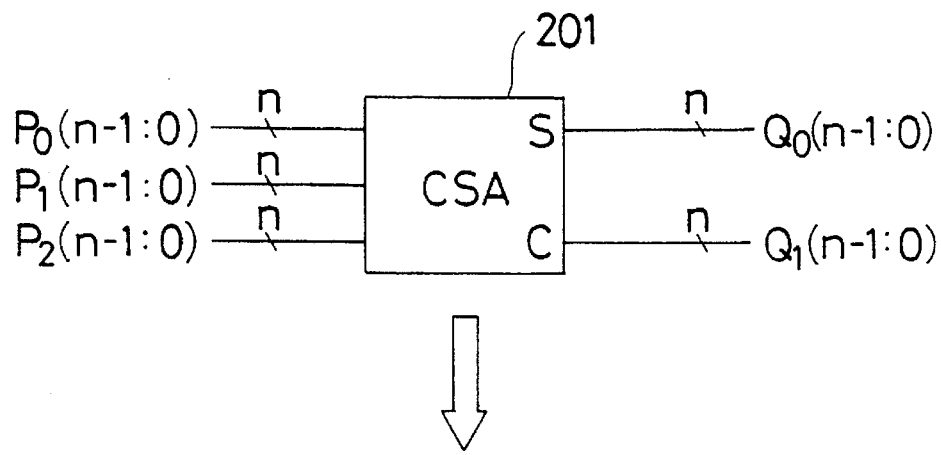
i) WHEN n > 1
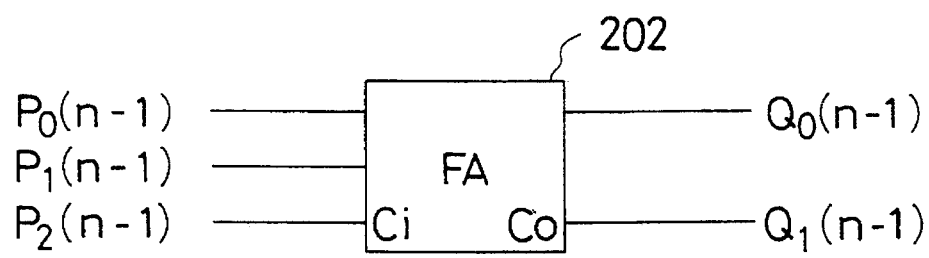
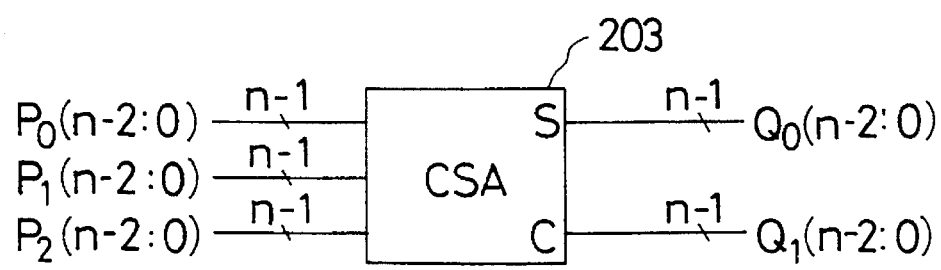
ii) WHEN n = 1
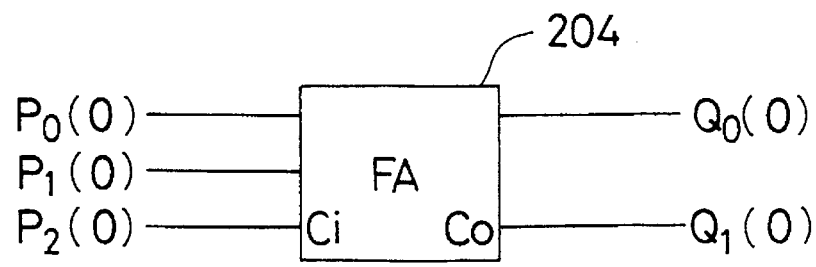

FIG. 26
CONVERSION RULE 7
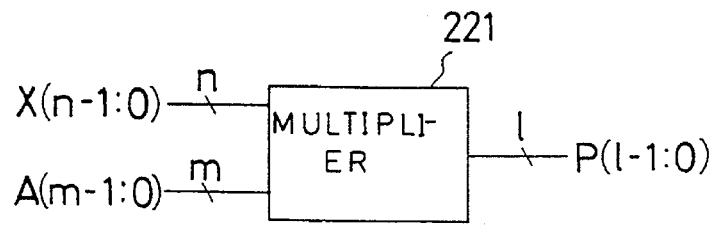
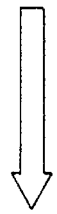
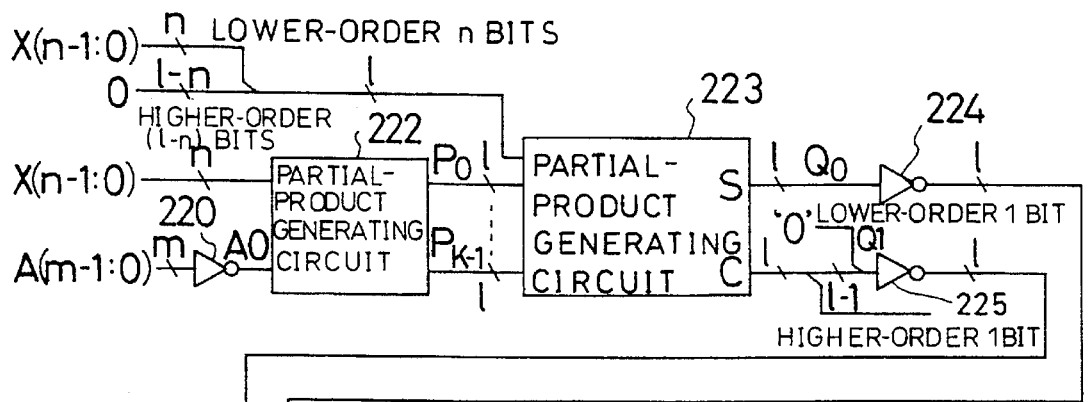
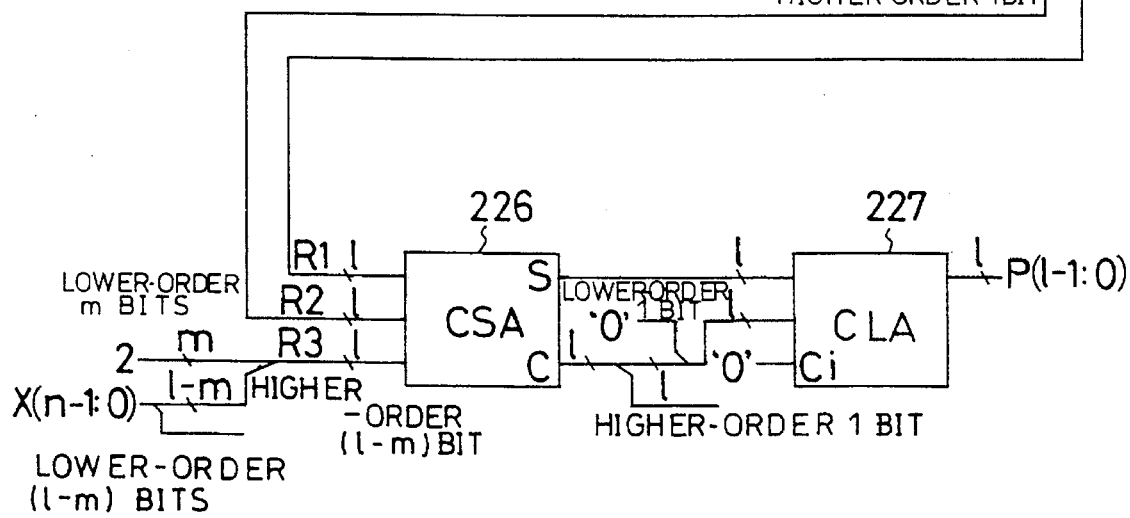

FIG.27
CONVERSION RULE 8
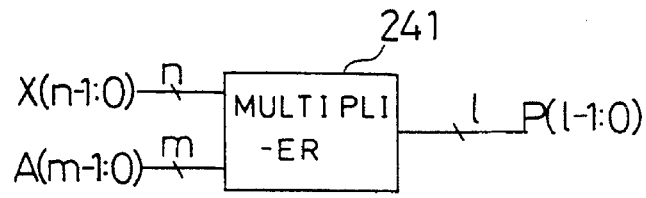
WITH RESPECT TO A1 AND A2 WHICH SATISFY A=A1-A2 AND WHICH MINIMIZE posibits(A1) + posibits(A2) (A1≠0 AND A2≠0)
i) WHEN posibits(A1) + posibits(A2) > 2
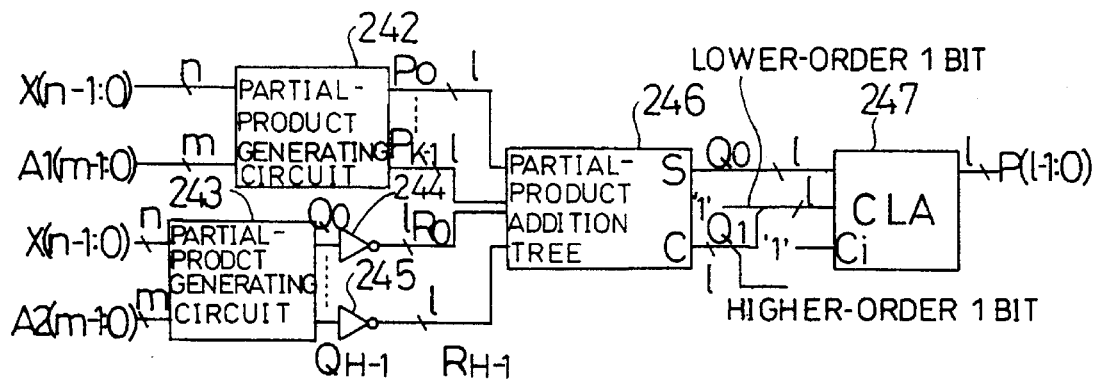
ii) WHEN posibits(A1) + posibits(A2) = 2
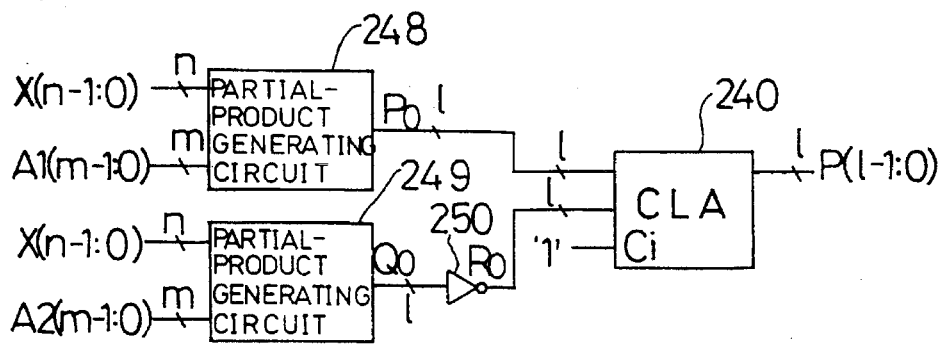

METHOD, SYSTEM, AND APPARATUS FOR AUTOMATICALLY DESIGNING LOGIC CIRCUIT, AND MULTIPLIER

BACKGROUND OF THE INVENTION

The present invention relates to a method, system, and apparatus for automatically designing a logic circuit, particularly a multiplier or a logic circuit including a multiplier, and to a multiplier.

Conventional multipliers for performing multiplication with digital information are often used not only as single, independent LSIs but also as elements to be mounted in such LSIs as DSP (digital signal processor). However, as the bit width is increased in multiplication and their applications are more diversified, multipliers of this type are required to have reduced circuit size and chip area as well as to operate at higher speed. To meet the requirements, circuit systems using various multiplication methods have been proposed.

For example, a multiplication method using the Booth's 2-bit recode system, which is one of the highest-speed multiplication methods, is disclosed in "Nikkei Electronics" (May 29, pp.76–89(1978)). The multiplication method uses the following algorithm in order to increase the speed of multiplication.

If an n-bit multiplicand X is to be multiplied by an m-bit multiplier factor Y, e.g., the multiplier factor Y is represented by two's complements as follows:

$$Y = -y_s * 2^{m-1} + \sum_{i=1}^{m-1} (y_i * 2^{i-1}) \quad (1)$$

$$= \sum_{i=0}^{q-1} \{(y_{2i} + y_{2i+1} - 2y_{2i+2}) * 2^{2i}\},$$

where $y_m = y_s$, $q = m/2$ if m is an even number or $q = (m-1)/2$ if m is an odd number, and $y_0 = 0$ (y is a value given for convenience).

Hence, the product P of X and Y becomes $$P = X * Y \quad (2)$$

$$= \sum_{i=0}^{q-1} \{(y_{2i} + y_{2i+1} - 2y_{2i+2}) * X * 2^{2i}\}.$$

Here, since the values of $y_{2i}$, $y_{2i+1}$, and $y_{2i+2}$ are 0 or 1, $(y_{2i} + y_{2i+1} - 2y_{2i+2})$ becomes $0, \pm 1,$ or $\pm 2$, so that each of their partial products becomes a value obtained by multiplying $0$, $\pm X$, or $\pm 2X$ by $2^{2i}$.

TABLE 1

| $y_{2i+2}$ | $y_{2i+1}$ | $y_{2i}$ | $(y_{2i} + y_{2i+1} - 2y_{2i+2})$ |
|---|---|---|---|
| 0 | 0 | 0 | 0 |
| 0 | 0 | 1 | +1 |
| 0 | 1 | 0 | +1 |
| 0 | 1 | 1 | +2 |
| 1 | 0 | 0 | −2 |
| 1 | 0 | 1 | −1 |
| 1 | 1 | 0 | −1 |
| 1 | 1 | 1 | 0 |

Here, a circuit for generating the partial products can be composed of a shifter primarily for shifting the multiplicand $\pm X$ by one bit till it is doubled and a shifter for shifting a mantissa $(0, \pm X$ or $\pm 2X)$ by two bits till it is raised to the power of $2^{2i}$ (weighing).

As for the number of logic stages in a circuit for calculating the total sum of the partial products, since the number of the partial products becomes $q = m/2$ (m is an even number) or $q = (m-1)/2$ (m is an odd number), it becomes approximately $\log_2 m - 1$ (m is an even number) or $\log_2(m-1) - 1$ (m is an odd number) when a 2-input adder is connected so as to form a binary tree.

As an example of high-speed multipliers not using the Booth's 2-bit recode system, Japanese Patent Publication no. 03-017737 discloses a multiplier using redundant binary code.

With the multiplier mentioned above, when the multiplier factor is composed of 24 bits, the number of its partial products becomes 12 and the number of its logic stages becomes 4.

On the other hand, the increase in multiplication speed and the decrease in circuit size have been pursued not only by improving the performance of such a multiplication algorithm as mentioned above, but also by optimizing the circuit on the level of logic elements.

In recent years, multipliers and logic circuits containing multipliers are mostly designed by using automatic designing systems. Such a system is intended to eliminate a redundant portion of the circuit or to perform other operations by replacing a part of the circuit with an equivalent circuit having a smaller number of logic elements and logic stages in the case of, e.g., expanding circuit information on the level of logic elements to circuit information on the level of mounted elements, which are actually mounted in a chip.

If functional description information, which represents a function requested on the circuit in a hardware description language or the like, is inputted to such an automatic designing system, the system converts it to functional circuit information in an internal representation form, which represents a circuit composed of virtual functional elements whose functions are primarily and solely defined. Then, the resulting functional circuit information is further converted to logic circuit information which represents a circuit composed of real logic circuits, followed by the generation of mounted circuit information which represents a circuit to which real elements, mounted by specified technology, are allotted.

In the case where the function represented by the above functional description information includes multiplication, if a versatile multiplier having a specified bit width (e.g., 4, 8, 17, or 32 bits) has previously been in a library as a hardware macro and hence is available, for example, the versatile multiplier is allotted to the logic circuit. If a multiplier which is not in the library is required, a logic circuit constituting a shift-and-add multiplier or the like is newly generated. If either of the multiplier factor or multiplicand is a constant and the value thereof is a certain power-of-2 number, a circuit using a shifter is normally generated.

If the multiplier factor is a constant the value of which is not a power-of-2 number, however, the values of all the bits of a partial product that corresponds to a bit having the value of 0 in the multiplier factor become 0, so that signals from a circuit for generating or adding up such partial products disadvantageously remain in the same state.

To solve the problem, conventional automatic designing apparatus have adopted a method in which a multiplying circuit using variables as its multiplier factor and multiplicand and a circuit for generating a constant are generated before the circuit is optimized on the level of logic elements as mentioned above, thereby accomplishing the deletion of logic elements which generate signals remaining in the same state.

With the conventional automatic designing systems, however, the optimization of the circuit on the level of logic elements is localized, for the replacement by an equivalent circuit having a smaller number of logic elements and logic stages is limited to portions of the circuit that coincide with specific patterns which were preliminarily set. If such optimization is performed in the case where the multiplier factor or multiplicand is a constant, a circuit having the minimum number of logic elements and the like cannot necessarily be obtained. In particular, when carry-save adders are connected in a tree structure so as to add up partial products, the resulting tree is normally ill-balanced if the portion associated with a circuit for adding up the partial products in which the values of all the bits are 0 is omitted. Therefore, it is difficult to minimize the number of logic elements and the number of logic stages by partially replacing the circuit. Moreover, the conventional automatic designing apparatus were designed without any consideration of increasing the number of particular products in which the values of all the bits are 0.

SUMMARY OF THE INVENTION

The present invention has been achieved in view of the foregoing. It is therefore an object of the present invention to provide, in the case of generating a multiplier for performing multiplication by using a constant as its multiplier factor or multiplicand and a logic circuit including such a multiplier, a method, system, and apparatus for automatically designing a logic circuit whereby a circuit having a smaller number of logic elements and logic stages can be generated and to provide a high-speed multiplier which performs multiplication by using a constant as its multiplier factor or multiplicand and which has a smaller number of logic elements and logic stages, appropriately for large-scale integration.

To attain the above object, a method of automatically designing a logic circuit for generating information on the logic circuit for calculating the product of a multiplier factor and a multiplicand comprises the steps of: with respect to each bit of the multiplier factor, (a) judging whether the multiplier factor is a variable or a constant; (b) if the multiplier factor is a variable, generating information on a circuit for selecting, based on the value of a bit of concern in the multiplier factor, either of a signal indicating the multiplicand and a signal indicating 0 and outputting the selected signal as a partial product; (c) if the multiplier factor is a constant, judging whether or not the value of the bit in the multiplier factor is 1; (d) if the value of the bit in the multiplier factor is 1, generating information on a circuit for outputting the signal indicating the multiplicand as a partial product; and (e) after executing the steps (a) to (d), generating information on a shift circuit for shifting the signal indicating the multiplicand by one bit and newly setting the output signal from the shift circuit as a signal indicating the multiplicand to be used in the steps (a) to (d), the steps (a) to (e) being repeatedly executed for all the bits of the multiplier factor.

With the above structure, if the multiplier factor is a constant in the stage of designing a logic circuit with the multiplying function, the circuit for calculating, as a partial product, the product of a bit having the value of 1 in the multiplier factor and the multiplicand is solely generated, while the circuit for calculating a partial product with respect to a bit having the value of 0 in the multiplier factor is not generated. As a result, the number of the circuits for calculating partial products in the logic circuit to be generated can be reduced, while the area of the circuits for adding up partial products can be reduced. Consequently, the area of the logic circuit can be reduced and higher-speed calculation can easily be performed.

To attain the above object, a method of automatically designing a logic circuit for generating information on the logic circuit for calculating the product of a multiplier factor and a multiplicand comprises the steps of: with respect to each group consisting of n partial products obtained by evenly dividing a plurality of partial products which are the products of the individual bits of the multiplier factor and the multiplicand, (a) generating information on an adding circuit for receiving the n partial products in a group of concern and outputting the sum of the n partial products in the above group as m ($<n$) partial products; and with respect to all the plurality of partial products, (b) after repeatedly executing the step (a), newly setting all the partial products that are the outputs of the adding circuit generated in the step (a) and those partial products of the plurality of partial products which were not received by the adding circuit generated in the step (a) as the plurality of partial products to be processed in the step (a), the steps (a) and (b) being repeatedly executed.

With the above structure, the circuit for adding up partial products can be generated by arranging adders with less carry propagation in a tree structure in the stage of designing a logic circuit with the multiplying function. Consequently, in the resulting logic circuit, the number of stages for adding up products can be reduced and carry is not propagated in individual addition, thereby implementing multiplication at a higher speed.

To attain the above object, a method of automatically designing a logic circuit for generating information on the logic circuit for calculating the product of a multiplier factor and a multiplicand comprises the steps of: (a) determining two constants A1 and A2 so that the difference (A1–A2) between the constants A1 and A2 equals the constant multiplier factor A; (b) generating information on a first partial-product generating circuit for receiving the constant A1 and the multiplicand X and outputting their partial products; (c) generating information on a second partial-product generating circuit for receiving the constant A2 and the multiplicand X and outputting their partial products; (d) generating information on a logic NOT circuit for receiving the output signals from the second partial-product generating circuit and outputting the logic NOT signals thereof; and (e) generating information on a circuit for receiving the output signals from the first partial-product generating circuit, the output signals from the logic NOT circuit, and a correction signal, calculating the sum thereof, and outputting the sum as the product of the multiplier factor A and the multiplicand X.

A method of automatically designing a logic circuit for generating information on the logic circuit for calculating the product of a multiplier factor and the multiplicand comprises the steps of: (a) determining three constants A1, A2, and A3 so that the difference A1–(A2+A3) between the constant A1 and the sum of the constants A2 and A3 equals the constant multiplier factor A; (b) Judging whether or not the constant A1 is equal to the multiplier factor A and whether or not each of the constants A2 and A3 is 0; (c) if the constant A1 is equal to the multiplier factor A, (c-1) generating information on a first partial-product generating circuit for receiving the multiplier factor A1 and the multiplicand X and outputting their partial products and (c-2) generating information on a first partial-product-sum circuit for receiving all the output signals from the first partial-product generating circuit, calculating the sum thereof, and outputting the sum as the product of the multiplier factor A and the multiplicand X; and (d) if the constant A1 is not equal to the multiplier factor A and at least either one of the constants A2 and A3 is not 0, (d-1) generating information on a second partial-product generating circuit for receiving the constant A1 and the multiplicand X and outputting their partial products, (d-2) generating information on a third partial-product generating circuit for receiving the constant A2 and A3 and the multiplicand X and outputting their partial products, (d-3) generating information on a first logic NOT circuit for receiving the output signals from the third partial-product generating circuit and outputting the logic NOT signals thereof, and (d-4) generating information on a second partial-product-sum circuit for receiving the output signals from the second partial-product generating circuit, the output signals from the first logic NOT circuit, and a first correction signal, calculating the sum thereof, and outputting the sum as the product of the multiplier factor A and the multiplicand X.

With the above structure, in the case where the multiplier factor A has a large number of bits the value of which is 1 in the stage of designing a logic circuit with the multiplying function, the multiplier factor A is divided into the constants A1 and A2 which satisfy A=A1−A2 (or the multiplier factor A is divided into the constants A1, A2, and A3 which satisfy A=A1−(A2+A3)), so that it becomes possible to keep the total number of the bits having the value of 1 in the constants A1 and A2 (or in the constants A1, A2, and A3) smaller than the number of the bits having the value of 1 in the multiplier factor A. Therefore, the number of partial products in the above logic circuit can be reduced.

To attain the above object, a method of automatically designing a logic circuit for generating information on the logic circuit for calculating the product of a multiplier factor and a multiplicand comprises the steps of: (a) producing the logic NOT signal of the constant multiplier factor A from the multiplier factor A; (b) with respect to each bit of the logic NOT signal of the multiplier factor A, (b-1) judging whether or not the value of a bit of concern in the logic NOT signal of the multiplier factor A is 1, (b-2) if the value of the bit in the logic NOT signal of the multiplier factor A is 1, generating information on a circuit for outputting a signal indicating the multiplicand X as a partial product, and (b-3) after executing the steps (b-1) and (b-2), generating information on a shift circuit for shifting the signal indicating the multiplicand X by one bit and newly setting the output signal from the shift circuit as the multiplicand X to be used in the steps (b-1) and (b-2), the steps (b-1) to (b-3) being repeatedly executed with respect to all the bits of the logic NOT signal of the multiplier factor A so as to generate information on a partial-product generating circuit; (c) generating information on a partial-product adding circuit for receiving all the output signals from the partial-product generating circuit and the signal indicating the multiplicand X and outputting the addition results as a specified number of partial products; (d) generating information on a logic NOT circuit for receiving the output signals from the partial-product adding circuit and outputting the logic NOT signals thereof; (e) generating a correction signal from the multiplicand X; and (f) generating information on a final sum circuit for receiving the correction signal and the output signals from the logic NOT circuit, calculating the sum thereof, and outputting the sum as the product of the multiplier factor A and the multiplicand X.

With the above structure, in the case where the number of the bits having the value of 1 in the constant multiplier factor A is large in the stage of designing a logic circuit with the multiplying function, the logic NOT signal of the multiplier factor A is produced, so that there can be generated the circuit for calculating partial products only with respect to the bits having the value of 1 in the logic NOT signal of the multiplier factor A. Consequently, it becomes possible to keep the number of the circuits for calculating partial products in the above logic circuit equal to or smaller than half the number of all the bits in the multiplier factor A.

To attain the above object, a system for automatically designing a logic circuit comprises: an input means for receiving various information; a storage means for storing the various information being processed; a processing means for producing information on the logic circuit for calculating the product of a multiplier factor and the multiplicand inputted from the input means; and an output means for outputting the information on the logic circuit produced by the processing means, wherein the processing means executes the steps of: (a) determining two constants A1 and A2 so that the difference (A1−A2) between the constants A1 and A2 equals the constant multiplier factor A; (b) judging which is the smaller of the number of the bits having the value of 1 in the multiplier factor A and the sum of the numbers of the bits having the value of 1 in the constants A1 and A2; (c) if the number of the bits having the value of 1 is the smaller, (c-1) generating information on a first partial-product generating circuit for receiving the multiplier factor A and the multiplicand X and outputting the products of the individual bits in the multiplier factor A and the multiplicand X as partial products, and (c-2) generating information on a first partial-product-sum circuit for receiving all the output signals from the first partial-product generating circuit, calculating the sum thereof, and outputting the sum as the product of the multiplier factor A and the multiplicand X; and (d) if the sum of the numbers of the bits having the value of 1 in the constants A1 and A2 is the smaller, (d-1) generating information on a second partial-product generating circuit for receiving the constant A1 and the multiplicand X and outputting their partial products, (d-2) generating information on a third partial-product generating circuit for receiving the constant A2 and the multiplicand X and outputting their partial products, (d-3) generating information on a logic NOT circuit for receiving the output signals from the third partial-product generating circuit and outputting the logic NOT signals thereof, and (d-4) generating information on a second partial- product-sum circuit for receiving the output signals from the second partial-product generating circuit, the output signals from the logic NOT circuit, and a correction signal, calculating the sum thereof, and outputting the sum as the product of the multiplier factor A and the multiplicand X.

An apparatus for automatically designing a logic circuit having the multiplying function for calculating the product of a multiplier factor and a multiplicand comprises: a means for receiving, from the outside, various information including information on the multiplier factor A, information on the multiplicand X, and information on the product P; a means for receiving the information on the multiplier factor A and determining information on a number A1 and information on a constant A2 so that the difference (A1−A2) between the number A1 and constant A2 equals the multiplier factor A; a means for receiving the information on the number A1 and the information on the multiplicand X and generating information on a first partial-product generating circuit which receives the number A1 and the multiplicand X and outputs, as partial products, the products of the individual bits the value of which is not 0 in the multiplier factor A and the multiplicand X; a means for receiving the information on the constant A2 and the information on the multiplicand X and generating information on a second partial-product generating circuit which receives the constant A2 and the multiplicand X and outputs, as partial products, the products of the individual bits the value of which is not 0 in the constant A2 and the multiplicand X; a means for receiving information on the output signals from the second partial-product generating circuit and generating information on a logic NOT circuit which receives the output signals from the second partial-product generating circuit and outputs the logic NOT signals thereof; a means for detecting the total number of the output signals from the first partial-product generating circuit and from the logic NOT circuit; a means for receiving information on the output signals from the first partial-product generating circuit and information on the output signals from the logic NOT circuit and generating information on a partial-product adding circuit which receives all the output signals from the first partial-product generating circuit and from the logic NOT circuit and outputs the addition results as partial products; a means for receiving either the information on the output signals from the logic NOT circuit or the information on the output signals from the second partial-product generating circuit and generating a correction signal based on the number of the output signals indicated by the received information; and a means for receiving information on the output signals from the partial-product adding circuit, information on the correction signal, and the information on the product P and generating information on a partial-product-sum generating circuit which calculates the sum of the output signals from the partial-product adding circuit and the correction signal, sets the sum to the product P as the product of the multiplier factor A and the multiplicand X, and outputs the product P.

With the above structure, if the processing means of the automatic designing system executes the sequence of processes or if the individual means of the automatic designing apparatus execute their respective processes, a logic circuit having a reduced number of partial products and a reduced number of logic stages can easily be generated.

To attain the above object, a multiplier for outputting the product of a multiplier factor A, which satisfies A=A1–A2 with respect to the constants A1 and A2, and a multiplicand X comprises: a first partial-product generating means for receiving the constant A1 and the multiplicand X and outputting partial products only with respect to the bits having the value of 1 in the constant A1; a second partial-product generating means for receiving the constant A2 and the multiplicand X and outputting partial products only with respect to the bits having the value of 1 in the constant A2; a logic NOT means for receiving the output signals from the second partial-product generating means and outputting the logic NOT signals thereof; and a partial-product-sum means for receiving the output signals from the first partial-product generating means, the output signals from the logic NOT means, and a correction signal, calculating the sum thereof, and outputting the sum as the product of the multiplier factor A and the multiplicand X.

A multiplier for outputting the product of a multiplier factor A and a multiplicand X comprises: a partial-product generating means for receiving the logic NOT signal of the multiplier factor A and the multiplicand X and outputting partial products only with respect to the bits having the value of 1 in the logic NOT signal of the multiplier factor A; a partial-product adding means for receiving the output signals from the partial-product generating means and the multiplicand X, adding up the output signals from the partial-product generating means and the multiplicand X by using a single-stage or multi-stage adding means, and outputting the addition results as partial products; a logic NOT means for receiving the output signals from the partial-product adding means and outputting the logic NOT signals thereof; and a partial-product-sum means for receiving the output signals from the logic NOT means and a correction signal which can be generated from the multiplicand X, calculating the sum of the output signals from the logic NOT means and the correction signal, and outputting the sum as the product of the multiplier factor A and the multiplicand X.

With the above structure, each partial-product generating means outputs a partial product only with respect to a bit having the value of 1 in the logic NOT signal of the multiplier factor A or in the constants A1 and A2 which satisfy A=A1–A2, so that the number of partial products can be reduced. In addition, the resulting partial products are added up by the addition tree consisting of carry-save adders, which serves as the partial-product adding means. Consequently, there can be provided a high-speed multiplier which has a reduced number of logic elements and a reduced number of logic stages, appropriately for large-scale integration.

BRIEF DESCRIPTION OF THE DRAWINGS

FIGS. 16(*a*) to 16(*c*) show an example of circuit data to be stored in the storage device of the automatic designing system according to the above first embodiment.

FIG. 17(a) is a view diagrammatically showing a circuit, FIG. 17(b) is a view showing functional description information, and FIG. 17(c) is a view showing functional circuit information;

FIGS. 20(a) and (b) are a view diagrammatically showing a conversion rule 1;

FIG. 20(c) is a view showing an actual representation form of the conversion rule 1;

FIG. 21 is a view diagrammatically showing a conversion rule 2;

FIG. 22 is a view diagrammatically showing a conversion rule 3;

FIG. 23 is a view diagrammatically showing a conversion rule 4;

FIG. 24 is a view diagrammatically showing a conversion rule 5;

FIG. 25 is a view diagrammatically showing a conversion rule 6;

FIG. 26 is a view diagrammatically showing a conversion rule 7; and

FIG. 27 is a view diagrammatically showing a conversion rule 8.

Figure 1:
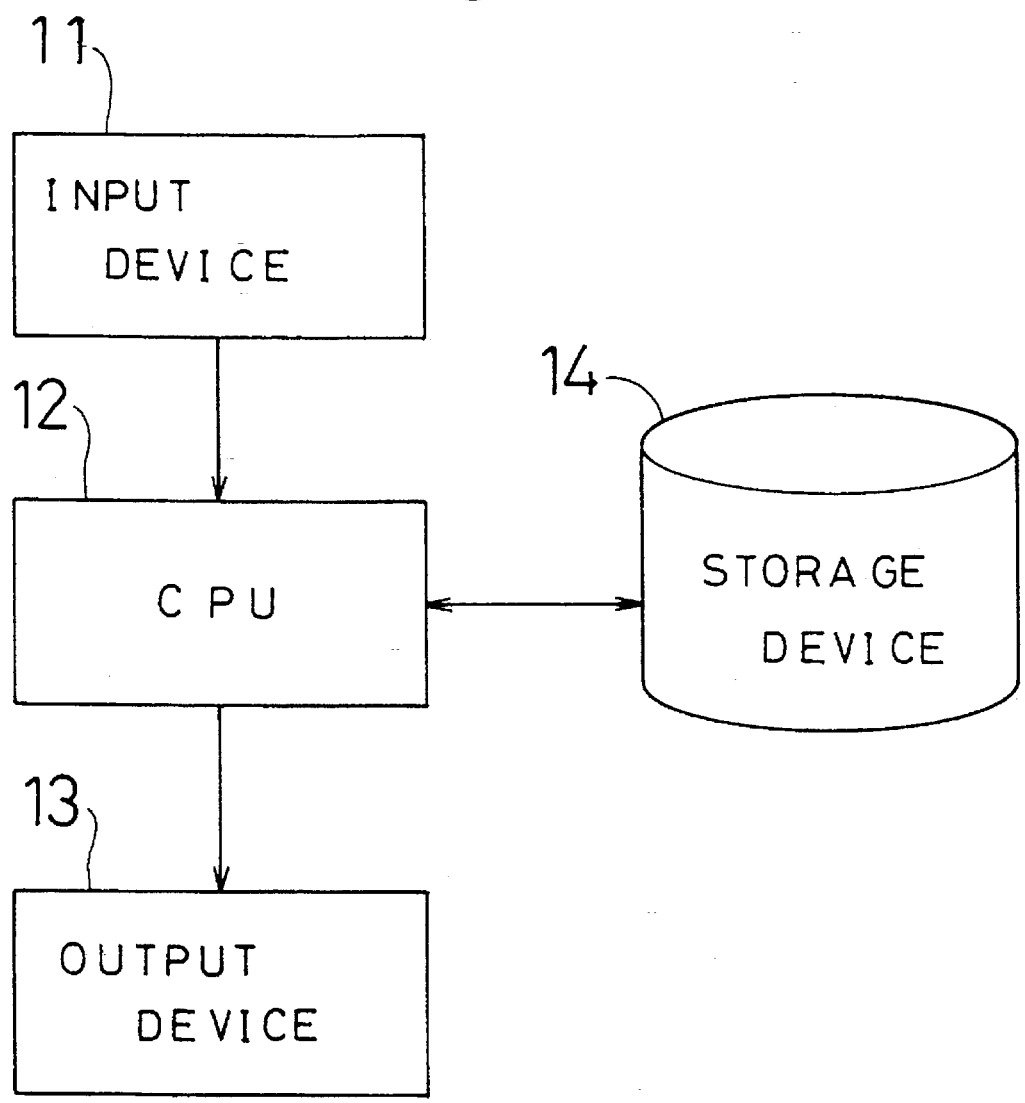
FIG. 1 is a block diagram showing the structure of an automatic logic-circuit designing system according to a first embodiment of the present invention.

DETAILED DESCRIPTION OF THE PREFERRED EMBODIMENTS (First Embodiment)

Referring now to the drawings, an automatic logic-circuit designing system according to a first embodiment of the present invention will be described below.

A description will be given first to the hardware structure of the automatic designing system according to the first embodiment with reference to FIGS. 1 and 2.

FIG. 1 is a block diagram showing an example of the hardware structure of an automatic logic-circuit designing system. In the drawing, an input device 11 is for inputting functional description information on a circuit to be designed by the automatic designing system. The input device 11 can be composed of a keyboard, mouse, light pen, card reader, or schematic entry system. Aside from the foregoing devices that receive the inputting of information through a direct operation by an operator, it can also be composed of a magnetic disk device, which stores information preliminarily inputted through the foregoing devices as a file, or of an network device which receives information sent from another device.

A CPU 12 is for performing circuit-designing processes such as logical synthesis or circuit optimization by executing a variety of processes, which will be described below.

An output device 13 is for outputting circuit information which is the result of the designing process by the CPU 12 or a variety of information on processing. The output device 13 can be composed of a graphic display, character display, printer, or plotter. The output device 13 can also be composed of the magnetic disk device or network device, similarly to the input device 11.

Figure 2:
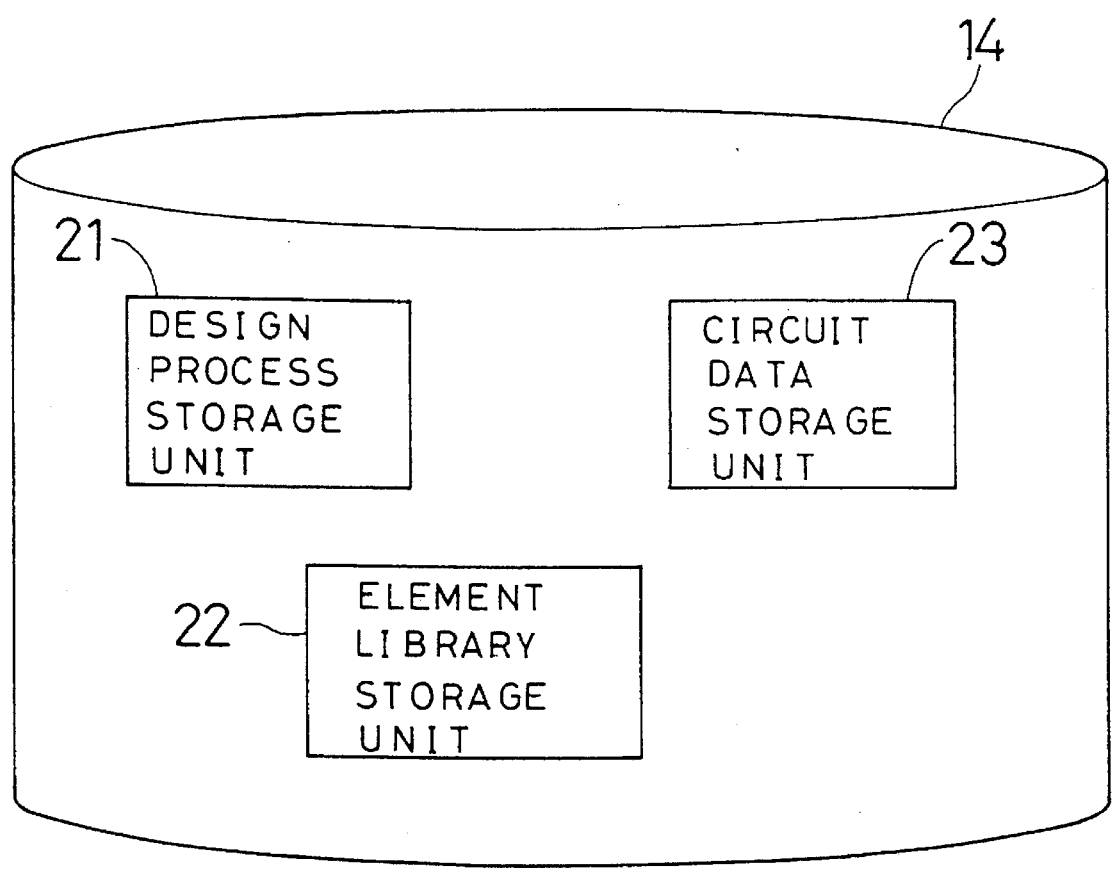
FIG. 2 is a view showing the structure of a storage device of the above automatic designing system.

A storage device 14 consists of, for example, a design process storage unit 21, element library storage unit 22, and circuit data storage unit 23, as shown in FIG. 2, so that it can store information inputted through the input device 11 and programs or data on circuit-designing processes.

Specifically, the design process storage unit 21 stores a variety of programs whereby the foregoing CPU 12 executes design processes and conversion rule information to be applied in the course of these processes.

The element library storage unit 22 stores information on the functions of functional elements, logic elements, and mounted elements and on their area, delay time, and driving forces, so as to provide an element library.

The circuit data storage unit 23 stores functional description information which is inputted through the input device 11 and functional circuit information, logic circuit information, and mounted circuit information, each of which is generated by the circuit-designing processes.

The foregoing functional description information is mainly on a function required on a circuit, and is represented in a hardware description language. The functional circuit information is mainly on a circuit that is composed of virtual functional elements, the functions of which are only defined, and is represented in an internal representation form. The logic circuit information shows a circuit composed of real logic elements, which are on a logic level seldom dependent on the fabrication process or design methods. On the other hand, the mounted circuit information is greatly dependent on the fabrication process and design methods and shows a circuit to which are allotted elements actually mounted by a specified technology (e.g., a standard cell composed of a CMOS transistor, a cell in the library of a gate array, or TTL, ECL, and the like which are dependent on the fabrication process).

Examples of the foregoing functional elements are shown in Table 2. For example, a multiple-bit adder represents a functional element for adding two multiple-bit numbers. A comparator represents a functional element for comparing two multiple-bit numbers. A multiple-bit AND represents a functional element for calculating bit-by-bit logic products of two multiple-bit signals. A multiple-bit INV represents a logical element for calculating bit-by-bit logic Nots in a multiple-bit signal.

A ripper and mixer are functional elements for conveniently dividing a multiple-bit signal and processing the multiple-bit signal as a whole, respectively, during the course of conversion process. The ripper and mixer are eventually converted to a circuit composed of mounted elements and eliminated when all signals are processed in 1-bit signals.

In general, there exists no circuit that is composed of mounted elements directly corresponding to these functional elements. The functional elements are expanded to a circuit composed of real logic elements which realize their functions, and then replaced by a circuit composed of mounted elements.

TABLE 2

MULTIPLE-BIT ADDER
MULTIPLE-BIT SUBTRACTER
MULTIPLE-BIT MULTIPLIER

TABLE 2-continued

MULTIPLE-BIT DIVIDER
COMPARATOR
ENCODER
DECODER
SELECTOR
MULTIPLEXER
COUNTER
LATCH
FLIP-FLOP
BUFFER
REGISTER
SHIFTER
MIXER
RIPPER
MULTIPLE-BIT AND
MULTIPLE-BIT NAND
MULTIPLE-BIT OR
MULTIPLE-BIT NOR
MULTIPLE-BIT XOR
MULTIPLE-BIT INV

Examples of the logic elements are shown in Table 3, in which, BIT-BY-BIT ADDER represents an element for adding two 1-bit signals and 1-BIT AND represents a logic element for calculating the logic product of two or more 1-bit signals.

The circuit composed of mounted elements corresponding to these logic elements are preliminarily determined so that the logic elements are eventually replaced by the circuit on the final stage of design processing.

TABLE 3

BIT-BY-BIT ADDER
1-BIT AND
1-BIT NAND
1-BIT OR
1-BIT NOR
1-BIT XOR
1-BIT INV

Next, specific examples of the functional description information and of the functional circuit information to be stored in the circuit data storage unit 23 will be described with reference to FIGS. 16 and 17. These sets of information are stored as, e.g., text information.

Figures 16A, 16B, 16C:
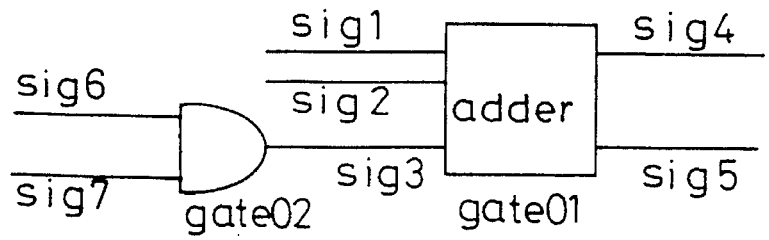
FIG. 16(a) is a view diagrammatically showing a circuit.
FIG. 16(b) is a view showing functional description information.
FIG. 16(c) is a view showing functional circuit information.

A circuit composed of, e.g., 1-bit 2-input AND gate and a 1-bit 3-input adder shown in FIG. 16(a) is described in the functional description information shown in FIG. 16(b). The functional description information is converted to the functional circuit information or logic circuit information shown in FIG. 16(c). The functional circuits information and logic circuit information may not particularly be distinguished from each other in the case shown above where the functional description information corresponds directly to the circuit composed of the functional elements.

In this example, the functional circuit information shown in FIG. 16(c) includes an identification name 31 for identifying an individual element and a plurality of pairs of attribute code 32 and attribute value 33. The attribute code 32 and attribute value 33 in each pair are mapped with ": :". The individual pairs are separated by ";", and the identification names 31 are separated from other information by ": : :". The attribute codes 32 include "a kind of", "input", "output", and the like, each showing that its corresponding attribute value 33 refers to the type of element, its input signal, and its output signal.

That is, the element of the gate 01 is an adder, its input signals are sig1, sig2, and sig3, and its output signals are sig4 and sig5. On the other hand, the element of the gate 02 is an AND, its input signals are sig6 and sig7, and its output signal is sig3. It is also shown that the gate01 and gate02 are connected by the signal sig3.

Figures 17A, 17B, 17C:
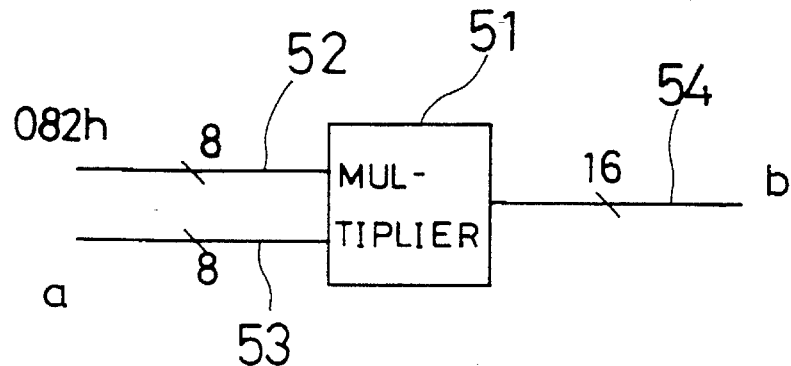
FIGS. 17(a) to 17(c) show another example of the circuit data to be stored in the storage device of the automatic designing system according to the above first embodiment.
Figure 18A:
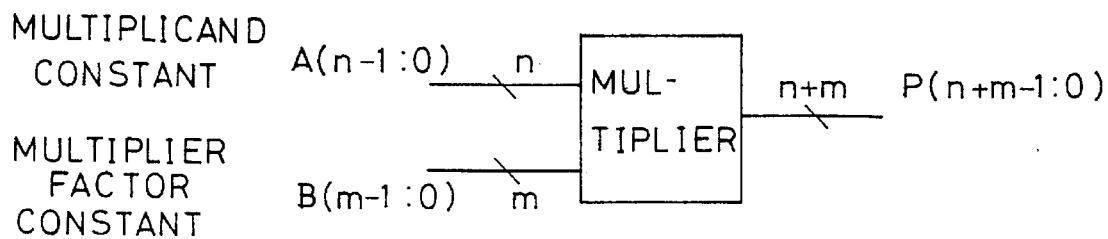
FIGS. 18(a) to 18(d) are views diagrammatically showing a multiplier as a functional element in the designing process using the automatic designing system according to the above first embodiment.
Figure 18B:
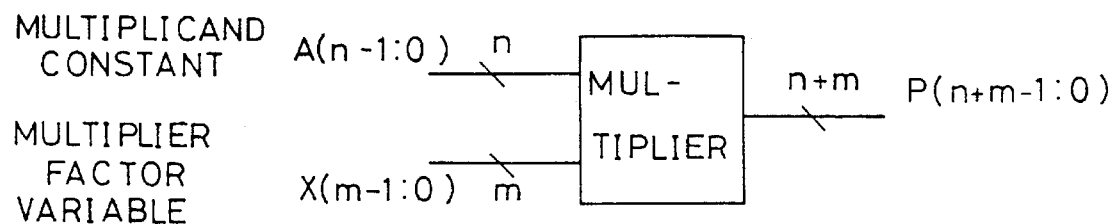
Figure 18C:
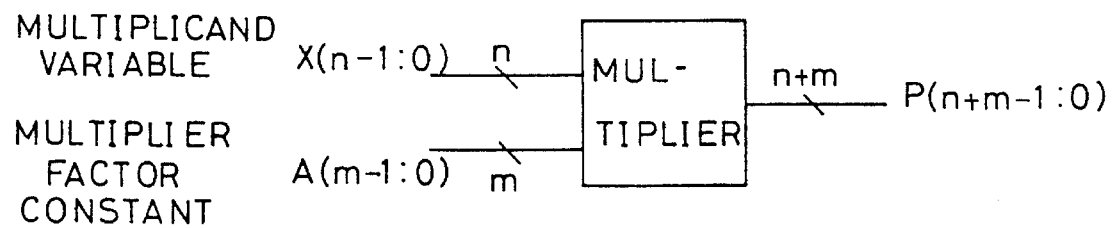
Figure 18D:
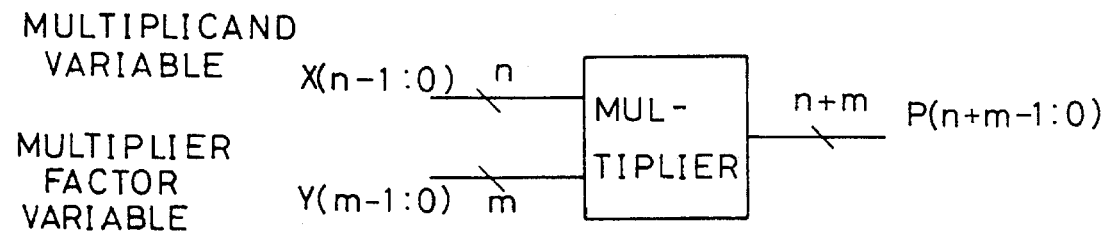
Figure 19A:
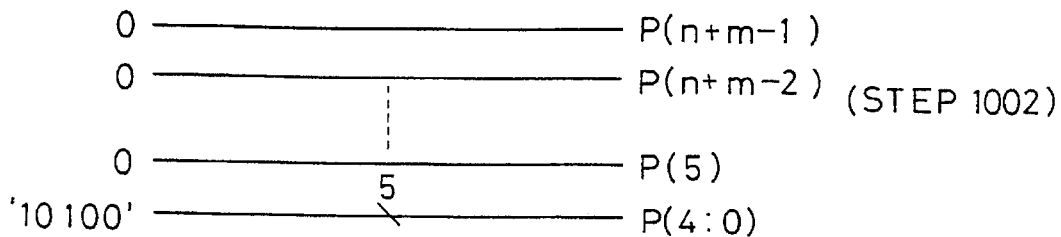
FIGS. 19(a) to 19(d) are circuit diagrams showing a circuit generated in the process of generating a multiplier of FIG. 5.
Figure 19B:
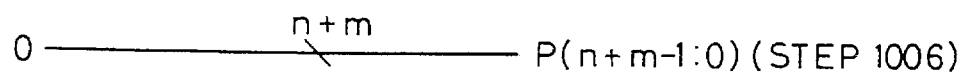
Figure 19C:
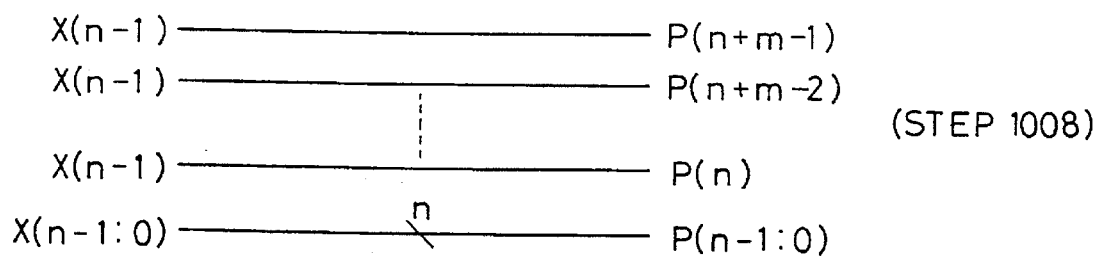
Figure 19D:
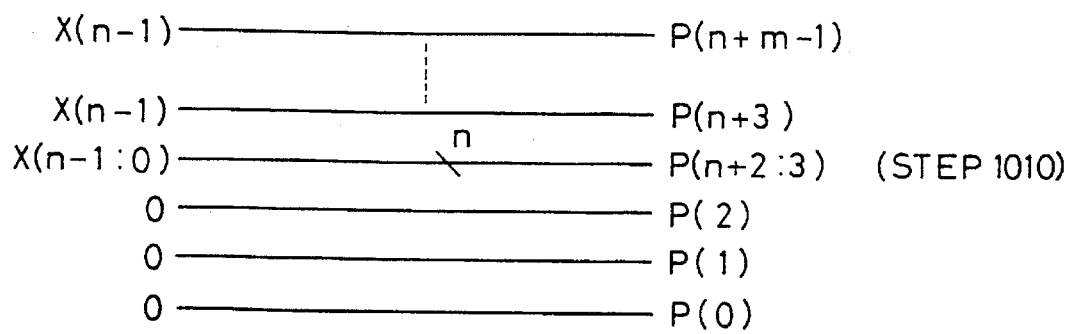

Similarly, a circuit composed of a multiplier 51 serving as a functional element, a signal line 52 to which an 8-bit constant having the value of 130 (82h in the hexadecimal notation) is inputted as a multiplier factor, a signal line 53 to which an 8-bit multiplicand a is inputted, and a signal line 54 which outputs a 16-bit multiplication result b, as shown in FIG. 17(a), is described in the functional description information shown in FIG. 17(b), and is converted to the functional circuit information as shown in FIG. 17(c). Here, the distinction between the multiplier factor and the multiplicand is provided for the convenience of conversion processes.

In the functional description information of FIG. 17(b), the multiplicand a is a signal having the bit width of 8 ranging from 0 bit to 7 bit. The variable b is a signal having the width of 16 ranging from 0 bit to 15 bit. It is shown that the value of the variable b is the product of the multiplicand a and the multiplier factor 130 which is represented by an 8-bit signal having the value of 130.

In the functional circuit information of FIG. 17(c), the first line shows that the functional element has the identification name of gate1 and it serves as a multiplier. The descriptions in the second and fourth lines show that the signal represented by a sign i1 is an 8-bit input signal a having the value of 130. The descriptions in the third and fifth lines show that the signal represented by a sign i2 is an 8-bit input signal which is a constant. The description in the sixth line shows that the signal represented by a sign o is a 16-bit output signal b.

A description will be given next to a circuit designing process performed by the automatic designing system thus constituted with reference to the drawings. For simplicity, the content of information will be shown in the following description by such schematic diagrams as shown in FIG. 16(a) and in FIG. 17(a), irrespective of the types of information such as the functional description information, functional circuit information, and logic circuit information. If necessary, such terms as multiplier factor and multiplicand will also be used as their values or signals which represent the multiplier factor and multiplicand, and the term circuit will also be used as information which represents a circuit, provided that they are not causing a confusion.

The following description will also use the notation shown below. A number having the bit width of (a−b+1) ranging from the a-th bit to the b-th bit (a>b) from the least significant bit position is designated by X(a:b), while the a-th bit in the number X is designated by X(a).

Moreover, a function will be defined as follows. For a k-bit signal Y, the number of 1 bits having the value of 1 is defined as posibits (Y), while the number of the bits having the value of 0 is defined as negabits (Y). The number of bits, which is obtained by calculating the number of the bits having the value of 1 from the least significant value till it becomes P(P<k), is defined as effbitwidth (Y, P). Since the processes for obtaining the values of these functions can easily be realized, the detailed description thereof will be omitted.

Figure 3:
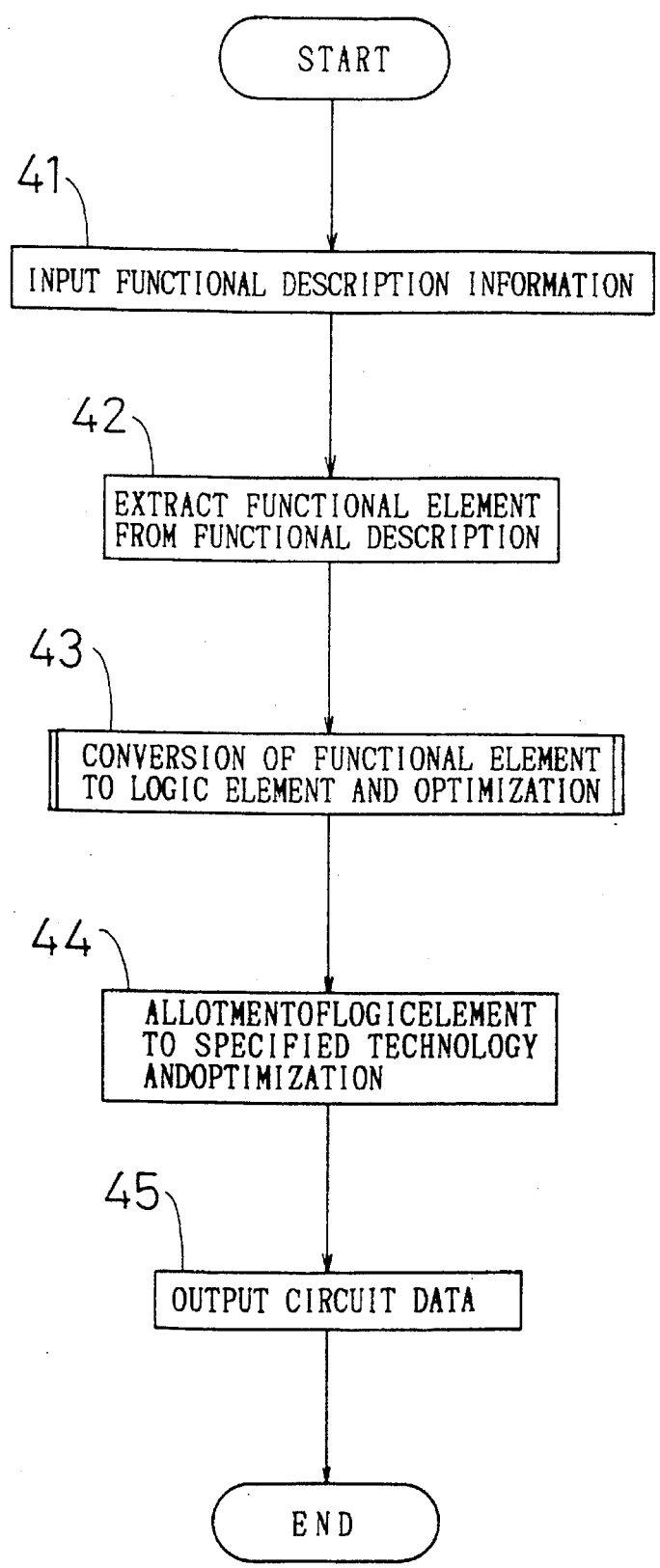
FIG. 3 is a flow chart showing a designing process according to the above automatic designing system.

FIG. 3 is a flow chart showing the main routine of the circuit designing process performed by the automatic designing system according to the first embodiment.

As shown in FIG. 3, there is performed in Step 41 a process of inputting the functional description information formed on the basis of the functional specification by a functional designer of the circuit through the input device 11 and storing it in the circuit data storage unit 23. It is also possible to design the input device 11 so that it receives the inputting of not only the functional description information but also the functional circuit information and logic circuit information on comparatively simple portions of the circuit.

In Step 42 is performed a process of interpreting the functional description information which was inputted in Step 41, generating functional circuit information in which a circuit consisting of the functional elements and having the function shown in the functional description information is represented in the internal representation form, and storing it in the circuit data storage unit 23.

In Step 43 is performed a process of converting all the functional elements contained in the functional circuit information to logic elements and storing the resulting logic circuit information in the circuit data storage unit 23. As for the circuit including a multiplier, the circuit optimization on the level of functional elements is also performed. The process of Step 43 will be described later in detail.

In Step 44 is performed a process of allotting all the logic elements contained in the logic circuit information to mounted elements through the element conversion process based on specified conversion rule information. In this step is also performed circuit optimization on the level of logic elements during the course of allotting the logic elements to the mounted element.

In step 45 is performed a process of generating a circuit diagram and net list based on mounted circuit information and the like and outputting them to the output device 13. The net list mentioned above refers to information on, e.g., the connections between the mounted elements in the circuit constituted by the mounted elements.

The processes performed in Steps 42 and 44 are the same as those disclosed in Japanese Laid-open Patent Publication no. 3-15984 and in U.S. Pat. No. 5,043,914, so that the detailed description thereof is omitted here.

Below, a process of converting a functional element performed in Step 43 of FIG. 3 will be described in detail with reference to FIG. 4.

Figure 4:
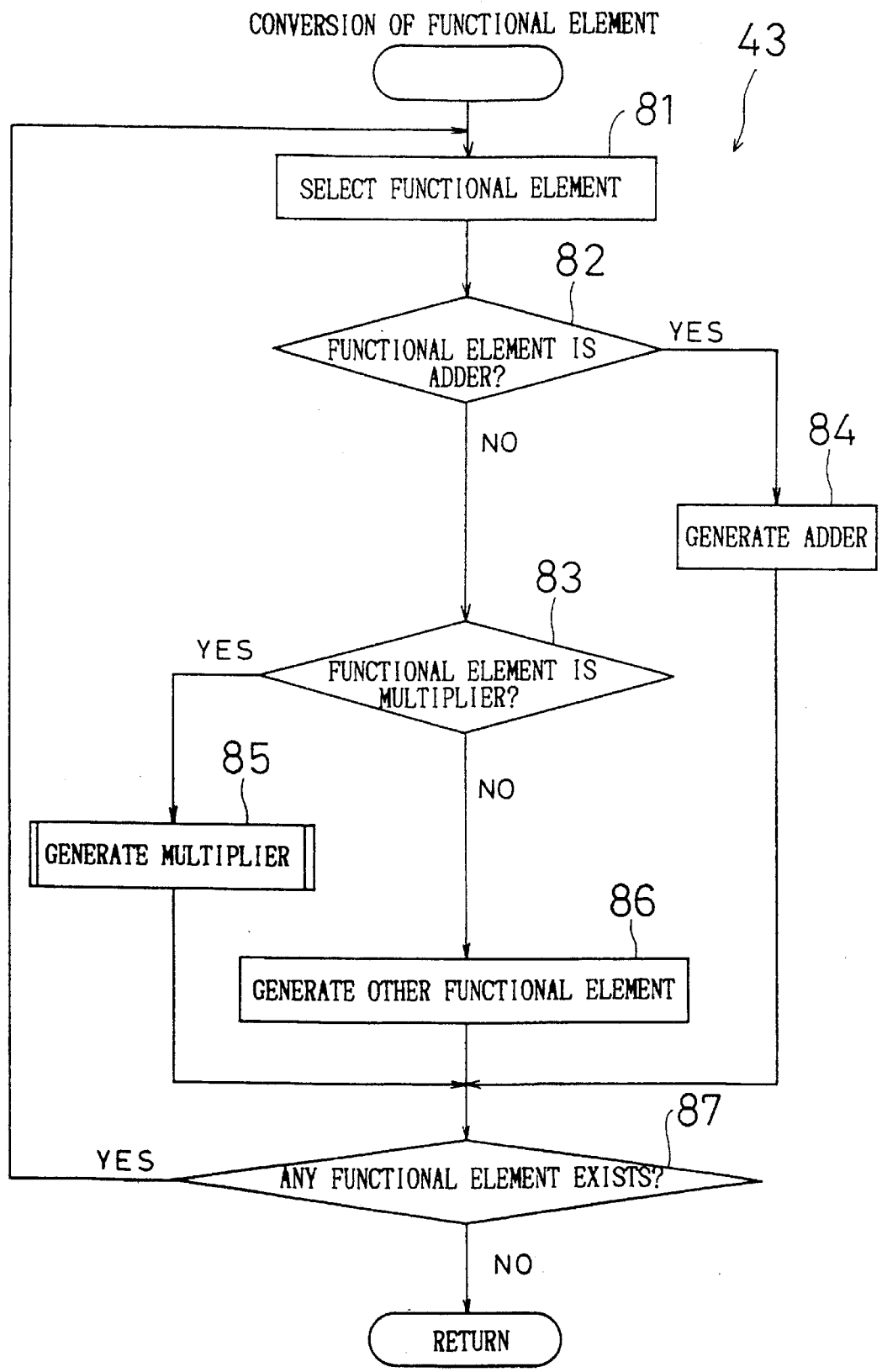
FIG. 4 is a flow chart showing in detail a process of converting a functional element in Step 43 of FIG. 3.

FIG. 4 is a flow chart showing in detail the process of converting a functional element in Step 43 of FIG. 4. As shown in the drawing, one of the functional elements contained in the functional circuit information is selected in Step 81.

In Steps 82 and 83, it is determined whether or not the selected functional element is an adder or a multiplier. If it is an adder, the process goes on to Step 84. If it is a multiplier, the process goes on to Step 85. If it is neither an adder nor a multiplier, the process goes on to Step 86.

In each of Steps 84 to 86, the selected functional element is converted to a circuit having the same function which is constituted by at least either of other functional elements and logic elements. After its circuit information is generated, the process goes on to Step 87.

In Step 87, it is determined whether or not the circuit includes a functional element. If it does, the process goes back to Step 81 so as to repeat the processes of Steps 81 to 86. If it does not, which means that the circuit obtained by conversion is constituted only by logic circuits, the process of converting a functional element in Step 43 is completed, thereby returning to the main routine.

In Steps 84 to 86, a single conversion process does not necessarily provide a circuit that is constituted only by logic elements. Instead, the circuit resulting from the conversion may temporarily include other functional elements. In this case, it is determined in Step 87 that a functional element is included and, by recursively performing similar conversion processes, a circuit constituted only by logic circuits is eventually obtained. Specifically, a multiple-bit adder is repeatedly converted to a circuit composed of an adder having a smaller number of bits (functional element) and to a 1-bit adder (logical element) in Step 84, so that it is eventually converted to a circuit constituted only by 1-bit adders. On the other hand, a subtracter and a divider are converted to a circuit consisting of functional elements such as adders and of logic circuits in Step 86, and then the adders are converted to 1-bit adders in Step 84. Thus, by recursively performing the conversion processes, the individual processes will easily be simplified.

The multiplier which is determined as such with "YES" in Step 83 and which is subjected to conversion in Step 85 is provided with the function shown in FIGS. 18(*a*) to 18(*d*). The multipliers of FIGS. 18(*a*) to 18(*d*) are the same in that each of them has the function of multiplying a multiplicand represented by an n-bit signal by a multiplier factor represented by an m-bit signal so as to output a product P represented by a signal having the bit width of (n+m). However, they are different in that the multiplier factor and multiplicand which are inputted thereto are a constant or variable. In the multiplier of FIG. 18(*a*), each of the multiplier factor and multiplicand is a constant. In the multiplier of FIG. 18(*b*), the multiplier factor is a variable while the multiplicand is a constant. In the multiplier of FIG. 18(*c*), the multiplier factor is a constant while the multiplicand is a variable. In the multiplier of FIG. 18(*d*), each of the multiplier factor and multiplicand is a variable.

For simplicity, the constant A will be treated as a positive number in the following description. In the case where the constant A is an negative number, the sign of the constant A is inverted so as to generate information on the multiply circuit with respect to the resulting constant A' with the inverted sign and on the circuit for inverting the sign of the multiplication result, thereby providing the proper procedure. In the following description, the variable X may have a positive or negative value. If the variable X is to be limited to a positive number, 0 extension may be performed in sign extension for shifting $Q_2$ to one bit higher-order position and placing '0' in its least significant bit position, which will be described later.

Below, the process of generating a multiplier performed in Step 85 of FIG. 4 will be described in detail with reference to FIGS. 5, 18, and 19. The process of generating a multiplier is for converting a multiplier to a circuit consisting of other functional elements (such as a multiplier and an adder) and logic elements.

Figure 5:
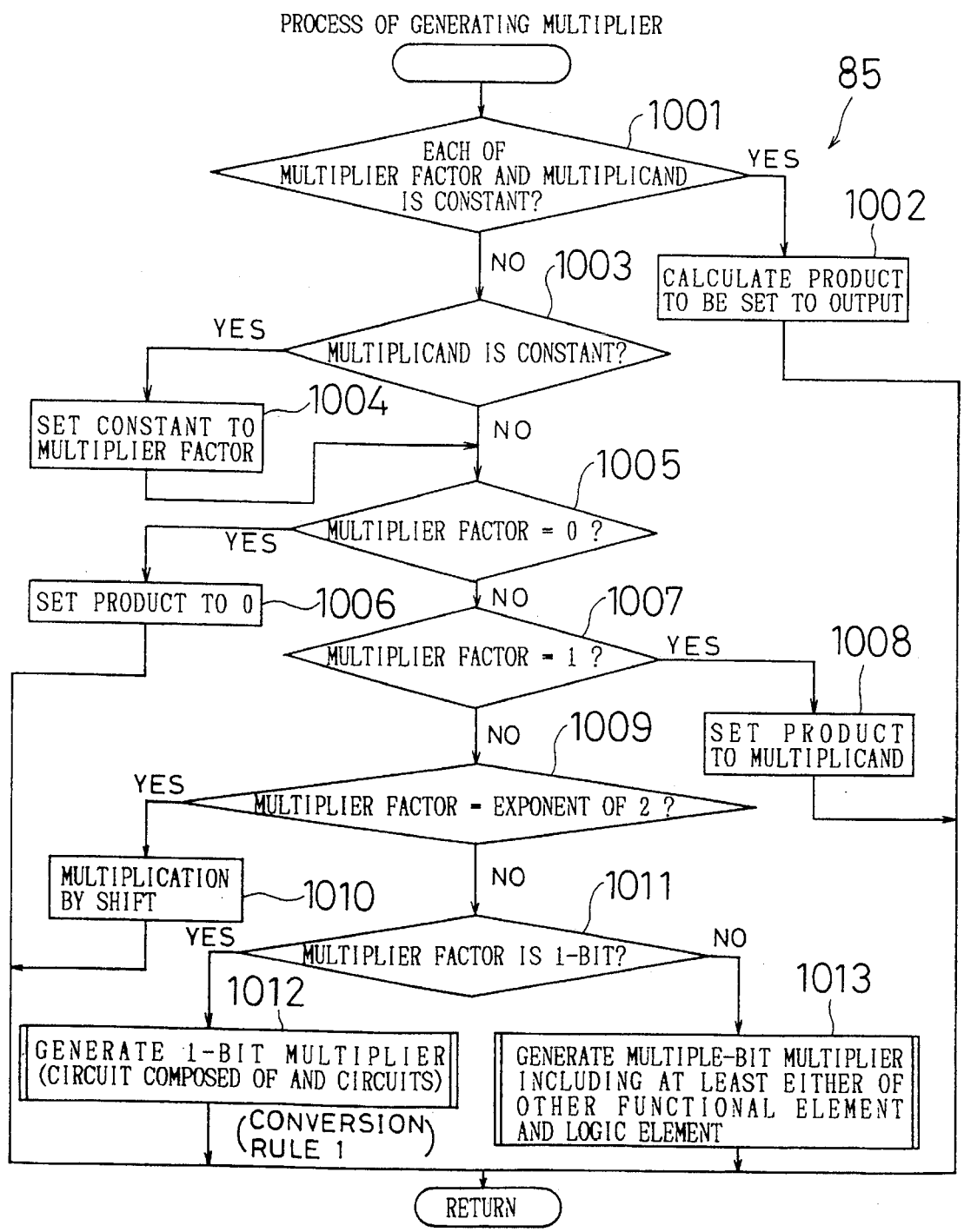
FIG. 5 is a flow chart showing in detail a process of generating a multiplier in Step 85 of FIG. 4.

FIG. 5 is a flow chart showing in detail the process of generating a multiplier in Step 85. As shown in the drawing, it is determined in Step 1001 whether or not each of the multiplier factor and multiplicand is a constant or not. If the answer is YES, as shown in FIG. 18(*a*), the process goes on to Step 1002 where their product is calculated and a conversion is made to a circuit which generates a signal representing its value in binary code. Specifically, if the multiplicand A=4 and the multiplier factor B=5, a conversion is made to a circuit which outputs a signal representing the value of 4×5=20 ('10100' in binary code) as P(4:0) and a signal representing the value of 0 as P(n+m−1:5), as shown in FIG. 19(*a*).

If it is determined in Step 1001 that at least either of the multiplier factor or multiplicand is a variable, the process goes on to Step 1003 where it is determined whether or not the multiplicand is a constant, and if the multiplicand is a constant, the process goes on to Step 1004 where the multiplier factor and multiplicand are interchanged, so that the process goes on to Step 1005. If the multiplicand is not a constant, on the other hand, the process directly goes on to Step 1005. That is, in the case of using the multiplier shown in FIG. 18(*b*), it is converted to the multiplier shown in FIG. 18(*c*) so that at least the multiplicand is constantly a variable.

In Steps 1005, 1007, and 1009, it is determined whether or not the multiplier factor is a special constant, i.e., its value is 0, 1, or a number obtained by raising 2 to a certain power. If the multiplier factor is 0, a conversion is made to a circuit for outputting a signal which shows that the values of all the bits are 0, as shown in FIG. 19(*b*) (Step 1006). If the multiplier factor is 1, a conversion is made to a circuit which outputs a signal representing the value of the multiplicand as P(n−1:0), while outputting a signal having the value of X(n−1) as P(n+m−1:n) by sign extension, as shown in FIG. 19(*c*) (Step 1008). If the multiplier factor is a number obtained by raising 2 to a certain power, e.g., if it is 8 (=$2^3$), a conversion is made to a circuit which outputs a signal representing the value of the multiplicand as P(n+2:3), outputs a signal having the value of 0 as P(2:0), and outputs a signal in which the value of each bit is X(n−1) as P(n+m−1:n+3) by sign extension, as shown in FIG. 19(*d*) (Step 1010).

In Step 1011, it is determined whether the multiplier factor is composed of 1 bit or 2 or more bits. If the multiplier factor is composed of 1 bit, the process goes on to Step 1012, where a multiplier 131 is converted to a circuit composed of AND circuits 132 to 135 as shown in FIG. 20. IF the multiplier factor is composed of 2 or more bits, the process goes on to Step 1013, where a conversion is made to a multiple-bit multiplier composed of at least either of other functional elements (such as a multiplier and adder having a reduced bit width) and logic elements. The determination of the multiplier factor composed of 1 bit in Step 1011 is limited to the case where the multiplier factor is a variable, because, if the multiplier factor is a 1-bit constant, the answers obtained in Steps 1005 and 1007 must have been 'YES'. The determination of the multiplier factor composed of 2 or more bits includes the cases where the multiplier factor is a variable and where the multiplier factor is a constant.

In Steps 1006, 1008, 1010, and 1012, conversion to a circuit is performed based on the conversion rule information which is preliminarily stored in the design process storage unit 21.

Below, a process of converting a functional element performed in Step 1012 of FIG. 5 will be described in detail with reference to FIGS. 6 and 20(*a*)–(*c*). In the process of converting a functional element, the conversion shown in FIG. 6 is made in accordance with a conversion rule 1 shown in FIG. 20(*c*).

Figure 6:
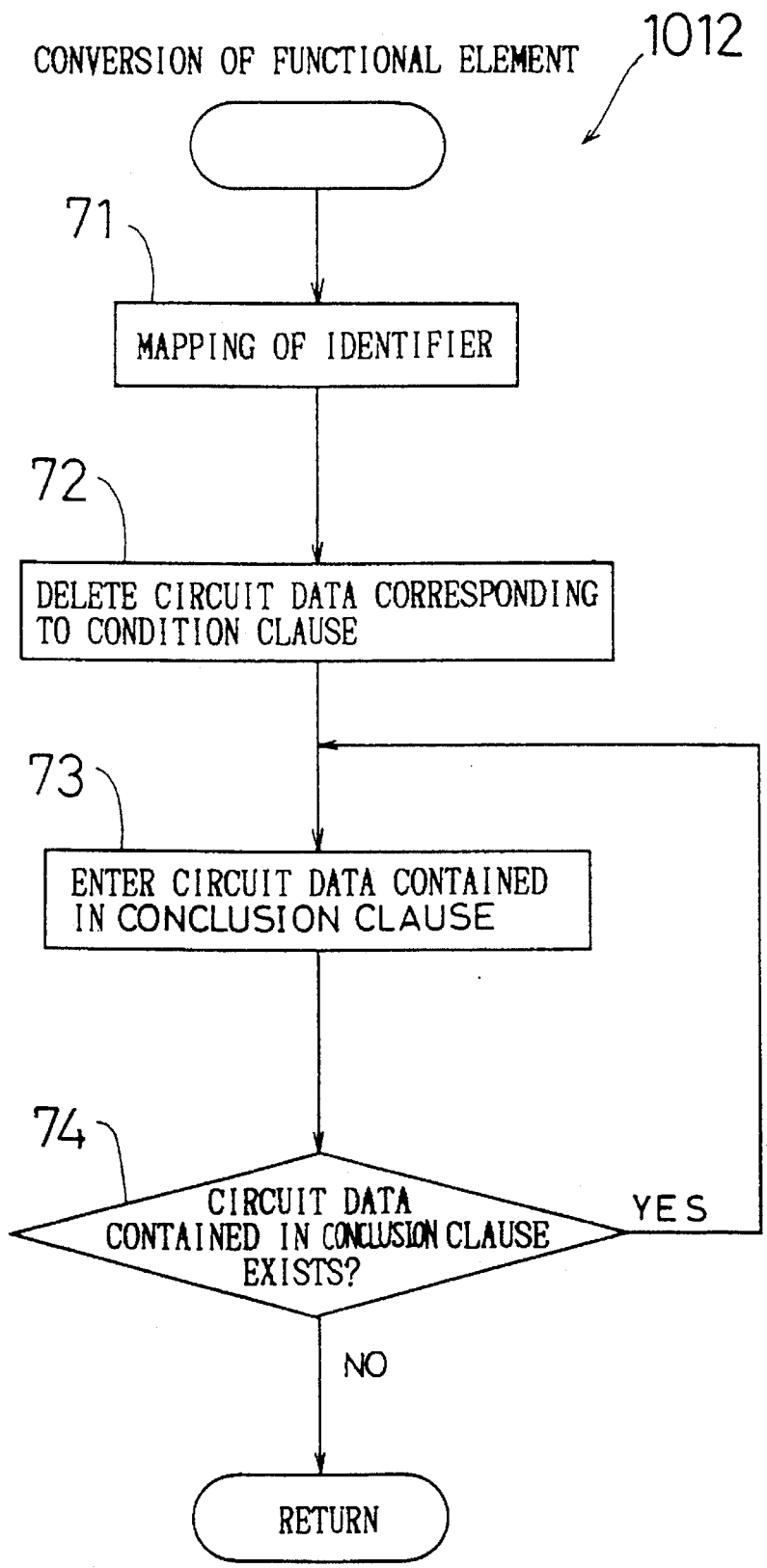
FIG. 6 is a flow chart showing in detail the process of converting a functional element in Step 1012 of FIG. 5.

FIG. 6 is a flow chart showing in detail the process of converting a functional element in Step 1012 of FIG. 6. As shown in the drawing, a condition clause precedent to "=>" in the conversion rule information of FIG. 20(*c*) is first compared with the initial circuit information in Step 71. If it satisfies a conversion application condition, the names of signal lines and the like are mapped.

In Step 72, the circuit information on the initial multiplier as a functional element is deleted from the circuit data storage unit 23.

In Step 73, information on a circuit to be obtained after conversion is generated on the basis of the circuit information on functional elements or logic elements shown in a conclusion clause subsequent to "=>" in the conversion rule information of FIG. 20(*c*) and of the foregoing mapping. The resulting information is then entered in the circuit data storage unit 23.

In Step 74, it is determined whether or not unprocessed functional or logic elements remain in the conclusion clause. If the answer is YES, the process goes back to above Step 73. If the answer is NO, on the contrary, the process of converting a functional element in Step 1012 is completed.

The proof of conversion to a circuit which is equivalent to the initial multiplier according to the foregoing conversion rule 1 will be achieved later along with the proof of other conversion rules. However. since a specific process of converting elements is disclosed in U.S. Pat. No. 5,043,914, the detailed description thereof will be omitted. Although the conversion rule information is actually represented in the internal representation form as shown in FIG. 20(*c*), it will principally be illustrated in the following description by such schematic diagrams as shown in FIG. 20(*a*), (*b*)for simplicity.

Below, a process of generating a multiplier performed in Step 1013 of FIG. 5 will be described in detail with reference to FIG. 7. In the process, the number of partial products and the number of logic stages for calculating the sum of the partial products are mostly reduced in the following manner: In the case where the multiplier factor is a constant, a conversion is made to a circuit which calculates a partial product only with respect to a bit having the value of 1 in the multiplier factor, in its logic NOT number which was obtained by inverting all the bits in the multiplier factor by the logic NOT operation, or in two numbers having a difference equal to the multiplier factor therebetween, thereby reducing the number of the partial products. In each of the cases where the multiplier factor is a constant and where the multiplier factor is a variable, a conversion is made to a circuit using an addition tree with less carry propagation.

Figure 7:
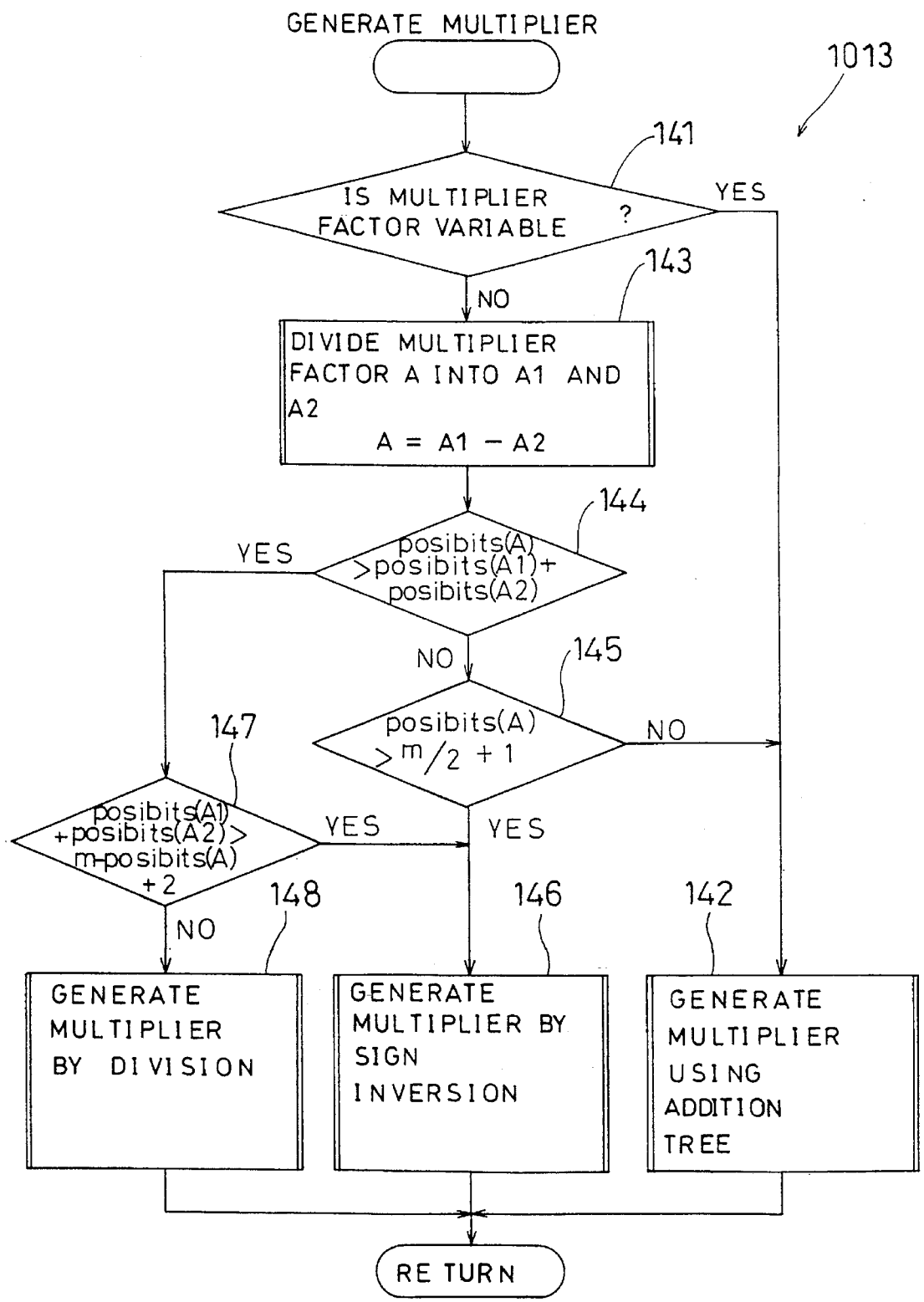
FIG. 7 is a flow chart showing in detail the process of generating a multiplier in Step 1013 of FIG. 5.

FIG. 7 is a flow chart showing in detail the process of generating a multiplier in Step 1013. As shown in FIG. 7, it is judged first in Step 141 whether or not the multiplier factor is a variable. If the multiplier factor is a variable, which indicates the multiplication between variables, the process goes on to Step S142, where the process of generating a multiplier using an addition tree is performed. If it is judged that the multiplier factor is a constant A, on the other hand, the process goes on to Step 143, where the constant A is divided into two constants A1 and A2 having a difference equal to the constant A therebetween.

In Step 142 is performed a process of generating a multiplier in which a multiplier for multiplying the multiplicand X by the variable multiplier factor Y or constant multiplier factor A is converted to a circuit composed of at least one of a partial-product addition tree, an adder, and a partial-product generating circuit in accordance with a conversion rule 2.

In Step 143 is performed a process of determining the constants A1 and A2 which satisfy A=A1−A2 and which minimize the value of posibits(A1)+posibits(A2). Specifically, the process is performed in accordance with the flow chart of FIG. 13 in the present embodiment. The detailed description thereof will be given later.

In Step 144, it is judged whether or not the number of the bits having the value of 1 in the multiplier factor A is larger than the sum of the number of the bits having the value of 1 in the constant A1 and the number of the bits having the value of 1 in the constant A2. In other words, it is judged whether or not posibits(A)>posibits(A1)+posibits(A2) is satisfied. If it is Judged that posibits(A)>posibits(A1)+ posibits(A2) is satisfied, the process goes on to Step 147, where a further judgment is performed. If posibits(A)>posibits(A1)+posibits(A2) is not satisfied, the process goes on to Step 145, where another judgment is performed.

In Step 145, it is judged whether or not the number of the bits having the value of 1 in the multiplier factor A is larger than the sum of the number of the bits having the value of 0 in the multiplier factor A and 2. In other words, it is judged whether or not posibits(A)>m/2+1 is satisfied. If posibits(A)>m/2+1 is satisfied, the process goes on to Step 146, where a process of generating a multiplier by sign inversion is performed. If posibits(A)>m/2+1 is not satisfied. on the other hand, the process goes on to Step 142, where a process of generating a multiplier using an addition tree is performed.

In Step 146 is performed a process in which a conversion is made, in accordance with a conversion rule 7 of FIG. 26, to a circuit consisting of: a partial-product generating circuit for calculating the product of a multiplier factor A0 and the multiplicand X; a partial-product addition tree; a logic NOT circuit for the output of the partial-product addition tree; and a final sum circuit. The multiplier factor A0 was obtained by inverting all the bits in the multiplier factor by the logic NOT operation. Since the value of the posibits(A0) is made smaller than the value of the posibits(A) by inverting all the bits in the multiplier A by the logic NOT operation, the number of the bits having the value of 1 becomes smaller than the number of the bits having the value of 1 in the original multiplier factor A, while the circuits for calculating partial products only with respect to the bits having the value of 1 are generated, thereby reducing the number of the circuits for calculating partial products and the number of logic stages in a circuit for calculating the sum of the partial products.

In Step 147, it is judged whether or not the sum of the number of the bits having the value of 1 in the multiplier factor A1 and the number of the bits having the value of 1 in the multiplier factor A2 is larger than the sum of the number of the bits having the value of 0 in the multiplier factor A and 2. In other words, it is judged whether or not the posibits(A1)+posibits(A2)>m−posibits(A)+2 is satisfied. If posibits(A1)+posibits(A2)>m−posibits(A)+2 is satisfied, the process goes on to Step 146 so as to perform the process of generating a multiplier by sign inversion. If posibits(A1)+posibits(A2)>m−posibits(A)+2 is not satisfied, on the other hand, the process goes on to Step 148 so as to perform a process of generating a multiplier by division.

In Step 148 is performed a process in which a conversion is made, in accordance with a conversion rule 8 of FIG. 27, to a circuit consisting of: a partial-product generating circuit for calculating the product of the above constant A1 and the multiplicand X; a partial-product generating circuit for calculating the product of the above constant A2 and the multiplicand X; a logic NOT circuit for the output of the latter partial-product generating circuit; a partial-product addition tree; and a final sum circuit. Since the sum of the value of the posibits(A1) and the value of the posibits(A2) becomes smaller than the value of the posibits(A), the number of the bits having the value of 1 becomes smaller than the number of the bits having the value of 1 in the original multiplier factor A, while the circuits for calculating partial products only with respect to the bits having the value of 1 are generated, thereby reducing the number of the circuits for calculating partial products and the number of logic stages in the circuit for calculating the sum of the partial products.

Although the present embodiment has performed the three judging processes in Steps 144, 145, and 147 of FIG. 7, respectively, it is also possible to perform one judging process for comparing the posibits(A) with the posibits(A1)+posibits(A2) and the negabits(A)+2 (i.e., m+2−posibits(A)), instead. In this case, if the value of the posibits (A) is the smallest (or including the case where it is equal to any other object of comparison), the process goes on to Step 142. If the value of the posibits(A1)+posibits(A2) is the smallest (including the case where it is equal to the value of the negabits(A)+2), the process goes on to Step 148. If the value of the negabits(A)+2 is the smallest (only if it is solely the smallest), the process goes on to Step 146.

Below, the process of generating a multiplier using an addition tree performed in Step 142 of FIG. 7 will be described in detail with reference to FIGS. 8 and 21.

FIG. 21 is a view diagrammatically showing the conversion rule 2 used in the process of generating a multiplier of Step 142. As shown in the drawing, the conversion rule 2 indicates the conversion of a multiplier 191 for multiplying the n-bit multiplicand X by the m-bit variable multiplier factor Y or m-bit constant multiplier factor A and outputting the L-bit product P to a circuit consisting of: a partial-product generating circuit 192 for multiplying the multiplicand X by the multiplier factor Y or A and calculating partial products $P_1, \ldots, P_k$; a partial-product addition tree 193 for adding up the partial products $P_1, \ldots P_k$; and a final sum circuit. However, since it is sufficient for the above final sum circuit to shift the output $Q_2$ of the partial-product addition tree 193 to one bit higher-order position and place '0' in its least significant bit position, the above final sum circuit is composed of an adder 194 for adding up a signal R, which was obtained by shifting the lower-order (L-1) bits of the partial product $Q_2$ by one bit (i.e., doubled), and the partial product Q1.

If the number of the partial products is two (i.e., k=2 or posibits(A)=2), the conversion rule 2 specifically indicates the conversion of the multiplier 191 to a circuit consisting of: a partial-product generating circuit 195 for multiplying the multiplicand X by the multiplier factor A and calculating the partial products $P_1$ and $P_2$; and a final sum product 196 for adding up the partial products $P_1$ and $P_2$.

If the number of the partial product is one (i.e., k=1 or posibits(A)=1), the conversion rule 2 specifically indicates the conversion of the multiplier 191 to a partial-product generating circuit 197 for multiplying the multiplicand X by the multiplier A and calculating the partial product P.

More specifically, the partial-product generating circuits 192, 195, and 197 multiply the multiplicand X(n−1:0) by the multiplier factor Y(m−1:0) or A(m−1:0) and output k L-bit signals $P_1$(L−1:0), . . . , $P_k$(L−1:0) as partial products. However, the partial-product generating circuit 197 outputs the L-bit signal P(L−1:0).

The partial-product addition tree 193 receives k partial products $P_1$(L−1:0), . . . , $P_k$(L−1:0), adds them up, and outputs the addition result as an L-bit signal $Q_1$(L−1:0), which is a partial sum, and as an L-bit signal $Q_2$(L−1:0), which is a partial carry.

The adder 194 adds up the signal $Q_1$(L−1:0) and a signal R(L−1:0) in which the higher-order (n−1) bits are composed of the signal $Q_2$(L−2:0) and the least significant bit is composed of '0' (i.e., R(L−1:0)=$Q_2$(L−2:0), R(0)=0) and outputs the sum as the L-bit signal P(L−1:0).

The adder 196 is a circuit for adding up the signal $P_1$(L−1:0) and the signal $P_2$(L−1:0) and outputs the sum as the L-bit signal P(L−1:0).

Although the adders 194 and 196 are composed of carry-lookahead adders (CLA) in FIG. 21, they can be composed of adders of different type.

Figure 8:
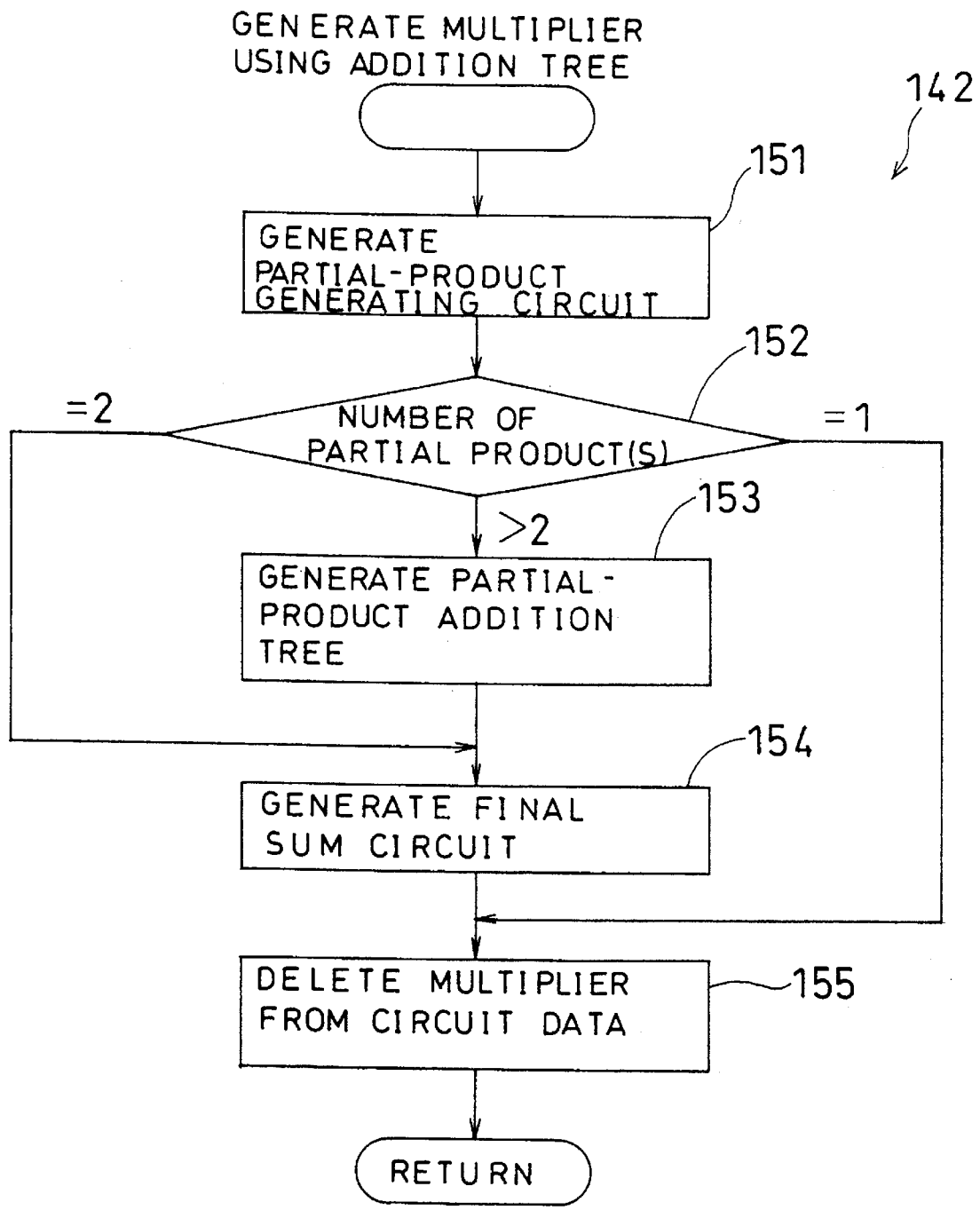
FIG. 8 is a flow chart showing in detail a process of generating a multiplier using an addition tree in Step 142 of FIG. 7.

FIG. 8 is a flow chart showing in detail the process of generating a multiplier using the addition tree in Step 142. As shown in the drawing, there is performed in Step 151 a process of generating, in accordance with a conversion rule 3 of FIG. 22, a circuit for generating partial products from the multiplicand X and the variable multiplier factor X or constant multiplier factor A.

In Step 152 is performed a process of judging whether the number of the partial products calculated in Step 151 is 1, 2, or larger. In other words, it is a process of judging whether the multiplier factor is a constant and posibits(A)=1, the multiplier factor is a constant and posibits(A)=2, or the multiplier factor and the posibits(A) satisfy none of the above conditions. If it is judged that the number of the partial products is 1 (i.e., the multiplier factor is a constant and the posibits(A)=1), the process goes on to Step 155 where the multiplier for which the circuit is generated in the foregoing process is deleted from the circuit data. If the number of the partial products is 2 (i.e., the multiplier factor is a constant and the posibits(A)=2), the process goes on to Step 154 where a circuit for adding up the two partial products so as to calculate the final sum is generated. If the number of the partial products is 3 or more (i.e., the multiplier factor is a variable or the multiplier factor is a constant and the posibits(A)>2, the process goes on to Step 153 where the partial-product addition tree for adding up the partial products is generated.

In Step 153 is performed a process of generating, in accordance with a conversion rule 4 of FIG. 23, the partial-product addition tree 193 with less carry propagation which consists of adders at several stages.

In Step 154 is performed a process of generating circuit information indicating the adders 194 and 196 of FIG. 21 and entering it in the circuit data storage unit 23. Specifically, it is a process of generating the adder 194 for adding up the two outputs $Q_1$ and $Q_2$ of the partial-product addition tree 193 after shifting $Q_2$ to one bit higher-order position and placing '0' in its least significant bit position or a process of generating the adder 196 for adding up the two outputs $P_1$ and $P_2$ of the partial-product generating circuit 195. Although each of the adders 194 and 196 is composed of a carry-lookahead adder (CLA), they can be composed of adders of different type.

In Step 155 is performed a process of deleting the circuit information on a multiplier corresponding to the multiplier 191 of FIG. 21 from the circuit data storage unit 23.

Below, the process of generating a partial-product generating circuit performed in Step 151 of FIG. 8 will be described in detail with reference to FIGS. 9 and 22.

FIG. 22 is a view diagrammatically showing the conversion rule 3 used in the process of generating a partial-product generating circuit in Step 151. As shown in the drawing, the conversion rule 3 indicates that a partial-product generating circuit 161 for multiplying, if the multiplier factor is a variable, the n-bit multiplicand X(n–1:0) by the (m–K)-bit variable multiplier factor Y(m–1:K) and outputting L-bit partial products $P_1, P_2, \ldots$ is converted to a circuit consisting of: a selector circuit 162 for receiving any 1 bit Y(K) of the multiplier factor and the multiplicand X and outputting, if Y(K)=1, the X(n–1:0), while outputting, if Y(K)=0, an n-bit signal having the value of 0; a circuit for synthesizing a signal $P_1$(L–1:0) from the output signal R of the selector circuit 162, which is composed of the lower L bits of the signal obtained by linking a signal composed only of the bits having the value of 0 to the most significant bit of the output signal R (i.e., by 0 extension); and a partial-product generating circuit 163 for multiplying the (n+1)-bit multiplicand X(n–1:0)×2 (i.e., an (n+1)-bit signal obtained by linking a signal having the value of 0 to the least significant bit of the X(n–1:0)) by the (m–K–1)-bit multiplier factor Y(m–1:K+1) and outputting L-bit partial products $P_2, \ldots$ (where K is an integer that satisfies 0≦K<m). However, the partial-product generating circuit 163 is not generated if K=m–1. The circuit in this case is composed of the selector 162 and a circuit synthesized from the output signal R of the selector circuit 162, which is composed of the lower L bits of the signal obtained by linking a signal composed only of the bits having the value of 0 to the most significant bit of the output signal R. Although a conversion is made in FIG. 22 to a logic AND circuit serving as the selector circuit 162 for carrying out the logic AND operation between the 1-bit signal Y(K) and n-bit multiplicand X(n–1:0), it can be composed of a selector for selecting the n-bit multiplicand X(n–1:0) or a signal having the value of 0 in response to the 1-bit signal Y(K).

The conversion rule 3 indicates that the partial-product generating circuit 161 for multiplying, if the multiplier factor is a constant, the n-bit multiplicand X(n–1:0) by the (m–K)-bit constant multiplier factor A(m–1:K) and outputting the L-bit partial products $P_1, P_2, \ldots$ is converted, if the 1-bit A(K) is 1, to a circuit consisting of: a circuit for synthesizing a signal $P_1$(L–1:0) from the n-bit signal X(n–1:0), which is composed of the lower L bits of the signal obtained by linking a signal composed only of the bits having the value of 0 to the most significant bit of the n-bit signal X(n–1:0) (i.e., by 0 extension); and a partial-product generating circuit 164 for multiplying the (n+1)-bit multiplicand X(n–1:0)×2 (i.e., an (n+1)-bit signal obtained by linking a signal having the value of 0 to the least significant bit of the X(n–1:0)) by the (m–K–1)-bit multiplier factor A(m–1:K+1) and outputting the L-bit partial products $P_2, \ldots$. The conversion rule 3 also indicates that, if the 1 bit A(K) is 0, the partial-product generating circuit 161 is converted to the a circuit composed solely of the partial-product generating circuit 164 (where K is an integer that satisfies 0≦K<m). However, the partial-product generating circuit 164 is not generated if K=m–1. In this case, the circuit is composed of the selector circuit 162 and a circuit synthesized from the output signal R of the selector circuit 162, which is composed of the lower L bits of the signal obtained by linking a signal composed only of the bits having the value of 0 to the most significant bit of the output signal R.

The partial-product generating circuits 168 and 164, which are generated in accordance with the conversion rule 3, are recursively converted by repeatedly using the conversion rule 3 until K=m–1 is satisfied.

Figure 9:
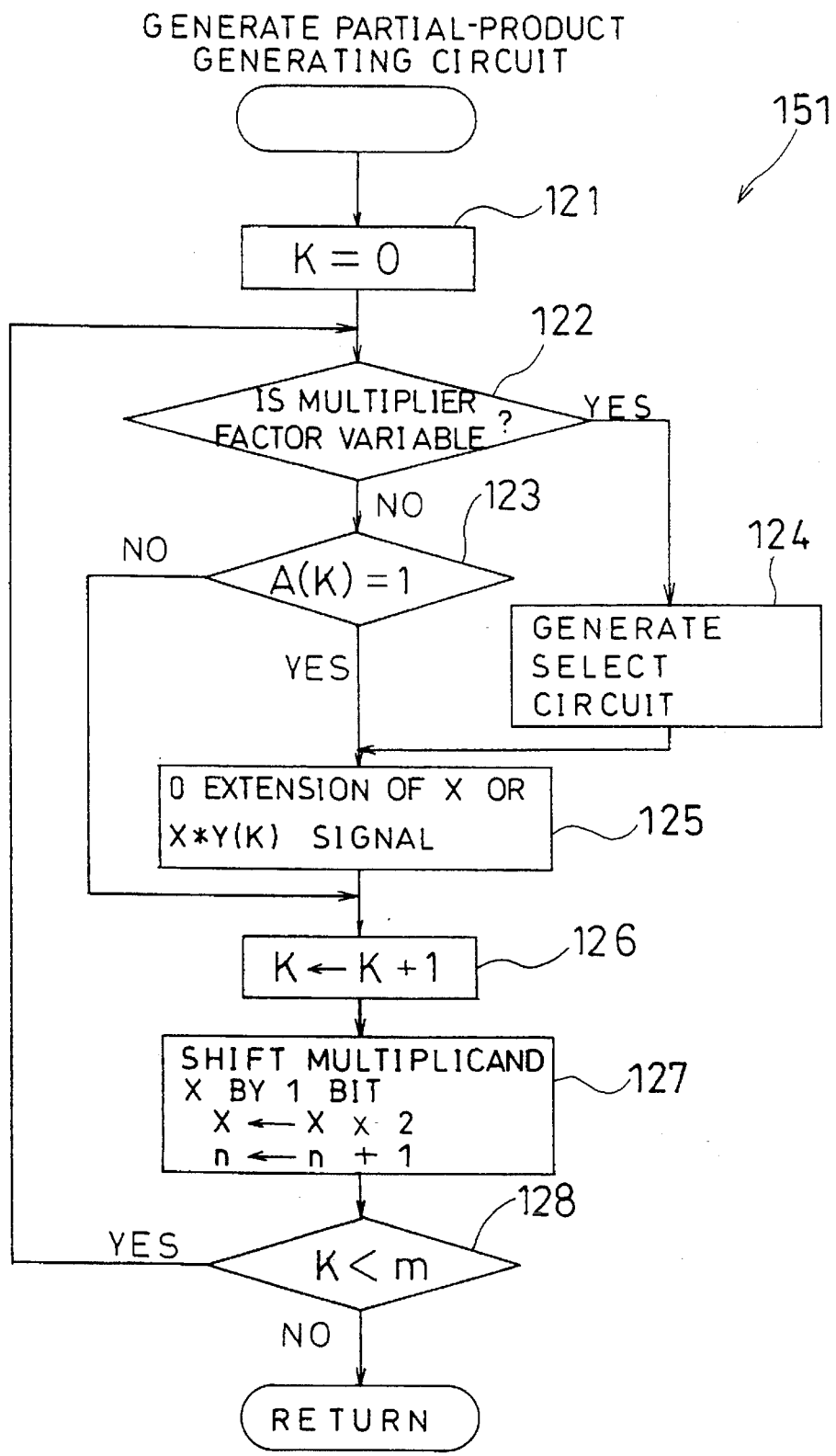
FIG. 9 is a flow chart showing in detail a process of generating a partial-product generating circuit in Step 151 of FIG. 8.

FIG. 9 is a flow chart showing in detail the process of generating a partial-product generating circuit in Step 151. As shown in the drawing, there is performed in Step 121 a process of setting the initial value 0 to a variable K indicating the bit position of the multiplier factor Y or A. In other words, the process is for setting K=0.

In Step 122 is performed a process of judging whether or not the multiplier factor is the variable Y. If the multiplier factor is the variable Y, the process goes on to Step 124 where a process of generating a selector circuit is performed. If the multiplier factor is the constant A, the process goes on to Step 123 where another judging process is performed.

In Step 123 is performed a process of judging whether or not the value of the 1 bit A(K) of the multiplier factor A is 1. If A(K)=1, the process goes on to Step 125 where a 0 extension process is performed with respect to the signal. If A(K)=0, the process goes on to Step 126, where the counting up of the bit-position variable K is performed.

In Step 124 is performed a select-circuit generating process of generating circuit information on the logic AND circuit 162 for carrying out the logic AND operation between the 1-bit signal Y(K) and the n-bit multiplicand X(n−1:0) and entering the resulting circuit information in the circuit data storage unit 23.

In Step 125 is performed a process of generating circuit information on a circuit for performing the 0 extension process with respect to the partial product X(n−1:0)×Y(K) (i.e., R) or X(n−1:0) corresponding to the 1 bit Y(K) or A(K) of the multiplier factor and outputting a signal P1(L−1:0) which is composed of the lower L bits of the signal obtained through the 0 extension process, and entering the resulting circuit information in the circuit data storage unit 23, as shown in FIG. 22.

In Step 126 is performed a process of increasing the value of the bit-position variable K by 1, i.e., counting up the value of the bit-position variable K.

In Step 127 is performed a process of setting the subsequent partial-product generating circuit 163 or 164 as shown in FIG. 22, in order to recursively perform a conversion process. Specifically, it is a process of newly setting the (n+1)-bit signal having the value of X×2, which is double the n-bit multiplicand X, as the multiplicand X and increasing the value of the bit width n by one.

In Step 128 is performed a process of judging whether or not the bit-position variable K is smaller than the bit width m of the multiplier factor. If K is smaller than m (i.e., K<m), the process goes on to Step 122 so as to repeatedly perform the processes of Steps 122 to 127 with respect to the multiplicand X newly set in Steps 126 and 127, bit width n, and bit-position variable K. If K equals m, the process of generating a partial-product generating circuit in Step 151 is completed.

Below, the process of generating a partial-product addition tree performed in Step 153 of FIG. 8 will be described in detail with reference to FIGS. 10, 23, 24, and 25.

FIG. 23 is a view diagrammatically showing a conversion rule 4 to be used in the process of generating a partial-product addition tree in Step 153. As shown in the drawing, the conversion rule 4 indicates that, if the number K of the partial products is larger than 3 (i.e., K>3), a partial-product addition tree 181 for adding up K partial products $P_0, \ldots, P_K−1$ and outputting the partial sum $Q_0$ and partial carry $Q_1$ is converted to a circuit consisting of a 1-stage adder 182 for adding up the K partial products $P_0, \ldots, P_{K−1}$ and a partial-product addition tree 183 for receiving the output of the 1-stage adder 182.

The conversion rule 4 also indicates that, if the number K of the partial products is equal to 3 (i.e., K=3), the partial-product addition tree 181 is converted to a carry-save adder (CSA) 184 for adding up the three partial products $P_0$, $P_1$, and $P_2$ and outputting the partial sum $Q_0$ and partial carry $Q_1$.

The partial-product addition tree 183 generated in accordance with the conversion rule 4 is recursively converted by repeatedly using the same conversion rule 4 until K=3 is satisfied.

FIG. 24 is a view diagrammatically showing a conversion rule 5 for generating the 1-stage adder 182 of FIG. 23. In the drawing, K designates the number of the initial partial products, I designates the number of the partial products that have been processed thus far, and J designates the number of the partial products that were generated in the past processes to be inputted to the next stage (here, I, J, and K are integers which satisfy 0≦J≦I<K).

The conversion rule 5 indicates that, if I is smaller than (K−3) (i.e., I<K−3), a conversion is made to a carry-save adder (CSA) 192 for adding up three partial products $P_I$, $P_{I+1}$, and $P_{I+2}$ and outputting a partial sum $Q_J$ and a partial carry $Q_{J+1}$ and to a 1-stage adder 193 for adding up partial products $P_{I+3}, \ldots, P_{K−1}$.

The conversion rule 5 also indicates that, if I is equal to (K−3) (i.e., I=K−3), a conversion is made to a carry-save adder (CSA) 194 for adding up three partial products $P_I$, $P_{I+1}$, and $P_{K−1}$ and outputting the partial sum $Q_J$ and partial carry $Q_{J+1}$.

The conversion rule also indicates that, if I is equal to (K−2) (i.e., I=K−2), a conversion is made to a circuit for outputting $P_{K−2}$ and $P_{K−1}$ as n-bit signals $Q_J$ and $Q_{J+1}$, respectively, and if I is equal to (K−1) (i.e., I=K−1), a conversion is made to a circuit for outputting $P_{K−1}$ as the n-bit signal $Q_{J+1}$.

However, the partial carry $Q_{J+1}$ is a signal synthesized from the output R of the carry-save adder (CSA) 192 or 194 which is composed of the lower n bits of the signal obtained by linking a 1-bit signal having the value of 0 to the least significant bit of the output R.

Figure 10:
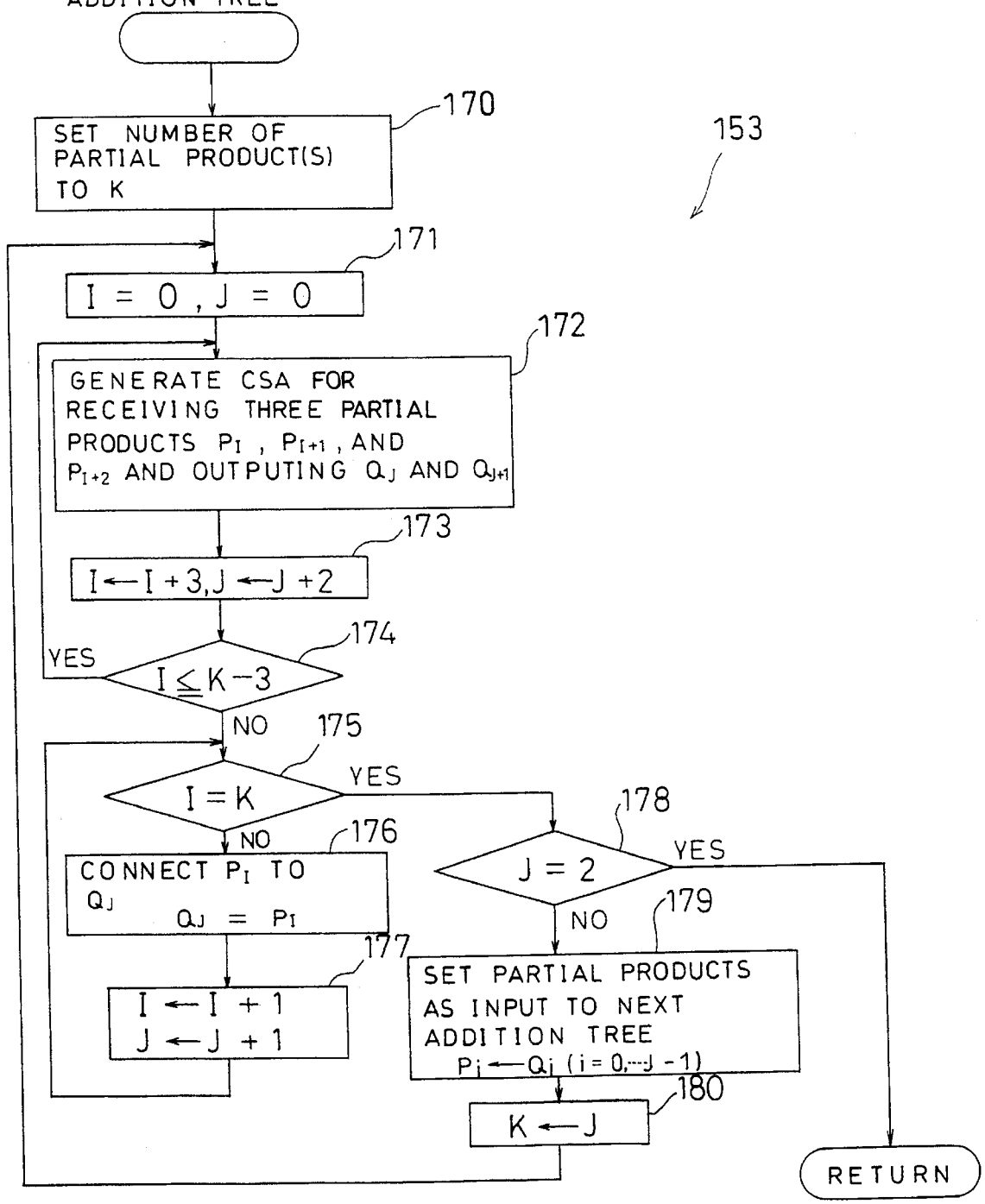
FIG. 10 is a flow chart showing in detail a process of generating a partial-product addition tree in Step 153 of FIG. 8.

FIG. 10 is a flow chart showing in detail the process of generating a partial-product addition tree in Step 153. As shown in the drawing, there is performed in Step 170 a process of setting the number of the partial products to K. Specifically in the example of FIG. 21, if the multiplier factor is the variable Y, the value equal to the bit width m of the multiplier factor is set to K. If the multiplier factor is the constant A, the value equal to the posibits(A) is set to K.

In Step 171 is performed a process of setting the initial values 0 to variables I and J, the process is for setting I=0, J=0.

In Steps 172 to 177 are performed a process of generating the 1-stage adder 182 shown in FIG. 23.

In Step 172 is performed a process of generating circuit information on a circuit containing the carry-save adder (CSA) 192 or 194 for adding up the three partial products $P_I$, $P_{I+1}$, and $P_{I+2}$ shown in FIG. 24 and outputting the partial sum $Q_J$ and partial carry $Q_{J+1}$, and entering the resulting circuit information in the circuit data storage unit 23.

It will be easily appreciated that, using a conversion rule 6 of FIG. 25, the carry-save adder (CSA) 192 or 194 can be converted, bit by bit, to a full adder 202 or 204, resulting in a circuit composed of n full adders.

In Step 173 is performed a process of updating the values of I and J. Specifically, it is a process of updating the value of I to (I+3) and the value of J to (J+2).

In Step 174 is performed a process of judging whether or not I is equal to or less than (K−3). If I is equal to or less than (K−3), the process goes on to Step 172 so as to repeatedly perform the processes of Steps 172 and 173 with respect to I and J updated in Step 173. If I becomes larger than (K−3) (i.e., I>K−3), the process goes on to Step 175 so as to make the following judgment.

In Step 175 is performed a process of judging whether or not I is equal to K. If I is equal to K (i.e., I=K), the process goes on to Step 178 where another judging process is performed. If I is not equal to K, on the other hand, the process goes on to Step 176 where a process of connecting $P_I$ to $Q_J$ is performed.

In Step 176 is performed a process of generating circuit information on the connection between $P_I$ and $Q_J$ and entering the resulting circuit information in the circuit data storage unit 23 (here, I=K−1 or I=K−2).

In Step 177 is performed a process of counting up each of the values of I and J. Specifically, it is a process of updating the value of I to (I+1) and the value of J to (J+1). When the present process is completed, the process returns to Step 175 where the judging process is performed with respect to I and J which have been updated.

Step 178 is performed a process of judging whether or not J is equal to 2. If J is equal to 2 (i.e., J=2), the process of generating a partial-product addition tree in Step 153 is completed. If J is not equal to 2, on the other hand, the process goes on to Step 179 and the partial-product addition tree is recursively processed afterward.

In Step 179 is performed a process of setting the subsequent partial-product addition tree 183 of FIG. 23 as shown in FIG. 23 in order to recursively perform a conversion process. Specifically, the outputs $Q_0, \ldots, Q_{J-1}$ of the 1-stage adder 182 are set as the partial products $P_0, \ldots, P_{J-1}$ to be inputted to the partial-product addition tree 183.

In Step 180 is performed a process of updating K. In other words, it is a process of setting to K the number J of the partial products to be inputted to the partial-product addition tree 183 of FIG. 23.

The processes of Steps 171 to 177 are repeatedly executed with respect to K and the partial products $P_0, \ldots, P_{K-1}$ updated in Steps 179 and 180.

By thus generating the addition tree, there can be formed a circuit for calculating the sum of partial products, which is composed of adders with no carry propagation arranged in a well-balanced hierarchical structure, so that the number of logic stages can be reduced.

Below, the process of generating a multiplier by sign inversion performed in Step 146 will be described in detail with reference to FIGS. 11 and 26. In the process of generating a multiplier, it is required to correct the product of the logic NOT constant A0 of the multiplier factor A and the multiplicand X in order to calculate the product of the multiplier factor A and the multiplicand X.

FIG. 26 is a view diagrammatically showing a conversion rule 7 for making a conversion to a circuit containing a circuit for the above correction in the process of generating a multiplier of Step 146. As shown in the drawing, the conversion rule 7 indicates that a multiplier 221 for multiplying the n-bit multiplicand X by the m-bit constant multiplier factor A, so as to output the L-bit product P, is converted to a circuit consisting of: a partial-product generating circuit 222 for multiplying the multiplicand X by the logic NOT A0 of the multiplier factor A so as to calculate the partial products $P_0, \ldots, P_{k-1}$; a partial-product addition tree 223 for adding up the partial products $P_0, \ldots, P_{k-1}$ and the multiplicand X; L-bit logic NOT circuits 224 and 225 for carrying out the logic NOT operation with respect to each of the partial sum $Q_0$ and partial carry $Q_1$, which are the outputs of the partial-product addition tree 223; and a final sum circuit for adding the outputs R1 and R2, which are the respective outputs of the logic NOT circuit 224 and 225; a final sum circuit for adding up the respective outputs $R_1$ and $R_2$ of the logic NOT circuits 224 and 225 and a signal R3 composed of the lower L bits of a signal having the value of $X \times 2^m + 2$. However, the partial carry $Q_1$ is a signal obtained by shifting the lower (L−1) bits of the partial carry output of the partial-product addition tree 223 by one bit (i.e., doubled), so as to shift the partial carry $Q_1$ to one bit higher-order position and place '0' to its least significant bit position. In the example of FIG. 26, the above final sum circuit is composed of a carry-save adder (CSA) 226 and a carry-lookahead adder (CLA) 227. Although a logic NOT circuit 220 is provided in FIG. 26 in order to obtain the logic NOT A0 of the multiplier factor A, it is also possible to previously obtain A0 by calculation.

Figure 11:
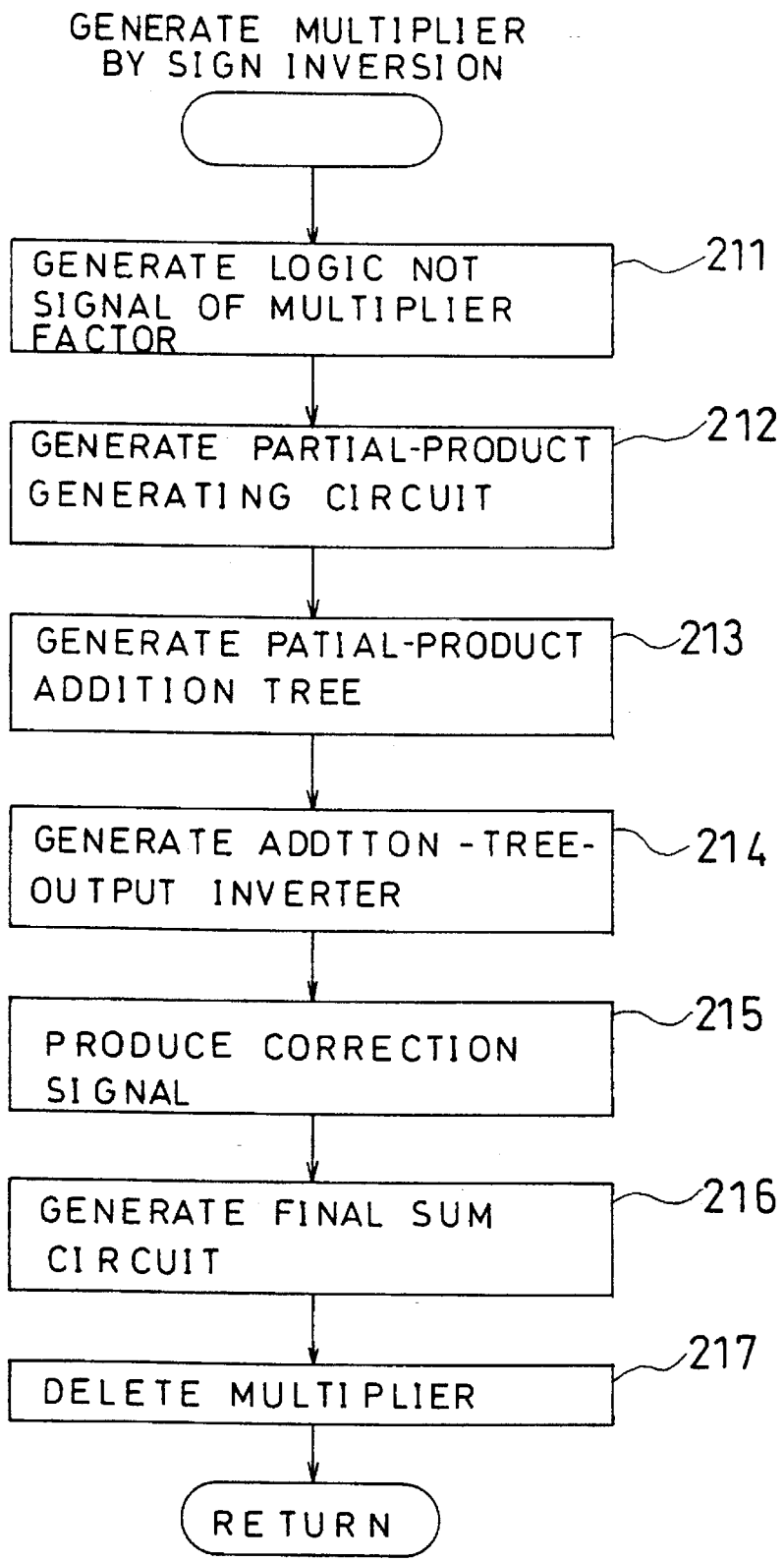
FIG. 11 is a flow chart showing in detail a process of generating a multiplier by sign inversion in Step 146 of FIG. 7.

FIG. 11 is a flow chart showing in detail the process of generating a multiplier by sign inversion in Step 146 of FIG. 7. As shown in the drawing, there is performed in Step 211 a logic-NOT-signal producing process of carrying out the logic NOT operation with respect to the multiplier factor A so as to produce the m-bit constant A0. Specifically, the value obtained by carrying out the logic NOT operation with respect to each bit of the multiplier factor A is defined as A0. In other words, A0(i)=#A(i) is performed with respect to each i which satisfies I=0 to (m−1). Here, #A(i) represents the logic NOT operation performed with respect to the 1 bit A(i).

In Step 212 is performed a process of generating a partial-product generating circuit 222 of FIG. 26, which is similar to the process of generating a partial-product generating circuit performed in Step 151 of FIG. 8. In other words, it is a process of generating partial products from the multiplicand X and the logic NOT constant A0 of the multiplier factor A by using the conversion rule 3 shown in FIG. 22.

In Step 213 is performed a process of generating the partial-product addition tree 223 of FIG. 26, which is similar to the process of generating a partial-product addition tree performed in Step 153 of FIG. 8. In other words, it is a process of generating, by using the conversion rule 4 shown in FIG. 23, the partial-product addition tree of FIG. 26 with less carry propagation which consists of adders at several stages.

In Step 214 is performed a process of generating circuit information on logic NOT circuits 224 and 225 which receive the output of the partial-product addition tree 223 of FIG. 26 and entering the resulting circuit information in the circuit data storage unit 23. In the present embodiment, each of the logic NOT circuits 224 and 225 is composed of an L-bit inverter.

In Step 215 is performed a process of producing a correction signal R3 of FIG. 26 from the multiplicand X. Specifically, the L-bit correction signal R3 can be composed of the lower L bits of a signal given by the numerical expression $X \times 2^m + 2$.

In Step 216 is performed a process of generating circuit information on the final sum circuit for adding up the respective outputs R1 and R2 of the logic NOT circuits 224 and 225 of FIG. 26 and the correction signal R3 and entering the resulting circuit information in the circuit data storage unit 23. In the specific example shown in FIG. 26, it is a process of generating: the carry-save adder (CSA) 226 for adding up the outputs R1 and R2 and the correction signal R3; and the carry-lookahead adder (CLA) 227 for adding up the partial sum and partial carry, which are the outputs of the carry-save adder (CSA) 226. However, before adding up the partial sum and partial carry, which are the outputs of the carry-save adder (CSA) 226, the carry-lookahead adder (CLA) 227 shifts the partial carry to one bit higher-order position and place '0' in its least significant bit position before it is added up with the partial sum.

Although the final sum circuit is composed of the carry-save adder (CSA) 226 and carry-lookahead adder (CLA) 227 in the present embodiment, it may be composed of other element. Although the L-bit correction signal is given by $R3 = X \times 2^m + 2$ in Step 215, it may be given by $R3 = X \times 2^m + 1$ or $R3 = X \times 2^m$ so that '1' or '2' is respectively added thereto in the carry-lookahead adder (CLA) 227. In order to add '1,' the carry in to the carry-lookahead adder (CLA) 227 is set to 1 or the partial carry signal from the carry-save adder (CSA) 226 is shifted to one bit higher-order position and '1' is placed in its least significant bit position so that it is added up with the partial sum by the carry-lookahead adder (CLA) 227. In order to add '2,' the partial carry signal from the carry-save adder (CSA) 226 is shifted to one bit higher-order position and '1' is placed in its least significant bit position so that it is added up with the partial sum by the carry-lookahead adder (CLA) 227, with the carry in being set to 1.

In Step 217 is performed a process of deleting the circuit information on a multiplier corresponding to the multiplier 221 of FIG. 26 from the circuit data storage unit 23.

Below, the process of generating a multiplier by division performed in Step 148 of FIG. 7 will be described in detail with reference to FIGS. 12 and 27.

FIG. 27 is a view diagrammatically showing a conversion rule 8 to be used in the process of generating a multiplier by division in Step 148. As shown in the drawing, the conversion rule 8 indicates that, if posibits(A1)+posibits(A2)>2, a multiplier 241 for multiplying the n-bit multiplicand X by the m-bit constant multiplier factor A and outputting the L-bit product P is converted to a circuit consisting of: a partial-product generating circuit 242 for multiplying the multiplicand X by A1 determined in Step 143 of FIG. 7 so as to calculate the partial products $P_0, \ldots, P_{k-1}$; a partial-product generating circuit 243 for multiplying the multiplicand X by A2 determined in Step 143 so as to calculate partial products $O_0, \ldots, O_{H-1}$; L-bit logic NOT circuits 244, ..., 245 for carrying out the logic NOT operation with respect to each of these partial products $O_0, \ldots, O_{H-1}$; a partial-product addition tree 246 for adding up the outputs $R_0, \ldots, R_{H-1}$ of the logic NOT circuits 244, ..., 245 and the partial products $P_0, \ldots, P_k$; and a final sum circuit for adding up the partial sum $Q_0$ and partial carry $Q_1$, which are the outputs of the partial-product addition tree 246, and a correction value H.

In this case, however, since it is assumed that the correction number H is 2 (i.e., H=2), the conversion rule 8 here indicates that the above final sum circuit is converted to a circuit consisting of a carry-lookahead adder (CLA) 247 for adding up the partial sum $Q_0$, which is the output of the partial-product addition tree 246, and a signal composed of the lower L bits of a signal having the value of $(Q_1 \times 2+1)$, which is also the output of the partial-product addition tree 246, with the carry in being set to 1. The signal corresponding to the partial carry $Q_1$ inputted to the carry-lookahead adder (CLA) 247 was obtained by shifting the lower (L−1) bits of the partial carry output Q1 of the partial-product addition tree 246 by one bit (i.e., doubled) and placing '1' in its least significant bit position. If the correction number H is 1, in particular, the above final sum circuit is converted to a circuit composed of a carry-lookahead adder (CLA) for simply-adding up the partial sum $Q_0$ and partial carry $Q_1$, which are the outputs of the partial-sum addition tree 246, with the carry in being set to 1 (i.e., a circuit similar to the carry-lookahead circuit (CLA) 240 of FIG. 27).

In general cases where the correction number H is 3 or more, addition is implemented by adding the correction number H to the input to the partial-product addition tree 246, so that the final sum circuit can be converted to a circuit composed of a carry-lookahead adder (CLA) for adding up the partial sum $Q_0$ and partial carry $Q_1$, which are the outputs of the partial-product addition tree.

The conversion rule 8 also indicates that, if posibits(A1)+posibits(A2)=2, a conversion is made to a circuit consisting of: a partial-product generating circuit 248 for multiplying the multiplicand X by A1 determined in Step 143 so as to calculate the partial product $P_0$; a partial-product generating circuit 249 for multiplying the multiplicand X by A2 determined in Step 143 so as to calculate the partial product $O_0$; a logic NOT circuit 250 for carrying out the logic NOT operation with respect to the partial product $O_0$; and the carry-lookahead adder (CLA) 240 for adding up the output $R_0$ of the logic NOT circuit 250 and the partial product $P_0$ with the carry in being set to 1.

Although the final sum circuit is composed of the carry-lookahead adders (CLA) 247 and 240 in the example of FIG. 27, it may be composed of an adder of different type.

Figure 12:
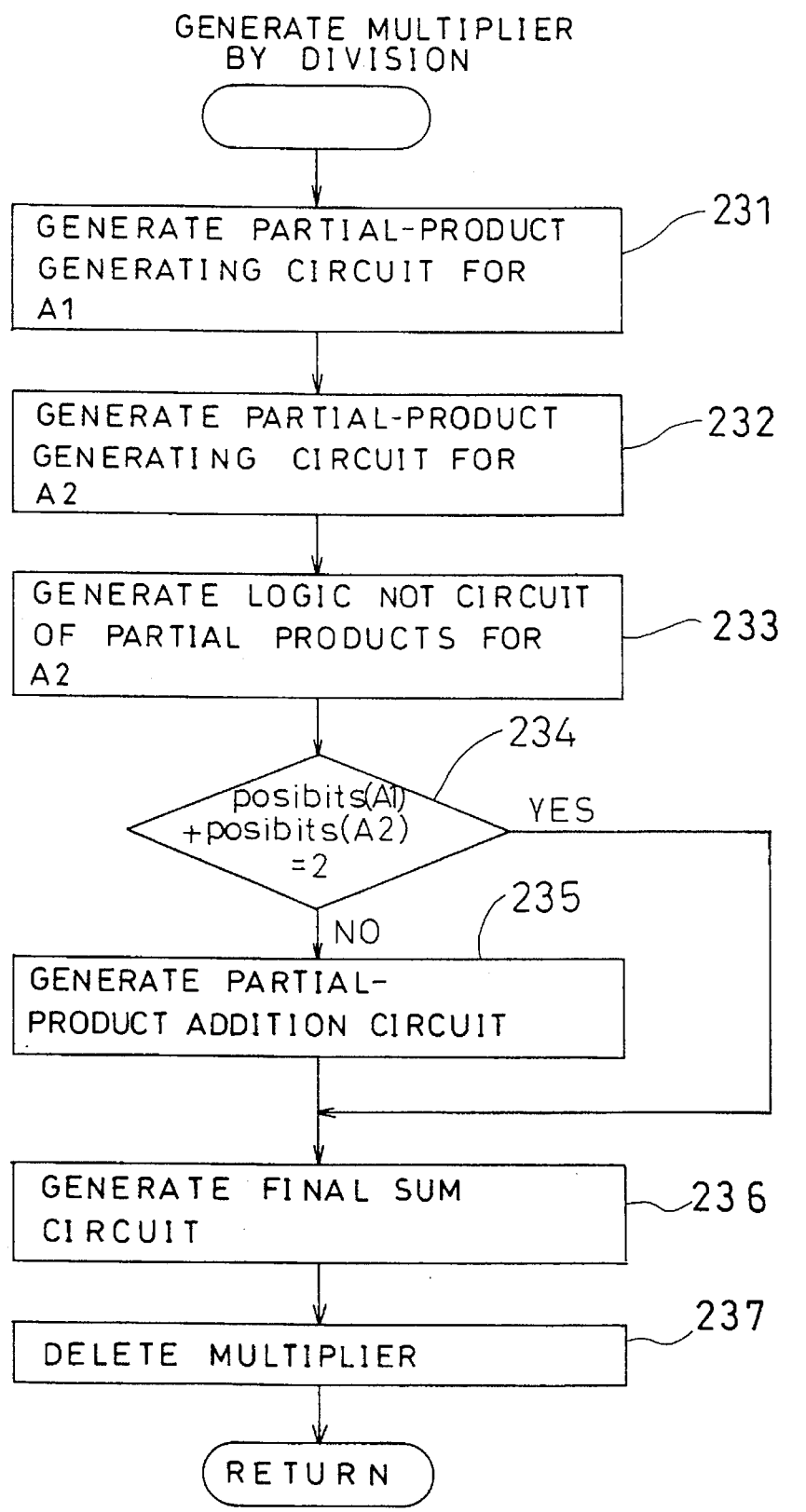
FIG. 12 is a flow chart showing in detail a process of generating a multiplier by division in Step 148 of FIG. 7.

FIG. 12 is a flow chart showing in detail the process of generating a multiplier by division performed in Step 148. As shown in the drawing, there is performed in Step 231 a process of generating the partial-product generating circuit 242 of FIG. 27 for multiplying the multiplicand X by the constant A1 determined in Step 143, instead of the multiplier factor A, similarly to the process of generating a partial-product generating circuit performed in Step 151 of FIG. 8. In other words, it is a process of generating a circuit for generating partial products from the multiplicand X and the above constant A1, using the conversion rule 3 shown in FIG. 22.

In Step 232 is performed a process of generating the partial-product generating circuit 243 of FIG. 27 for multiplying the multiplicand X by the constant A2 determined in Step 143, instead of the multiplier factor A, similarly to Step 231. In other words, it is a process of generating a circuit for generating partial products from the multiplicand X and the above constant A2, using the conversion rule 3 shown in FIG. 22.

In Step 233 is performed a process of generating circuit information on the logic NOT circuits 244, ..., 245 which were generated in Step 232 and which receive the outputs $O_0, \ldots, O_{H-1}$ of the partial-product generating circuit 243 of FIG. 27 and entering the resulting circuit information in the circuit data storage unit 23. In the present example, each of the logic NOT circuits 244, ..., 245 is composed of an L-bit inverter.

In step 234 is performed a process of judging whether or not the posibits(A1)+posibits(A2) is equal to 2 (i.e., posibits(A1)+posibits(A2)=2). If the posibits(A1)+posibits(A2) is equal to 2, the process goes on to Step 236 where the final sum circuit is generated. If the posibits(A1)+posibits(A2) is not equal to 2, on the other hand, the process goes on to Step 235 where the partial-product addition tree is generated.

In Step 235 is performed a process of generating the partial-product addition tree 246 of FIG. 27 for the outputs of the circuits generated in Steps 231 and 233, similarly to the process of generating a partial-product addition tree performed in Step 153 of FIG. 8. In other words, it is a process of constituting, using the conversion rule 4 shown in FIG. 23, the partial-product addition tree 246 for adding up the partial products $P_0, \ldots, P_{k-1}$ and $R_0, \ldots, R_{H-1}$ of FIG. 27 by an addition tree with less carry propagation which consists of adders at several stages.

In Step 236 is performed a process of generating circuit information on the final sum circuit for adding up the partial sum $Q_0$ and partial carry $Q_1$ outputted from the partial-product addition tree 246 and the correction number H or adding up the output $P_0$ of the partial-product generating circuit 248, the output $R_0$ from the logic NOT circuit 250, and the correction number 1, and entering the resulting circuit information in the circuit data storage unit 23.

Specifically in the example shown in FIG. 27 (where H=2), it is a process of generating the carry-lookahead adder (CLA) 247 for adding up the partial sum $Q_0$, which was outputted from the partial-product addition tree 246 and a signal composed of the lower L bits of a signal having the value given by the numerical expression $Q_1 \times 2+1$, with the carry in being set to 1. In order to add the correction number 1 in the carry-lookahead adder (CLA) 247, the carry in to the carry-lookahead adder (CLA) 247 is set to 1 or the partial carry signal $Q_1$ is shifted to one bit higher-order position and '1' is placed in its least significant bit position so that it is added up with the partial sum by the carry-lookahead adder (CLA) 247. In order to add the correction number 2, the partial carry signal $Q_1$ is shifted to one bit higher-order position and '1' is placed in its least significant bit position so that it is added up with the partial sum by the carry-lookahead adder (CLA) 247, with the carry in being set to 1. If the posibits(A1)+ posibits(A2)=2, it is a process of generating the carry-lookahead adder (CLA) 240 for adding up the output $P_0$ of the partial-product generating circuit 248 and the output $R_0$ of the logic NOT circuit 250 with the carry in being set to 1.

Although the final sum circuit adds the correction number H by means of the carry-lookahead adders (CLA) 247 and 240 in the present embodiment, the structure can be used only in the case where H is equal to or less than 2. However, the final sum circuit can have another structure provided that it can add up the above partial sum $Q_0$, partial carry $Q_1$, and correction number H. It is also possible, as described with FIG. 27, to generate the partial-product addition tree for adding the correction number H as well in Step 235 without adding the correction number H in the final sum circuit.

In Step 237 is performed a process of deleting the circuit information on a multiplier corresponding to the multiplier 241 of FIG. 27 from the circuit data storage unit 23.

Figure 13:
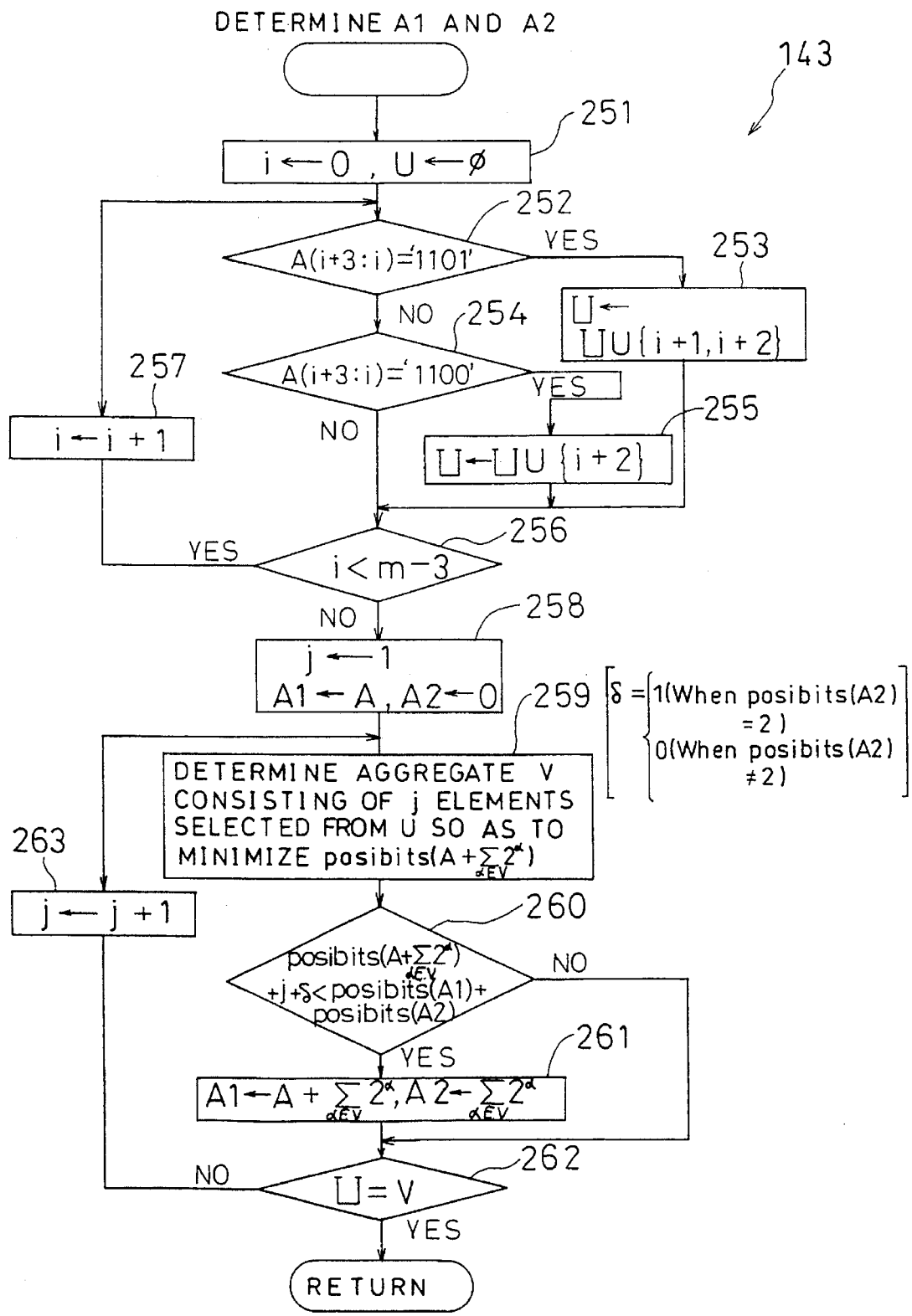
FIG. 13 is a flow chart showing in detail a process of dividing a multiplier factor in Step 143 of FIG. 7.

FIG. 13 is a flow chart showing in detail the process of determining A1 and A2 in Step 143. As shown in the drawing, the initial values are set to the bit-position variable i and to a candidate-bit-position aggregate U in Step 251. In other words, 0 is set to i and the empty class (i.e., $\phi$) is set to U.

In Step 252 is performed a process of judging whether or not the four bits A(i+3:i) of the multiplier factor A are equal to '1101' in binary representation. If the answer is YES, the process goes on to Step 253 where the candidate-bit-position aggregate U is set. If the answer is NO, the process goes on to Step 254 where another judging process is performed.

In Step 253 is performed a process of adding elements (i+1) and (i+2) to the candidate-bit-position aggregate U. In other words, the union U U{i+1, i+2} of U and {i+1, i+2} is newly set to U.

In Step 254 is performed a process of judging whether or not the four bits A(i+3i) of the multiplier factor A are equal to '1100' in binary representation. If the answer is YES, the process goes on to Step 255 where '1100' is set to the candidate-bit-position aggregate U. If the answer is NO, the process goes on to Step 256 where another judging process is performed.

In Step 255 is performed a process of adding the element (i+2) to the candidate-bit-position aggregate U. In other words, the union U U{i+2} of U and {i+2} is newly set to U.

In step 256 is performed a process of judging whether or not a judgment has been made with respect to each bit of the multiplier factor A. In other words, it is a process of judging whether or not the bit-position variable i is smaller than (m−3). If i is smaller than (m−3), the process goes on to Step 257, where the bit-position variable i is counted up. If i is equal to or larger than (m−3), on the other hand, the process goes on to Step 258 where another initial-value setting process is performed.

In Step 257 is performed a process of updating the bit-position variable i to the value of (i+1) so as to process the subsequent bit in the multiplier factor A. After the present process was completed, the process returns to Step 252 where the processes of Steps 252 to 258 are repeatedly executed with respect to i that has been updated.

In Step 258 is performed a process of setting the initial values to A1, A2, and a counter j. In other words, the multiplier factor A, 0, and 1 are set to A1, A2, and j, respectively.

In Step 259 is performed a process of determining an aggregate V consisting of j elements selected from the candidate-bit-position aggregate U so that the posibits $(A+\Sigma 2^\alpha)$ is minimized. Here, it is assumed that $\alpha$ represents a given element of the aggregate V and $\Sigma 2^\alpha$ represents the sum of $2^\alpha$'s calculated for all the elements of the aggregate V.

In Step 260 is performed a process of comparing the posibits$(A+\Sigma 2^\alpha)+j+\delta$ with the posibits(A1)+posibits(A2) with respect to the aggregate V determined in Step 259, wherein $\delta$ is 1 if posibits(A2)=2 and is 0 in other cases. Here, $\delta$ is added to the above numerical expression because, if posibits(A2)=2, the correction number H mentioned in the description of FIG. 12 becomes 3 or more, so that it is necessary to add the correction number in the partial-product addition tree 246 of FIG. 27. If it is judged in Step 260 that the posibits$(A+\Sigma 2^\alpha)+j+\delta$ is smaller than the posibits (A1)+posibits(A2), the process goes on to Step 261 where the process of updating A1 and A2 is performed. If the posibits$(A+\Sigma 2^\alpha)+j+\delta$ is equal to or more than the posibits(A1)+posibits(A2), on the other hand, the process goes on to Step 262 where it is judged whether or not the process of determining A1 and A2 is completed.

In Step 261 is performed an updating process of newly setting the value of $(A+\Sigma 2^\alpha)$ to A1 and setting the value of $\Sigma 2^\alpha$ to A2.

In Step 262 is performed a process of judging whether or not the aggregate V is equal to the candidate-bit-position aggregate U (i.e., V=U). If the aggregate V is equal to the candidate-bit-position aggregate U, the process of determining A1 and A2 of Step 143 is completed. If the aggregate V is not equal to the candidate-bit-position aggregate U, the process goes on to Step 263 where the counter j is counted up.

In Step 263 is performed a process of updating the counter j to the value of (j+1). After the present process was completed, the process returns to Step 259 where the processes of Steps 259 to 261 are repeatedly performed with respect to j that has been updated.

Although the example shown in FIG. 13 has performed the process with respect to each j until V=U is satisfied in the present embodiment, if the posibits$(A+\Sigma 2^\alpha)+j+\delta$ is equal to or more than the posibits(A1)+posibits(A2) in Step 260, it is possible to complete the process without going on to Step 262 for simplicity. If the judging process of Step 262 is replaced with a process of judging whether j=2 or not, the posibits(A1)+posibits(A2) becomes smaller than the posibits(A), so that it achieves the effect of reducing the number of partial products.

Next, it will be proved using numerical expressions that a conversion can be made to a circuit equivalent to the original multiplier in accordance with the foregoing conversion rules 1 to 8. However, the description using the conversion rules 2 to 6 will be omitted for obvious reasons. A description will be given on the assumption that L=m+n without losing generality.

Conversion Rule 1 (see FIG. 20)

In FIG. 20, a reference numeral 132 designates an AND circuit for carrying out the logic AND P(n−1) between a 1-bit multiplicand X(n−1) and a 1-bit variable multiplier factor Y(0), 133 designates an AND circuit for carrying out the logic AND P(n–2) between a 1-bit multiplicand X(n–2) and a 1-bit variable multiplier factor Y(0), . . . , 134 designates an AND circuit for carrying out the logic AND P(1) between a 1-bit multiplicand X(1) and a 1-bit variable multiplier factor Y(0), and 135 designates an AND circuit for carrying out the logic AND P(0) between a 1-bit multiplicand X(0) and a 1-bit variable multiplier factor Y(0).

Since $Y(0) = 0$ or 1, $$P = \sum_{i=0}^{n-1} \{X(i) * Y(0) * 2^i\}.$$

Since each of $Y(0)$ and $P(i)$ is composed of 1 bit, $$X(i) * Y(0) = X(i) \text{ and } Y(0).$$

Hence, $$P(i) = X(i) \text{ and } Y(0) \quad (0 \leq i \leq n-1)$$

$$P(n) = 0.$$

Conversion Rule 7 (see FIG. 26)

Below, the logic NOT number obtained by inverting all the bits in a multiple-bit number Z by the logic NOT operation will be represented by #Z. For the constant A, $$-A = \#A + 1 - 2^m \leftarrow \rightarrow \#A + 1 = 2^m - A.$$

For an n-bit number X, $$[\text{two's complement of } X] = \#X + 1 = -X.$$

Therefore, $$\begin{aligned} P &= X * A \quad (3) \\ &= X * (2^m - \#A - 1) \\ &= X * 2^m - X * (\#A + 1) \\ &= X * 2^m + [X * \text{two's complement of } (\#A + 1)] \end{aligned}$$

Moreover, since $$Q_0 + Q_1 = X * (\#A + 1) \rightarrow -X * (\#A + 1) = -(Q_0 + Q_1) \quad (4)$$
$$= -Q_0 - Q_1,$$

Namely, $$[X * \text{two's complement of } (\#A+1)] = [\text{two's complement of } Q_0] + [\text{two's complement of } Q_1].$$

Therefore, the equation (3) becomes $$\begin{aligned} P &= X * A \quad (5)\\ &= X * 2^m + [\text{two's complement of } Q_0] + [\text{two's complement of } Q_1] \\ &= X * 2^m + \#Q_0 + 1 + \#Q_1 + 1 \\ &= \#Q_0 + \#Q_1 + X * 2^m + 2 \\ &= \#Q_0 + \#Q_1 + (X * 2^m + 2). \end{aligned}$$

The third term $(X * 2^m + 2)$ in the equation (5) can be obtained as the signal R3 by linking an m-bit signal indicating the value of 2 to a signal indicating the multiplicand X.

The first term $\#Q_0$ and second term $\#Q_1$ in the equation (5) are the logic NOTs of the partial sum $Q_0$ and partial carry $Q_1$ outputted from the partial-product addition tree 223, respectively. However, $Q_1$ is shifted one bit higher-order position and '0' is placed in its least significant bit position, as shown in FIG. 26. Therefore, the product P can be obtained through the adding up of the first to third terms in the equation (5) by the final sum circuit consisting of the carry-save adder (CSA) 226 and the carry-lookahead adder (CLA) 227.

Since $$Q_0 + Q_1 = X * \#A + X \quad (6)$$

can be derived from the equation (4), #A in the first term on the right side of the equation (6) corresponds to A0 in FIG. 26, so that the first term $X * \#A$ on the right side can be obtained as the partial products $P_0, \ldots, P_{K-1}$ by the partial-product generating circuit 222. On the other hand, $Q_0$ and $Q_1$ on the left side of the equation (6) can be obtained as the partial sum $Q_0$ and partial carry $Q_1$ through the adding up of the partial products $P_0, \ldots, P_{K-1}$ and X in the second term on the right side by the partial-product addition circuit 223. However, if X in the second term on the right side of the equation (6) is added by the partial-product addition tree 223, a signal obtained through the 0 extension of X is inputted.

Conversion Rule 8 (see FIG. 27)

Below, the logic NOT number obtained by inverting all the bits in the multiple-bit number Z by the logic NOT operation will be represented by #Z.

For the constant A, $$A = A1 - A2$$

and for an n-bit number X, in general, $$[\text{two's complement of } X] = \#X + 1 = -X.$$

Therefore, $$\begin{aligned} P &= X * A \quad (7) \\ &= X * (A1 - A2) \\ &= X * A1 - X * A2. \end{aligned}$$

Moreover, since $$X * A1 = \sum_{i=0}^{K-1} P_i$$

and $$X * A2 = \sum_{i=0}^{H-1} O_i,$$

the equation (7) becomes $$\begin{aligned} P &= X * A \quad (8) \\ &= \sum_{i=0}^{K-1} P_i - \sum_{i=0}^{H-1} O_i \\ &= \sum_{i=0}^{K-1} P_i + \sum_{i=0}^{H-1} (-O_i) \\ &= \sum_{i=0}^{K-1} P_i + \sum_{i=0}^{H-1} [\text{two's complement of } O_i] \\ &= \sum_{i=0}^{K-1} P_i + \sum_{i=0}^{H-1} (\#O_i + 1) \\ &= \sum_{i=0}^{K-1} P_i + \sum_{i=0}^{H-1} (\#O_i) + \sum_{i=0}^{H-1} 1 \\ &= \sum_{i=0}^{K-1} P_i + \sum_{i=0}^{H-1} (\#O_i) + H \end{aligned}$$

where each $P_i$ in the first term is a partial product for the m-bit signal A1 and the multiplicand X, which can be calculated by the partial-product generating circuit 242, and each #$O_i$ in the second term is a partial product for the m-bit signal A2 and the multiplicand X, which can be calculated by the partial-product generating circuit 243 and logic NOT circuits 244, . . . , 245. In general, the product P can be obtained through the adding up of these partial products $P_i$ (i=0, . . . , K−1) and #$O_i$ (i=0, . . . , H−1), and H in the third term by the partial-product addition tree 246 and final sum circuit 247.

Next, if H (H>0) is equal to or less than 2 as shown in the example of FIG. 27, $$Q_0 + Q_1 * 2 = \sum_{i=0}^{K-1} P_i + \sum_{i=0}^{H-1} (\#O_i).$$

Hence, $$\begin{align} P &= X * A \quad (9)\\ &= Q_0 + Q_1 * 2 + H\\ &= Q_0 + (Q_1 * 2 + 1) + (H - 1) \end{align}$$

where the first term $Q_0$ and $Q_1 * 2$ in the second term can be obtained as the partial sum $Q_0$ and partial carry $Q_1$ of the partial-product addition tree 246 for adding up the partial product $P_i$ (i=0, . . . , K−1) and #$O_i$ (i=0, . . . , H−1); the second term $Q_1 * 2+1$ is a signal synthesized from the partial carry $Q_1$ by linking a 1-bit signal to the least significant bit thereof, as shown in FIG. 27, though any consideration has not been given to the most significant bit $Q_1(m+n-1)$ (i.e., the (m+n)-th bit) thereof; and the first term $Q_0$, second term ($Q_1 * 2+1$), and third term (H−1) are added up by the final sum circuit 247 so as to calculate the product P.

The conversion rule 7 can be considered as the conversion rule 8 in a special case. That is, the conversion rule 7 corresponds to the conversion rule 8 in the case where $$-A = \#A + 1 - 2^m \leftrightarrow A = 2^m - (\#A + 1)$$

is satisfied by the constant A, $$A1 = 2^m A2 = (\#A + 1)$$

are satisfied in the conversion rule 8.
Therefore, $$\begin{align} P &= X * A\\ &= X * (2^m - \#A - 1)\\ &= X * 2^m - X * (\#A + 1)\\ &= X * 2^m + [X * \text{two's complement of } (\#A + 1)] \end{align}$$

where an n-bit number X satisfies

[two's complement of X] = #X + 1 = −X.

Moreover, since $$X * A = \sum_{i=0}^{K-1} P_i, \quad (10)$$

$$\begin{align} P &= X * A\\ &= X * (2^m - \#A - 1)\\ &= X * 2^m - X * \#A - X\\ &= X * 2^m - \sum_{i=0}^{K-1} P_i - X\\ &= X * 2^m + \sum_{i=0}^{K-1} (-P_i) + (-X) \end{align}$$

$$= X * 2^m + \sum_{i=0}^{K-1} [\text{two's complement of } -P_i] +$$
[two's complement of X]

$$= X * 2^m + \sum_{i=0}^{K-1} (\#P_i + 1) + (\#X + 1)$$

$$= X * 2^m + \sum_{i=0}^{K-1} (\#P) + \sum_{i=0}^{K-1} + \#X + 1$$

$$= X * 2^m + \sum_{i=0}^{K-1} (\#P) + \#X + (K + 1).$$

The first, second, and third terms of the equation (10) are inputs to the partial-product addition tree. Hence, the product P can be obtained through the adding up of the output of the above partial-product addition tree and the fourth term (K+1) by the final sum circuit.

The first term of the equation (10) was obtained by shifting the multiplicand X by m bits. The second term of the equation (10) is the output of the partial-product generating circuit for receiving the logic NOT #A of the multiplier factor and the multiplicand X. The third term of the equation (10) is the output from the logic NOT circuit for receiving the multiplicand X.

The conversion rule 2 can also be considered as the conversion rule 8 in another special case. Therefore, the conversion rule 2 can easily be derived from the conversion rule 8 by setting A1=A and A2=0.

Thus, in the automatic logic-circuit designing system according to the first embodiment, if the multiplier factor inputted to the multiplier is the constant A and if the total number of the bits having the value of 1 in the multiplier factor A is 3 or more, there is generated the circuit for calculating partial products corresponding to the bits having the value of 1 in the multiplier factor A, so that the circuit for calculating the sum of the partial products is constituted by the addition tree of carry-save adders. Consequently, the number of logic stages for addition can be reduced as well as higher-speed multiplication can be implemented.

If the total number of the bits having the value of 1 in the multiplier factor A is 2 or less, there is constituted the circuit for calculating partial products only with respect to the bits having the value of 1. Consequently, the number of partial products as well as circuit area can be reduced.

If the total number of the bits having the value of 1 in the multiplier factor A is large, there are constituted: the circuit for calculating partial products from the logic NOT number of the multiplier factor A and the multiplicand; the addition tree of carry-save adders for adding up the partial products and the correction signal; and a correcting circuit. Consequently, the number of partial products as well as circuit area can be reduced.

If the total number of the bits having the value of 1 in the multiplier factor A is large, there is alternatively constituted with respect to the constants A1 and A2 (A=A1−A2) having a difference equal to the multiplier factor A therebetween and having the minimum total number of the bits having the value of 1: the circuit for calculating the partial products of the constant A1 and multiplicand; the circuit for calculating the partial products of the constant A2 and multiplicand; the circuit for carrying out the logic NOT operation with respect to the partial products for the constant A2; the addition tree of carry-save adders for adding up the partial products for the constant A1 and the logic NOTs of the partial products for the constant A2; and the correcting circuit. Consequently, the number of partial products as well as circuit area can be reduced.

(Second embodiment)

Below, a description will be given to an automatic logic-circuit designing system according to a second embodiment of the present invention. The automatic designing system of the second embodiment has the same hardware structure as that of the first embodiment, except that a process of generating a multiplier of FIG. 14 is performed instead of the process of generating a multiplier of FIG. 7 in the process of designing a circuit.

Figure 14:
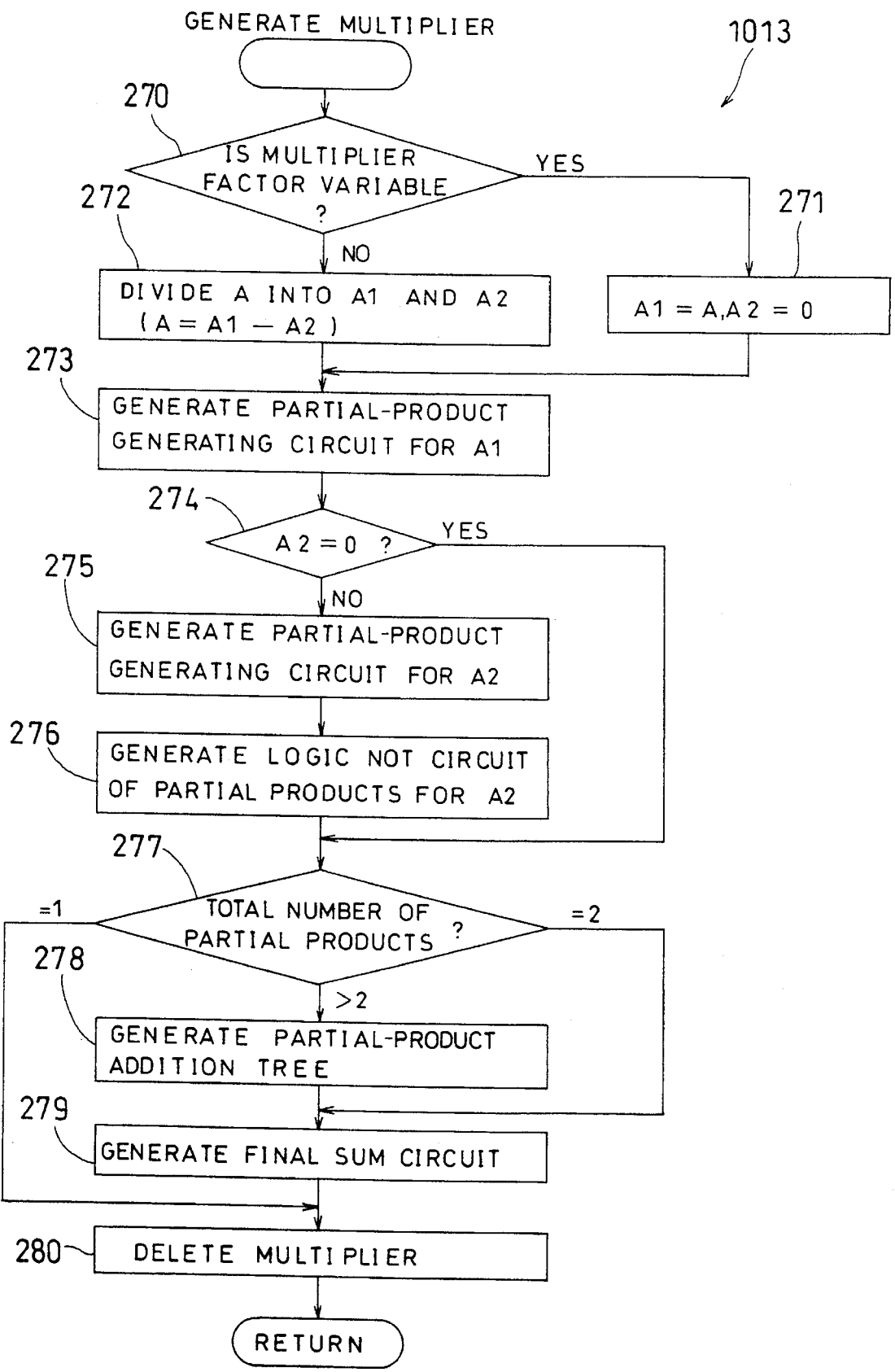
FIG. 14 is a flow chart showing a process of generating a multiplier by an automatic logic-circuit designing system according to a second embodiment of the present invention.
Figure 15:
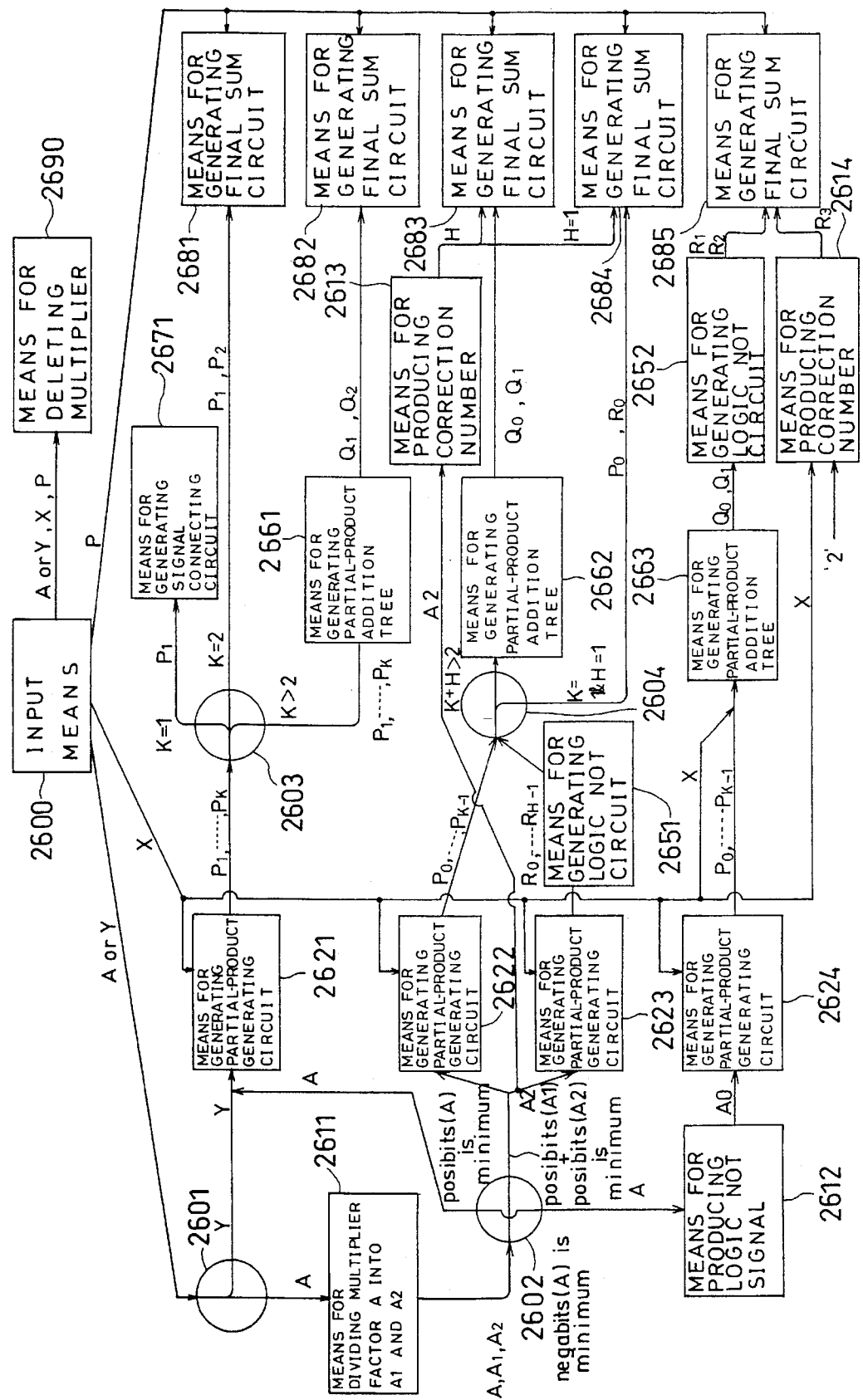
FIG. 15 is a block diagram showing the structure of an automatic logic-circuit designing system according to a third embodiment of the present invention.

FIG. 14 is a flow chart showing in detail the process of generating a multiplier performed in Step 1013 of FIG. 15. The process of generating a multiplier was obtained by developing the process of generating a multiplier by division in FIG. 12 of the first embodiment. In the present process of generating a multiplier, the number of the logic stages in the circuit for calculating the number and sum of partial products is generally reduced as follows: If the multiplier factor is a constant, a conversion is made to a circuit for calculating partial products only with respect to the bits having the value of 1 in two constants having a difference equal to the multiplier factor therebetween, so as to reduce the number of the partial products. If the multiplier factor is a constant or if the multiplier factor is a variable, a conversion is made to a circuit using an addition tree with less carry propagation, so as to reduce the number of the logic stages in the circuit for calculating the sum of partial products.

As shown in FIG. 14, in Step 270 is first performed a judging process, similarly to Step 141 of FIG. 7. If the multiplier factor is a variable, which indicates that multiplication of the variable multiplicand by the variable multiplier factor will be performed, the process goes on to Step 271 where the two constants A1 and A2 are set. If the multiplier factor is the constant A, on the other hand, the process goes on to Step 272 where the multiplier factor A is divided into the two constants A1 and A2.

In Step 271 is performed a process of setting the two constants A1 and A2. Specifically, it is a process of setting the multiplier factor A and 0 to A1 and A2, respectively (i.e., A1=A and A2=0). After completing the present process in Step 271, the process goes on to Step 273.

Step 272 is performed a process of determining, in accordance with the flow chart of FIG. 13, A1 and A2 which satisfy A=A1−A2 and minimize the value of the posibits(A1)+posibits(A2), similarly to Step 143 of FIG. 7. In special cases, the pair of A1 and A2 determined in the present process include A1=A and A2=0 corresponding to the conversion rule 2 and A1=$2^m$ and A2=(#A+1) corresponding to the conversion rule 9.

In Step 273 is performed the process of generating a partial-product generating circuit, mentioned in the description of FIG. 9, for A1 determined in Step 271 or 272 in place of the multiplier factor A, similarly to Step 231 of FIG. 12. In other words, it is a process of generating partial products from the above A1 and multiplicand X in accordance with the conversion rule 3 shown in FIG. 22.

In Step 274, it is judged whether or not the constant A2 is equal to 0. If A2 is equal to 0 (i.e., A2=0), the process goes on to Step 277 by omitting the processes for A2 in Steps 275 and 276. If A2 is not equal to 0, on the other hand, the process goes on to Step 275 where a process of generating a partial-product generating circuit for A2 is performed.

In Step 275 is performed the process of generating a partial-product generating circuit, mentioned in the description of FIG. 9, for the constant A2 determined in Step 271 or 272 in place of the multiplier factor A, similarly to Step 232 of FIG. 12. In other words, it is a process of generating partial products from the multiplicand X and the above constant A2 in accordance with the conversion rule 3 shown in FIG. 22.

In Step 276 is performed a process of generating circuit information on a logic NOT circuit for receiving the output of the partial-product generating circuit generated in Step 275, and entering the resulting circuit information in the circuit data storage unit 23, similarly to Step 233 of FIG. 12. In the present embodiment, the logic NOT circuit is composed of an inverter.

In Step 277 is performed a process of judging whether the sum of the number of the partial products for A1 and the number of the partial products for A2, which is given by posibits(A1)+posibits(A2), is equal to 1, equal to 2, or larger than 2. If the sum of the partial products is equal to 1 (i.e., posibits(A1)+posibits(A2)=1), the process goes on to Step 280 where the process of deleting a multiplier is performed. If the sum of the partial products is equal to 2 (i.e., posibits(A1)+posibits(A2)=2), the process goes on to Step 279 where a final sum circuit is generated. If the sum of the partial products is larger than 2, the process goes on to Step 278 where a partial-product addition tree is generated. However, if A1 is a variable (i.e., the multiplier factor is a variable), the number of the partial products for A1 is equal to its bit width m.

In Step 278 is performed a process of generating a partial-product addition tree with respect to the outputs of the circuits generated in Steps 273 and 276, as mentioned in the description of FIG. 10, similarly to Step 235 of FIG. 12. In other words, it is a process of generating an addition tree with less carry propagation which consists of adders at several stages in accordance with the conversion rule 4 shown in FIG. 28.

In Step 279 is performed a process of generating circuit information on a final sum circuit for adding up: the partial sum $Q_0$ and partial carry $Q_1$, which were outputted from the partial-product addition tree, and the correction number H; the output of the partial-product generating circuit, the output of the logic NOT circuit, and the correction number H; the outputs of the partial-product addition trees; or the outputs of the partial-product generating circuits, and entering the resulting circuit information in the circuit data storage unit, similarly to Step 154 of FIG. 8 or Step 236 of FIG. 12.

In Step 280 is performed a process of deleting the circuit information on a multiplier from the circuit data storage unit 23, similarly to Step 155 of FIG. 8, Step 217 of FIG. 11, or Step 237 of FIG. 12.

(Third Embodiment)

Below, a description will be given to an automatic logic-circuit designing apparatus according to a third embodiment of the present invention.

The automatic designing apparatus of the third embodiment performs the process of Step 1013 in FIG. 5, similarly to Steps 141 to 148 of FIG. 7.

FIG. 15 is a block diagram showing the structure of the automatic designing apparatus of the third embodiment, in which a reference numeral 2600 designates an input means, reference numerals 2601 to 2604 designate judging means, a reference numeral 2611 designates a multiplier-factor dividing means for dividing the multiplier factor A into A1 and A2, 2612 designates a logic-NOT-signal producing means, 2613 designates a correction-number producing means, 2614 designates a correction-signal producing means, reference numerals 2621 to 2624 designate a partial-product-generating-circuit generating means, 2651 and 2652 designate logic-NOT-circuit generating means, 2661 to 2663 designate partial-product-addition-tree generating means, a reference numeral 2671 designates a signal-connecting-circuit generating means, reference numerals 2681 to 2685 designate final-sum-circuit generating means, and a reference numeral 2690 designates a multiplier deleting means (circuit deleting means).

The input means 2600 reads circuit information on the multiplier 191, 221, or 241 of FIG. 24, 26, or 27, which is the original functional element, from the circuit data storage unit 23 of FIG. 2 and outputs information indicating that one input to the multiplier 191, 221, or 241 is the m-bit multiplier factor Y or A to the judging means 2601 and to the multiplier deleting means (circuit deleting means) 2690, while outputting information indicating that the other input to the multiplier 191, 221, or 241 is the n-bit multiplicand x to the partial-product-generating-circuit generating means 2621 to 2624, to the correction-signal producing means 2614, and to the multiplier deleting means (circuit deleting means) 2690. The input means 2600 also outputs information indicating that the output of the multiplier 191, 221, or 241 is the L-bit product P to the final-sum-circuit generating means 2681 to 2685, to the signal-connecting-circuit generating means 2671, and to the multiplier deleting means (circuit deleting means) 2690.

The judging means 2601 is for judging whether the multiplier factor to the multiplier 191, 221, or 241 is the variable Y or constant A. If the multiplier factor is the variable Y, the judging means 2601 outputs information on the multiplier factor Y to the partial-product-generating-circuit generating means 2621. If the multiplier factor is the constant A, on the other hand, the judging means 2601 outputs information on the multiplier factor A to the multiplier-factor dividing means 2611.

The multiplier-factor dividing means 2611 first determines the constants A1 and A2 which satisfy A=A1−A2 and minimize posibits(A1)+posibits(A2) in accordance with the method shown in FIG. 13, so that the multiplier factor A is divided into the constants A1 and A2. The multiplier-factor dividing means 2611 then outputs information on the constants A1 and A2 and on the original multiplier A to the judging means 2602.

The judging means 2602 is for judging which is the smallest of the posibits(A), posibits(A1)+posibits(A2), and negabits(A)+2 (i.e., m-posibits(A)+2). If the posibits(A) is the smallest (including the case where the posibits(A) is equal to any other object off comparison), the judging means 2602 outputs, to the partial-product-generating-circuit generating means 2621, information on the multiplier factor A to the multiplier 191. If the posibits(A1)+posibits(A2) is the smallest (including the case where the posibits(A1)+posibits(A2) is equal to the negabits(A)+2), the judging means 2602 outputs, to the partial-product-generating-circuit generating means 2622, information on A1 determined by the multiplier-factor dividing means 2611 with respect to the multiplier factor A to the multiplier 241 and outputs, to the partial-product-generating-circuit generating means 2623 and to the correction-number producing means 2613, information on A2 also determined by the multiplier-factor dividing means 2611 with respect to the multiplier factor A to the multiplier 241. If the negabits(A)+2 is solely the smallest, the judging means 2602 outputs, to the logic-NOT-signal producing means 2612, information on the multiplier factor A to the multiplier 221.

The logic-NOT-signal producing means 2612 is for calculating the constant A0 by carrying out the logic NOT operation with respect to the multiplier factor A to the multiplier 221. The logic-NOT-signal producing means 2612 outputs, to the partial-product-generating-circuit generating means 2624, information on the constant A0.

Each of the partial-product-generating-circuit generating means 2621 to 2624 is for: receiving information on the multiplicand X to the multiplier 191, 221, or 241 and on any of Y, A, A1, A2, and A0 and generating circuit information on a partial-product generating circuit which outputs the product thereof as partial products; and entering the resulting circuit information in the circuit data storage unit 23.

Specifically, the partial-product-generating-circuit generating means 2621 is for receiving information on the multiplicand X to the multiplier 191 and on the multiplier factor Y or A, generating a partial-product generating circuit which outputs their partial products $P_1, \ldots, P_K$, and entering information on the resulting circuit in the circuit data storage unit 23. The partial-product-generating circuit generating means 2621 outputs information on the above partial products $P_1, \ldots, P_K$ to the Judging means 2603.

The partial-product-generating-circuit generating means 2622 is for receiving information on the multiplicand X to the multiplier 241 and on the above multiplier factor A1, generating a partial-product generating circuit which outputs their partial products $P_0, \ldots, P_{K-1}$, and entering information on the resulting circuit in the circuit data storage unit 23. The partial-product-generating circuit generating means 2622 outputs information on the above partial products $P_0, \ldots, P_{K-1}$ to the judging means 2604.

The partial-product-generating-circuit generating means 2623 is for receiving information on the multiplicand X to the multiplier 241 and on the above multiplier factor A2, generating a partial-product generating circuit which outputs their partial products $Q_0, \ldots, Q_{H-1}$, and entering information on the resulting circuit in the circuit data storage unit 23. The partial-product-generating circuit generating means 2623 outputs information on the above partial products $Q_0, \ldots, Q_{H-1}$ to the logic-NOT-circuit generating means 2651.

The partial-product-generating-circuit generating means 2624 is for receiving information on the multiplicand X to the multiplier 221 and on the logic NOT constant A0 of the multiplier factor A, generating a partial-product generating circuit which outputs their partial products $P_0, \ldots, P_{K-1}$, and entering information on the resulting circuit in the circuit data storage unit 23. The partial-product-generating-circuit generating means 2624 outputs information on the above partial products $P_0, \ldots, P_{K-1}$ to the partial-product-addition-tree generating means 2663.

The logic-NOT-circuit generating means 2651 is for receiving information on the above partial products $Q_0, \ldots, Q_{H-1}$, generating a logic NOT circuit which outputs their respective logic NOT signals $R_0, \ldots, R_{H-1}$, and entering it in the circuit data storage unit 23. The logic-NOT-circuit generating means 2651 outputs information on the above partial products $R_0, \ldots, R_{H-1}$ to the judging means 2604.

The judging means 2603 is for judging whether the number K of the above partial products $P_1, \ldots, P_K$ is 1, 2, or 3 or more. If the number K of the above partial products is 1, the judging means 2603 outputs information on the partial product $P_1$ to the signal-connecting-circuit generating means 2671. If the number K of the above partial products is 2, the judging means 2603 outputs information on the partial products $P_1$ and $P_2$ to the final-sum-circuit generating means 2681. If the number K of the above partial products is 3 or more, the judging means 2603 outputs information on the partial products $P_1, \ldots, P_K$ to the partial-product-addition-tree generating means 2661.

The judging means 2604 is for judging whether or not the sum (K+H) of the number of the above partial products $P_0, \ldots, P_{K-1}$ and the number of the partial products $R_0, \ldots, R_{H-1}$ is 2 (i.e., K=1 and H=1) or 3 or more. If the sum (K+H)

of the numbers is 2 (i.e., K=1 & H=1), the judging means 2604 outputs information on the partial products $P_0$ and $R_0$ to the final-sum-circuit generating means 2684. If the sum (K+H) of the numbers of the above partial products is 3 or more, the judging means 2604 outputs information on the partial products $P_0, \ldots, P_{K-1}$ and $R_0, \ldots, R_{H-1}$ to the Partial-product-addition-tree generating means 2662.

Each of the partial-product-addition-tree generating means 2661 to 2663 is for: receiving information on the partial products $P_1, \ldots, P_K$, partial products $P_0, \ldots, P_{K-1}$, and $R_0, \ldots, R_{H-1}$ or partial products $P_0, \ldots, P_{K-1}$; adding up the partial products indicated by the received information; generating circuit information on a partial-product addition tree which outputs the partial sum and partial carry ($Q_1$ and $Q_2$ or $Q_0$ and $Q_1$); and entering it in the circuit data storage unit 23.

Specifically, the partial-product-addition-tree generating means 2661 is for: receiving information on the partial products $P_1, \ldots, P_K$; generating a partial-product addition tree which outputs their partial sum $Q_1$ and partial carry $Q_2$; and entering information on the resulting addition tree in the circuit data storage unit 23. The partial-product-addition-tree generating means 2661 outputs information on the above partial sum $Q_1$ and partial carry $Q_2$ to the final-sum-circuit generating means 2682.

The partial-product-addition-tree generating means 2662 is for: receiving information on the partial products $P_0, \ldots, P_{K-1}$ and $R_0, \ldots, R_{H-1}$; generating a partial-product addition tree which outputs their partial sum $Q_0$ and partial carry $Q_1$; and entering information on the resulting addition in the circuit data storage unit 23. The partial-product-addition-tree generating means 2662 outputs information on the above partial sum $Q_0$ and partial carry $Q_1$ to the final-sum-circuit generating means 2683.

The partial-product-addition-tree generating means 2663 is for: receiving information on the partial products $P_0, \ldots, P_{K-1}$; generating a partial-product addition tree which outputs their partial sum $Q_0$ and partial carry $Q_1$; and entering information on the resulting addition tree in the circuit data storage unit 23. The partial-product-addition-tree generating means 2663 outputs information on the above partial sum $Q_0$ and partial carry $Q_1$ to the logic-NOT-circuit generating means 2652.

The logic-NOT-circuit generating means 2652 is for: receiving information on the above partial sum $Q_0$ and partial carry $Q_1$; generating a logic NOT circuit which outputs their respective logic NOT signals $R_1$ and $R_2$; and entering information on the resulting circuit in the circuit data storage unit 23. The logic-NOT-circuit generating means 2652 outputs information on the logic NOT signals $R_1$ and $R_2$ to the final-sum-circuit generating means 2685.

The correction-number producing means 2613 is for receiving information on the above constant A2 and calculating H=posibits(A2) as the correction number for the final sum. The correction-number producing means 2613 outputs information on the correction number H to the final-sum-circuit generating means 2683.

The correction-signal producing means 2614 is for receiving information on the multiplicand X and the number 2 and producing a correction signal $R_3$ for the final sum which is composed of the lower L bits of the signal given by the numerical expression $X \times 2^m + 2$, as shown in FIG. 26. The correction-signal producing means 2614 outputs information on the correction signal $R_3$ to the final-sum-circuit generating means 2685.

Each of the final-sum-circuit generating means 2681 to 2685 is for: receiving information on the partial products $P_1$ and $P_2$, on the partial sum $Q_1$ and partial carry $Q_2$, on the partial sum $Q_0$, partial carry $Q_1$, and correction number H, on the partial products $P_0$ and $R_0$, or on the signals $R_1$, $R_2$, and $R_3$; adding up the set indicated by the received information; generating circuit information on a final sum circuit which outputs the final sum as the L-bit product P, which is the output of the multiplier 191, 221, or 241; and entering the resulting circuit information in the circuit data storage unit 23.

Specifically, the final-sum-circuit generating means 2681 is for: receiving information on the above partial products $P_1$ and $P_2$ and information indicating that the output of the multiplier 191 is the L-bit product P; adding up these partial products $P_1$ and $P_2$; generating circuit information on a final sum circuit which outputs the final sum as the product P from the multiplier 191; and entering the resulting circuit information in the circuit data storage unit 23.

The final-sum-circuit generating means 2682 is for: receiving information on the above partial sum $Q_1$ and partial carry $Q_2$ and information indicating that the output of the multiplier 191 is the L-bit product P; adding up these partial sum $Q_1$ and partial carry $Q_2$; generating circuit information on a final sum circuit which outputs the final sum as the product P from the multiplier 191; and entering the resulting circuit information in the circuit data storage unit 23.

The final-sum-circuit generating means 2683 is for: receiving information on the above partial sum $Q_0$, partial carry $Q_1$, and correction number H and information indicating that the output of the multiplier 241 is the L-bit product P; adding up these partial sum $Q_0$, partial carry $Q_1$, and the correction number H; generating circuit information on a final sum circuit which outputs the final sum as the product P from the multiplier 241; and entering the resulting circuit information in the circuit data storage unit 23.

The final-sum-circuit generating means 2684 is for: receiving information on the above partial products $P_0$ and $R_0$ and information indicating that the output of the multiplier 241 is the L-bit product P; adding up these partial products $P_0$ and $R_0$; generating circuit information on a final sum circuit which outputs the final sum as the product P from the multiplier 241; and entering the resulting circuit information in the circuit data storage unit The final-sum-circuit generating means 2685 is for: receiving information on said logic NOT signals $R_1$ and $R_2$ and correction signal $R_3$ and information indicating that the output of the multiplier 221 is the L-bit product P; adding up these logic NOT signals $R_1$, $R_2$, and correction signal $R_3$; generating circuit information on a final sum circuit which outputs the final sum as the product P of the multiplier 221; and entering the resulting circuit information in the circuit data storage unit 23.

The signal-connecting-circuit generating means 2671 is for: receiving information on said partial product $P_1$ and information indicating that the output of the multiplier 191 is the L-bit product P and connects the signal $P_1$ to the signal P; generating circuit information on a signal connecting circuit; and entering the resulting circuit information in the circuit data storage unit 23.

The multiplier deleting means (circuit deleting means) 2690 is for: receiving information indicating that the inputs to the multiplier 191, 221, or 241 is the m-bit multiplier factor Y or A and the n-bit multiplicand X and information indicating that the output of the multiplier 191, 221, or 224 is the L-bit product P; and deleting the circuit information on the multiplier 191, 221, or 241 from the circuit data storage unit 23.

Although the example shown in FIG. 15 has conveniently described the partial-product-generating-circuit generating means 2621 to 2624, partial-product-addition-tree generating means 2661 to 2663, logic-NOT-circuit generating means 2651 and 2652, and final-sum-circuit generating means 2681 to 2685 as different means having the same function, it is also possible to implement part or all of the partial-product-generating-circuit generating means 2621 to 2624, partial-product-addition-tree generating means 2661 to 2663, logic-NOT-circuit generating means 2651 and 2652, and final-sum-circuit generating means 2681 to 2685 by the same means.

Although the example shown in FIG. 15 has employed the output H of the correction-number producing means 2613 as the input to the final-sum-circuit generating means 2683, it is also possible, especially in the case where H is 3 or more, to add the output H of the correction-number generating means 2613 to the input of the partial-product-addition- tree generating means 2662 as a correction number.

In the case of using a multiplier for multiplying the variable multiplicand by the variable multiplier factor (i.e., in the case where the multiplier factor is the variable Y), the partial-product generating circuit to be generated is not limited to the partial-product-circuit generating means 2621 as described above. It is also possible to generate a circuit using the Booth's 2-bit recode system instead.

(Fourth Embodiment)

Below, a description will be given to a multiplier according to a fourth embodiment of the present invention.

The multiplier of the fourth embodiment is generated in accordance with the conversion rule 7 of FIG. 26 and with the conversion rule 8 of FIG. 27. Although the present embodiment will show the case where the variable X is a positive number for the purpose of simplifying the description, if the variable X can be either a positive number or a negative number, sign extension may be performed before the logic NOT operation is performed or the logic NOT operation may be performed before sign extension is performed.

In FIGS. 26 and 27, each of partial-product generating circuits 222, 242, 243, 248, and 249 is composed of a shift circuit for the multiplicand X which corresponds to a bit having the value of 1 in the constants A1 and A2. Gates 220, 224, 225, 244, 245, and 250 are inverters. Each of partial-product adders 223 and 246 consists of carry-save adders arranged in a tree structure. An adder 226 is composed of a carry-save adder for adding up correction terms. Each of final sum circuits 227, 247, and 240 is a carry-lookahead adder which adds up correction terms by utilizing the carry in.

As described above, calculations for the product P by correction can be modified in various manners.

In any of the above multipliers, the constant A0 is obtained by inverting all the bits in the multiplier factor A by the logic NOT operation or the constants A1 and A2 which satisfy A=A1−A2 are obtained, so that the multiplicand X is multiplied by the constant obtained. As s result, even if the number of all the bits in the multiplier factor A is larger than m/2, it is possible to maintain the number of the partial products at m/2 or less, thereby reducing circuit area and increasing multiplication speed.

In each of the foregoing first to fourth embodiments, circuit information stored in the circuit data storage unit 23 has been described in information representation which represents circuits in terms of functional elements, logic elements, and mounted elements, and more specifically, in terms of inputs and outputs to and from these elements. However, the present invention is not limited thereto, and it is also possible to perform a process of converting circuits in accordance with similar conversion rules, even if information representation based on the relationships among the elements, namely signals, is used instead.

The conversion process is not limited to the process of converting circuits in accordance with the foregoing conversion rules, either. The conversion process can be a process of sequentially generating and entering parts of circuit data in a specified order.

The foregoing embodiments have described only the case in which the product P of the m-bit multiplier factor and n-bit multiplicand more commonly has a given bit width L. If the bit width L of the product P is smaller than (n+m), the lower-order L bits of the multiplication result are used as the product P. Conversely, if the bit width L of the product P is larger than (n+m), the multiplication result having the bit width of (n+m) is used as the lower-order L bits, while the higher-order bits are subjected to sign extension or 0 extension, so as to provide the product P.

We claim:

1. A method of automatically designing a logic circuit for generating information on the logic circuit for calculating the product of a multiplier factor and a multiplicand, comprising the steps of:

with respect to each bit of the multiplier factor,
   (a) judging whether the multiplier factor is a variable or a constant;
   (b) if the multiplier factor is a variable, generating information on a circuit for selecting, based on the value of a bit of concern in the multiplier factor, either of a signal indicating the multiplicand and a signal indicating 0 and outputting the selected signal as a partial product;
   (c) if the multiplier factor is a constant, judging whether or not the value of said bit in the multiplier factor is 1;
   (d) if the value of said bit in the multiplier factor is 1, generating information on a circuit for outputting the signal indicating the multiplicand as a partial product; and
   (e) after executing the steps (a) to (d), generating information on a shift circuit for shifting the signal indicating the multiplicand by one bit and newly setting the output signal from said shift circuit as a signal indicating the multiplicand to be used in the steps (a) to (d), the steps (a) to (e) being repeatedly executed for all the bits of the multiplier factor.

2. A method of automatically designing a logic circuit for generating information on the logic circuit for calculating the product of a multiplier factor and a multiplicand, comprising the steps of:

with respect to each group consisting of n partial products obtained by evenly dividing a plurality of partial products which are the products of the individual bits of the multiplier factor and the multiplicand,
   (a) generating information on an adding circuit for receiving the n partial products in a group of concern and outputting the sum of the n partial products in said group as m (<n) partial products; and with respect to all said plurality of partial products,
   (b) after repeatedly executing the step (a), newly setting all the partial products that are the outputs of the adding circuit generated in the step (a) and those partial products of said plurality of partial products which were not received by the adding circuit generated in the step (a) as the plurality of partial products to be processed in the step (a), the steps (a) and (b) being repeatedly executed.

3. A method of automatically designing a logic circuit for generating information on the logic circuit for calculating the product of a multiplier factor and a multiplicand, comprising the steps of:

with respect to each group consisting of three partial products obtained by evenly dividing a plurality of partial products which are the products of the individual bits of the multiplier factor and the multiplicand, (a) generating information on a carry-save adder for receiving the three partial products in a group of concern and outputting the sum of said three partial products as two partial products; and with respect to all said partial products, (b) after executing the step (a), newly setting all the partial products that are the outputs of the carry-save adder generated in the step (a) and those partial products of said plurality of partial products which were not received by the carry-save adder generated in the step (a) as the plurality of partial products to be processed in the step (a), the steps (a) and (b) being repeatedly executed until the number of the new partial products newly set in the step (b) becomes two.

4. A method of automatically designing a logic circuit for generating information on the logic circuit for calculating the product of a multiplier factor and a multiplicand, comprising the steps of:

(a) detecting the number of partial products as the products of the individual bits of the multiplier factor and the multiplicand;

(b) if the number of the partial products is n or more, with respect to each group consisting of n partial products obtained by evenly dividing a plurality of partial products, (b-1) generating information on an adding circuit for receiving the n partial products in a group of concern and outputting the sum of said n partial products as m (<n) partial products and with respect to all said plurality of partial products, (b-2) after repeatedly executing the step (b-1), newly setting all the partial products that are the outputs of the adding circuit generated in the step (b-1) and those partial products of said plurality of partial products which were not received by the adding circuit generated in the step (b-1) as the plurality of partial products to be processed in the step (b-1), the steps (b-1) and (b-2) being repeatedly executed until the number of the partial products newly set in the step (b-2) becomes m; and (c) if the number of the partial products is m or less and 2 or more, generating information on a final sum circuit for receiving said number or partial products and calculating the product of the multiplier factor and the multiplicand by adding up said partial products.

5. A method of automatically designing a logic circuit for generating information on the logic circuit for calculating the product of a multiplier factor and a multiplicand, comprising the steps of:

(a) with respect to each bit of the multiplier factor, (a-1) judging whether the multiplier factor is a variable or a constant, (a-2) if the multiplier factor is a variable, generating information on a circuit for selecting, based on the value of a bit of concern in the multiplier factor, either of a signal indicating the multiplicand and a signal indicating 0 and outputting the selected signal as a partial product, (a-3) if the multiplier factor is a constant, judging whether or not the value of said bit in the multiplier factor is 1, (a-4) if the value of said bit in the multiplier factor is 1, generating information on a circuit for outputting the signal indicating the multiplicand as a partial product;

(a-5) after executing the steps (a-1) to (a-4), generating information on a shift circuit for shifting the signal indicating the multiplicand by one bit and newly setting the output signal from said shift circuit as a signal indicating the multiplicand to be used in the steps (a-1) to (a-4), with respect to all the bits of the multiplier factor, the steps (a-1) to (a-5) being repeatedly executed so as to generate partial products as the products of the individual bits of the multiplier factor and the multiplicand;

(b) detecting the number of said partial products;

(c) if the number of the partial products is n or more, with respect to each group consisting of n partial products obtained by evenly dividing a plurality of partial products, (c-1) generating information on an adding circuit for receiving the n partial products in a group of concern and outputting the sum of said n partial products as m (<n) partial products and with respect to all said plurality of partial products, (c-2) after repeatedly executing the step (c-1), newly setting all the partial products that are the outputs of the adding circuit generated in the step (c-1) and those partial products of said plurality of partial products which were not received by the adding circuit generated in the step (c-1) as the plurality of partial products to be processed in the step (c-1), the steps (c-1) and (c-2) being repeatedly executed until the number of the partial products newly set in the step (c-2) becomes m; and (d) if the number of the partial products is m or less and 2 or more, generating information on a final sum circuit for receiving said number of partial products and calculating the product of the multiplier factor and the multiplicand by adding up said partial products.

6. A method of automatically designing a logic circuit for generating information on the logic circuit for calculating the product of a multiplier factor and a multiplicand, comprising the steps of:

(a) determining two constants A1 and A2 so that the difference (A1−A2) between the constants A1 and A2 equals the constant multiplier factor A;

(b) generating information on a first partial-product generating circuit for receiving the constant A1 and the multiplicand X and outputting their partial products;

(c) generating information on a second partial-product generating circuit for receiving the constant A2 and the multlplicand X and outputting their partial products;

(d) generating information on a logic NOT circuit for receiving the output signals from said second partial-product generating circuit and outputting the logic NOT signals thereof; and (e) generating information on a circuit for receiving the output signals from said first partial-product generating circuit, the output signals from said logic NOT circuit, and a correction signal, calculating the sum thereof, and outputting the sum as the product of the multiplier factor A and the multiplicand X.

7. A method of automatically designing a logic circuit according to claim 6, wherein the step (e) has the steps of:

(e-1) generating information on a partial-product adding circuit for receiving the output signals from said first partial-product generating circuit and the output signals from said logic NOT circuit and outputting the addition results as a specified number of partial products; and (e-2) generating information on a final sum circuit for receiving the output signals from said partial-product adding circuit and the correction signal, calculating the sum thereof, and outputting the sum as the product of the multiplier factor A and the multiplicand X.

8. A method of automatically designing a logic circuit according to claim 6, wherein the step (e) has the steps of:

(e-1) with respect to each group consisting of n partial products obtained by evenly dividing a plurality of partial products, (e-1-1) generating information on an adding circuit for receiving the n partial products in a group of concern and outputting the sum of said n partial products as m (<n) partial products and with respect to all said plurality of partial products, (e-1-2) after repeatedly executing the step (e-1-1), newly setting all the partial products that are the outputs of the adding circuit generated in the step (e-1-1) and those partial products of said plurality of partial products which were not received by the adding circuit generated in the step (e-1-1) as the plurality of partial products to be processed in the step (e-1-1), the steps (e-1-1) and (e-1-2) being repeatedly executed so as to generate information on a partial-product adding circuit for outputting m partial products; and (e-2) generating information on a final sum circuit for receiving the output signals from said partial-product adding circuit and the correction signal, calculating the sum thereof, and outputting the sum as the product of the multiplier factor A and the multiplicand X.

9. A method of automatically designing a logic circuit according to claim 6, wherein the step (e) has the steps of:

(e-1) judging whether the sum of the number of the bits having the value of 1 in the constant A1 and the number of the bits having the value of 1 in the constant A2 is equal to or larger than a specified number;

(e-2) if the sum of the number of the bits having the value of 1 in the constant A1 and the number of the bits having the value of 1 in the constant A2 is equal to said specified number, generating information on a final sum circuit for receiving the output signals from said first partial-product generating circuit, the output signals from said logic NOT circuit, and the correction signal, calculating the sum thereof. and outputting the sum as the product of the multiplier factor A and the multiplicand X; and (e-3) if the sum of the number of the bits having the value of 1 in the constant A1 and the number of the bits having the value of 1 in the constant A2 is larger than said specified number, (e-3-1) generating information on a partial-product adding circuit for receiving the output signals from said first partial -product generating circuit and the output signals from said logic NOT circuit and outputting the addition results as said specified number of partial products and (e-3-2) generating information on a final sum circuit for receiving the output signals from said partial-product adding circuit and the correction signal, calculating the sum thereof, and outputting the sum as the product of the multiplier factor A and the multiplicand X.

10. A method of automatically designing a logic circuit according to claim 6, wherein the step (e) has the steps of:

(e-1) judging whether the sum of the number of the bits having the value of 1 in the constant A1 and the number of the bits having the value of 1 in the constant A2 is 1, 2, or larger than 2;

(e-2) if the sum of the number of the bits having the value of 1 in the constant A1 and the number of the bits having the value of 1 in the constant A2 is 1, generating information on a circuit for outputting the output signals from said first partial-product generating circuit as the product of the multiplier factor A and the multiplicand X;

(e-3) if the sum of the number of the bits having the value of 1 in the constant A1 and the number of the bits having the value of 1 in the constant A2 is 2, generating information on a final sum circuit for receiving the output signals from said first partial-product generating circuit, the output signals from said logic NOT circuit, and the correction signal, calculating the sum thereof, and outputting the sum as the product of the multiplier factor A and the multiplicand X; and (e-4) if the sum of the number of the bits having the value of 1 in the constant A1 and the number of the bits having the value of 1 in the constant A2 is larger than 2, (e-4-1) generating information on a partial-product adding circuit, composed of carry-save adders arranged in a tree structure, for receiving the output signals from said first partial-product generating circuit and the output signals from said logic NOT circuit and outputting the addition results as two partial products, and (e-4-2) generating information on a final sum circuit for receiving the output signals from said partial-product adding circuit and the correction signal, calculating the sum thereof, and outputting the sum as the product of the multiplier factor A and the multiplicand X.

11. A method of automatically designing a logic circuit for generating information on the logic circuit for calculating the product of a multiplier factor and a multiplicand, comprising the steps of:

(a) determining two constants A1 and A2 so that the difference (A1–A2) between the constants A1 and A2 equals the constant multiplier factor A and that the sum of the number of the bits having the value of 1 in the constant A1 and the number of the bits having the value of 1 in the constant A2 is minimized;

(b) generating information on a first partial-product generating circuit for receiving the constant A1 and the multiplicand X and outputting their partial products;

(c) generating information on a second partial-product generating circuit for receiving the constant A2 and the multiplicand X and outputting their partial products;

(d) generating information on a logic NOT circuit for receiving the output signals from said second partial-product generating circuit and outputting the logic NOT signals thereof; and (e) generating information on a partial-product-sum circuit for receiving the output signals from said first partial-product generating circuit, the output signals from the logic NOT circuit, and a correction signal, calculating the sum thereof, and outputting the sum as the product of the multiplier factor A and the multiplicand X.

12. A method of automatically designing a logic circuit for generating information on the logic circuit for calculating the product of a multiplier factor and a multiplicand, comprising the steps of:

(a) determining two constants A1 and A2 so that the difference between the constants A1 and A2 equals the constant multiplier factor A;

(b) with respect to each bit of the constant A1, (b-1) judging whether or not the value of a bit of concern in the constant A1 is 1, (b-2) if the value of said bit in the constant A1 is 1, generating information on a circuit for outputting a signal indicating the multiplicand X as a partial product, and (b-3) after executing the steps (b-1) and (b-2), generating information on a first shift circuit for shifting the signal indicating the multiplicand X by one bit and newly setting the output signal from said first shift circuit as the signal indicating the multiplicand X to be used in the steps (b-1) and (b-2), the steps (b-1) to (b-3) being repeatedly executed with respect to all the bits of the constant A1 so as to generate a first partial-product generating circuit;

(c) with respect to each bit of the constant A2, (c-1) judging whether or not the value of a bit of concern in the constant A2 is 1, (c-2) if the value of said bit in the constant A2 is 1, generating information on a circuit for outputting the signal indicating the multiplicand X as a partial product, and (c-3) after executing the steps (c-1) and (c-2), generating information on a second shift circuit for shifting the signal indicating the multiplicand X by one bit and newly setting the output signal from said second shift circuit as the signal indicating the multiplicand X to be used in the steps (c-1) and (c-2), the steps (c-1) to (c-3) being repeatedly executed with respect to all the bits of the constant A2 so as to generate a second partial-product generating circuit;

(d) generating information on a logic NOT circuit for receiving the output signals from said second partial-product generating circuit and outputting the logic NOT signals thereof; and (e) generating information on a circuit for receiving the output signals from said first partial-product generating circuit, and the output signals from said logic NOT circuit, and a correction signal, calculating the sum thereof, and outputting the sum as the product of the multiplier factor A and the multiplicand.

13. A method of automatically designing a logic circuit for generating information on the logic circuit for calculating the product of a multiplier factor and a multiplicand, comprising the steps of:

(a) producing the logic NOT signal of the constant multiplier factor A from the multiplier factor A;

(b) with respect to each bit of the logic NOT signal of said multiplier factor A, (b-1) judging whether or not the value of a bit of concern in the logic NOT signal of said multiplier factor A is 1, (b-2) if the value of said bit in the logic NOT signal of said multiplier factor A is 1, generating information on a circuit for outputting a signal indicating the multiplicand X as a partial product, and (b-3) after executing the steps (b-1) and (b-2), generating information on a shift circuit for shifting the signal indicating the multiplicand X by one bit and newly setting the output signal from said shift circuit as the multiplicand X to be used in the steps (b-1) and (b-2), the steps (b-1) to (b-3) being repeatedly executed with respect to all the bits of the logic NOT signal of said multiplier factor A so as to generate information on a partial-product generating circuit;

(c) generating information on a partial-product adding circuit for receiving all the output signals from said partial-product generating circuit and the signal indicating the multiplicand X and outputting the addition results as a specified number of partial products;

(d) generating information on a logic NOT circuit for receiving the output signals from said partial-product adding circuit and outputting the logic NOT signals thereof;

(e) generating a correction signal from the multiplicand X; and (f) generating information on a final sum circuit for receiving said correction signal and the output signals from said logic NOT circuit, calculating the sum thereof, and outputting the sum as the product of the multiplier factor A and the multiplicand X.

14. A method of automatically designing a logic circuit for generating information on the logic circuit for calculating the product of a multiplier factor and a multiplicand, comprising the steps of:

(a) producing the logic NOT signal of the constant multiplier factor A from the multiplier factor A;

(b) with respect to each bit of the logic NOT signal of said multiplier factor A, (b-1) judging whether or not the value of a bit of concern in the logic NOT signal of said multiplier factor A is 1, (b-2) if the value of said bit in the logic NOT signal of said multiplier factor is 1, generating information on a circuit for outputting a signal indicating the multiplicand X as a partial product, and (b-3) after executing the steps (b-1) and (b-2), generating information on a shift circuit for shifting the signal indicating the multiplicand X by one bit and newly setting the output signal from said shift circuit as the multiplicand X to be used in the steps (b-1) and (b-2), the steps (b-1) to (b-3) being repeatedly executed with respect to all the bits of the logic NOT signal of said multiplier factor A so as to generate information on a partial-product generating circuit;

(c) with respect to each group consisting of n input signals obtained by evenly dividing a plurality of input signals composed of all the output signals from said partial-product generating circuit and the signal indicating the multiplicand X, (c-1) generating information on an adding circuit for receiving the n input signals in a group of concern and outputting the sum of said n input signals as m (<n) signals and with respect to all said input signals, (c-2) after repeatedly executing the step (c-1), newly setting all the output signals from the adding circuit generated in the step (c-1) and those input signals of said plurality of input signals which were not received by the adding circuit generated in the step (c-1) as the plurality of input signals to be processed in the step (c-1), the steps (c-1) and (c-2) being repeatedly executed so as to generate information on a partial-product adding circuit;

(d) generating information on a logic NOT circuit for receiving the output signals from said partial-product adding circuit and outputting the logic NOT signals thereof;

(e) producing a correction signal from the multiplicand X; and (f) generating a final sum circuit for receiving said correction signal and the output signals from said logic NOT circuit, calculating the sum thereof, and outputting the sum as the product of the multiplier factor A and the multiplicand X.

15. A method of automatically designing a logic circuit for generating information on the logic circuit for calculating the product of a multiplier factor and a multiplicand, comprising the steps of:

(a) determining two constants A1 and A2 so that the difference (A1–A2) between the constants A1 and A2 equals the constant multiplier factor A;

(b) judging whether or not the constant A2 is 0;

(c) if the constant A2 is 0, (c-1) generating information on a first partial-product generating circuit for receiving the multiplier factor A1 and the multiplicand X and outputting their partial products and (c-2) generating information on a first partial-product-sum circuit for receiving all the output signals from said first partial-product generating circuit, calculating the sum thereof, and outputting the sum as the product of the multiplier factor A and the multiplicand X; and (d) if the constant A2 is not 0, (d-1) generating information on a second partial-product generating circuit for receiving the constant A1 and the multiplicand X and outputting their partial products, (d-2) generating information on a third partial-product generating circuit for receiving the constant A2 and the multiplicand X and outputting their partial products, (d-3) generating information on a logic NOT circuit for receiving the output signals from said third partial-product generating circuit and outputting the logic NOT signals thereof, and (d-4) generating information on a second partial-product-sum circuit for receiving the output signals from said second partial-product generating circuit, the output signals from said logic NOT circuit, and a correction signal, calculating the sum thereof, and outputting the sum as the product of the multiplier factor A and the multiplicand X.

16. A method of automatically designing a logic circuit for generating information on the logic circuit for calculating the product of a multiplier factor and the multiplicand, comprising the steps of:

(a) determining three constants A1, A2, and A3 so that the difference A1–(A2+A3) between the constant A1 and the sum of the constants A2 and A3 equals the constant multiplier factor A;

(b) judging whether or not the constant A1 is equal to the multiplier factor A and whether or not each of the constants A2 and A3 is 0;

(c) if the constant A1 is equal to the multiplier factor A, (c-1) generating information on a first partial-product generating circuit for receiving the multiplier factor A1 and the multiplicand X and outputting their partial products and (c-2) generating information on a first partial-product-sum circuit for receiving all the output signals from said first partial-product generating circuit, calculating the sum thereof, and outputting the sum as the product of the multiplier factor A and the multiplicand X; and (d) if the constant A1 is not equal to the multiplier factor A and at least either one of the constants A2 and A3 is not 0, (d-1) generating information on a second partial-product generating circuit for receiving the constant A1 and the multiplicand X and outputting their partial products, (d-2) generating information on a third partial-product generating circuit for receiving the constant A2 and A3 and the multiplicand X and outputting their partial products, (d-3) generating information on a first logic NOT circuit for receiving the output signals from said third partial-product generating circuit and outputting the logic NOT signals thereof, and (d-4) generating information on a second partial-product-sum circuit for receiving the output signals from said second partial-product generating circuit, the output signals from said first logic NOT circuit, and a first correction signal, calculating the sum thereof, and outputting the sum as the product of the multiplier factor A and the multiplicand X.

17. A method of automatically designing a logic circuit according to claim 16, wherein with respect to each bit of the constant A1, the step (c-1) has the steps of:

(c-1-1) judging whether or not the value of a bit of concern in the constant A1 is 1;

(c-1-2) if the value of said bit in the constant A1 is 1, generating information on a circuit for outputting a signal indicating the multiplicand X as a partial product; and (c-1-3) after executing the steps (c-1-1) and (c-1-2), generating information on a first shift circuit for shifting the signal indicating the multlplicand X by one bit and newly setting the output signal from said first shift circuit as the signal indicating the multiplicand X to be used in the steps (c-1-1) and (c-1-2), with respect to all the bits of the constant A1, the steps (c-1-1) to (c-1-3) being repeatedly executed so as to generate the first partial-product generating circuit, with respect to each bit of the constant A1, the step (d-1) has the steps of:

(d-1-1) judging whether or not the value of the bit of concern of the constant A1 is 1;

(d-1-2) if the value of said bit in the constant A1 is 1, generating information on a circuit for outputting the signal indicating the multiplicand X as a partial product; and (d-1-3) after executing the steps (d-1-1) and (d-1-2), generating information on a second shift circuit for shifting the signal indicating the multiplicand X by one bit and newly setting the output signal from said second shift circuit as the signal indicating the multiplicand X to be used in the steps (d-1-1) and (d-1-2), with respect to all the bits of the constant A1, the steps (d-1-1) to (d-1-3) being repeatedly executed so as to generate the second partial-product generating circuit, and with respect to each bit of the constants A2 and A3, the step (d-2) has the steps of:

(d-2-1) judging whether or not the value of a bit of concern in the constants A2 and A3 is 1;

(d-2-2) if the value of said bit in the constants A2 and A3 is 1, generating information on a circuit for outputting the signal indicating the multiplicand X as a partial product; and (d-2-3) after executing the steps (d-2-1) and (d-2-2), generating information on a third shift circuit for shifting the signal indicating the multiplicand X by one bit and newly setting the output signal from said third shift circuit as the signal indicating the multiplicand X to be used in the steps (d-2-1) and (d-2-2), with respect to all the bits of the constants A2 and A3, the steps (d-2-1) to (d-2-3) being repeatedly executed so as to generate the third partial-product generating circuit.

18. A method of automatically designing a logic circuit according to claim 16, wherein with respect to each group consisting of n partial products which was obtained by evenly dividing a plurality of first partial products composed of the output signals from said first partial-product generating circuit, the step (c-2) has the steps of:

(c-2-1) generating information on an adding circuit for receiving the n partial products in a group of concern and outputting the sum of said n partial products as m (<n) partial products; and with respect to all said plurality of first partial products, (c-2-2) after repeatedly executing the step (c-2-1), newly setting all the partial products that are the outputs of the adding circuit generated in the step (c-2-1) and those partial products of said plurality of first partial products which were not received by the adding circuit generated in the step (c-2-1) as the plurality of first partial products to be processed in the step (c-2-1), the steps (c-2-1) and (c-2-2) being repeatedly executed so as to generate information on the first partial-product-sum circuit and with respect to each group consisting of n partial products which was obtained by evenly dividing a plurality of second partial products composed of the output signals from said second partial-product generating circuit, the output signals from said first logic NOT circuit, and the first correction signal, the step (d-4) has the steps of:

(d-4-1) generating information on an adding circuit for receiving the n partial products in a group of concern and outputting the sum of said n partial products as m (<n) partial products; and with respect to all said plurality of second partial products, (d-4-2) after repeatedly executing the step (d-4-1), newly setting all the partial products that are the outputs of the adding circuit generated in the step (d-4-1) and those partial products of said plurality of second partial products which were not received by the adding circuit generated in the step (d-4-1) as the plurality of second partial products to be processed in the step (d-4-1), the steps (d-4-1) and (d-4-2) being repeatedly executed so as to generate information on the second partial-product-sum circuit.

19. A method of automatically designing a logic circuit according to claim 16, further comprising the steps of:

(e) judging whether or not the constant A2 is equal to the logic NOT of the multiplier factor A and the constant A3 is 1; and (f) if the constant A2 is equal to the logic NOT of the multiplier A and the constant A3 is 1, (f-1) generating information on a fourth partial-product generating circuit for receiving the constant A2 and the multiplicand X and outputting their partial products, (f-2) generating information on a partial-product adding circuit for receiving all the output signals from said fourth partial-product generating circuit and a signal indicating the multiplicand X and outputting the addition results as partial products, (f-3) generating information on a second logic NOT circuit for receiving the output signals from said partial-product adding circuit and outputting the logic NOT signals thereof, (f-4) producing a second correction signal from the multiplicand X, and (f-5) generating information on a final sum circuit for receiving said second correction signal and the output signals from said second logic NOT circuit, calculating the sum thereof, and outputting the sum as the product of the multiplier factor A and the multiplicand X.

20. A method of automatically designing a logic circuit according to claim 19, wherein with respect to each bit of the constant A1, the step (c-1) has the steps of:

(c-1-1) judging whether or not the value of a bit of concern in the constant A1 is 1;

(c-1-2) if the value of said bit in the constant A1 is 1, generating information on a circuit for outputting the signal indicating the multiplicand X as a partial product; and (c-1-3) after executing the steps (c-1-1) and (c-1-2), generating information on a first shift circuit for shifting the signal indicating the multlplicand X by one bit and newly setting the output signal from said first shift circuit as the signal indicating the multiplicand X to be used in the steps (c-1-1) and (c-1-2), with respect to all the bits of the constant A1, the steps (c-1-1) to (c-1-3) being repeatedly executed so as to generate the first partial-product generating circuit, with respect to each bit of the constant A1, the step (d-1) has the steps of:

(d-1-1) judging whether or not the value of a bit of concern in the constant A1 is 1;

(d-1-2) if the value of said bit in the constant A1 is 1, generating information on a circuit for outputting the signal indicating the multiplicand X as a partial product; and (d-1-3) after executing the steps (d-1-1) and (d-1-2), generating information on a second shift circuit for shifting the signal indicating the multiplicand X by one bit and newly setting the output signal from said second shift circuit as the signal indicating the multlplicand X to be used in the steps (d-1-1) and (d-1-2), with respect to all the bits of the constant A1, the steps (d-1-1) to (d-1-3) being repeatedly executed so as to generate the second partial-product generating circuit, and with respect to each bit of the constants A2 and A3, the step (d-2) has the steps of:

(d-2-1) judging whether or not the value of a bit of concern in the constants A2 and A3 is 1;

(d-2-2) if the value of said bit in the constants A2 and A3 is 1, generating information on a circuit for outputting the signal indicating the multiplicand X as a partial product;

(d-2-3) after executing the steps (d-2-1) and (d-2-2), generating information on a third shift circuit for shifting the signal indicating the multiplicand X by one bit and newly setting the output of said third shift circuit as the signal indicating the multiplicand X to be used in the steps (d-2-1) and (d-2-2), with respect to all the bits of the constants A2 and A3, the steps (d-2-1) to (d-2-3) being repeatedly executed so as to generate the third partial-product generating circuit; and with respect to each bit of the constant A2, the step (f-1) has the steps of:

(f-1-1) judging whether or not the value of a bit of concern in the constant A2 is 1;

(f-1-2) if the value of said bit in the constant A2 is 1, generating information on a circuit for outputting the signal indicating the multiplicand X as a partial product; and (f-1-3) after executing the steps (f-1-1) and (f-1-2), generating information on a fourth shift circuit for shifting the signal indicating the multiplicand X by one bit and newly setting the output of said fourth shift circuit as the signal indicating the multiplicand X to be used in the steps (f-1-1) and (f-1-2), with respect to all the bits of the constant A2, the steps (f-1-1) to (f-1-3) being repeatedly executed so as to generate the fourth partial-product generating circuit.

21. A method of automatically designing a logic circuit according to claim 19, wherein with respect to each group consisting of n partial products which was obtained by evenly dividing a plurality of first partial products composed of the output signals from said first partial-product generating circuit, the step (c-2) has the steps of:

(c-2-1) generating information on an adding circuit for receiving the n partial products in a group of concern and outputting the sum of said n partial products as m (<n) partial products; and with respect to all said plurality of first partial products, (c-2-2) after repeatedly executing the step (c-2-1), newly setting all the partial products that are the outputs of the adding circuit generated in the step (c-2-1) and those partial products of said plurality of first partial products which were not received by the adding circuit generated in the step (c-2-1) as the plurality of first partial products to be processed in the step (c-2-1), the steps (c-2-1) and (c-2-2) being repeatedly executed so as to generate information on the first partial-product-sum circuit, with respect to each group consisting of n partial products which was obtained by evenly dividing a plurality of second partial products composed of the output signals from said second partial-product generating circuit, the output signals from said first logic NOT circuit, and the first correction signal, the step (d-4) has the steps of:

(d-4-1) generating information on an adding circuit for receiving the n partial products in a group of concern and outputting the sum of said n partial products as m (<n) partial products; and with respect to all said plurality of second partial products, (d-4-2) after repeatedly executing the step (d-4-1), newly setting all the partial products that are the outputs of the adding circuit generated in the step (d-4-1) and those partial products of said plurality of second partial products which were not received by the adding circuit generated in the step (d-4-1) as the plurality of second partial products to be processed in the step (d-4-1), the steps (d-4-1) and (d-4-2) being repeatedly executed so as to generate information on the second partial-product-sum circuit, and with respect to each group consisting of n partial products which was obtained by evenly dividing a plurality of third partial products composed of the output signals from said fourth partial-product generating circuit and the signal indicating the multiplicand X, the step (f-2) has the steps of:

(f-2-1) generating information on an adding circuit for receiving the n partial products in a group of concern and outputting the sum of said n partial products as m (<n) partial products; and with respect to all said plurality of third partial products, (f-2-2) after repeatedly executing the step (f-2-1), newly setting all the partial products that are the outputs of the adding circuit generated in the step (f-2-1) and those partial products of said plurality of third partial products which were not received by the adding circuit generated in the step (f-2-1) as the plurality of third partial products to be processed in the step (f-2-1), the steps (f-2-1) and (f-2-2) being repeatedly executed so as to generate information on the partial-product adding circuit.

22. A method of automatically designing a logic circuit for generating information on the logic circuit for calculating the product of a multiplicand and a multiplier, comprising the steps of:

(a) determining three constants A1, A2, and A3 so that the difference A1−(A2+A3) between the constant A1 and the sum of the constants A2 and A3 equals the constant multiplier factor A and that the sum of the number of the bits having the value of 1 in the constant A1, the number of the bits having the value of 1 in the constant A2, and the number of the bits having the value of 1 in the constant A3 is minimized;

(b) judging whether or not the constant A1 is equal to the multiplier factor A and whether or not each of the constants A2 and A3 is 0;

(c) if the constant A1 is equal to the multiplier factor A, (c-1) generating information on a first partial-product generating circuit for receiving the multiplier factor A1 and the multiplicand X and outputting their partial products and (c-2) generating information on a first partial-product-sum circuit for receiving all the output signals from said first partial-product generating circuit, calculating the sum thereof, and outputting the sum as the product of the multiplier factor A and the multiplicand X;

(d) if the constant A1 is not equal to the multiplier factor A and at least either one of the constants A2 and A3 is not 0, (d-1) generating information on a second partial-product generating circuit for receiving the constant A1 and the multiplicand X and outputting their partial products, (d-2) generating information on a third partial-product generating circuit for receiving the constants A2 and A3 and the multiplicand X and outputting their partial products, (d-3) generating information on a first logic NOT circuit for receiving the output signals from said third partial-product generating circuit and outputting the logic NOT signals thereof, and (d-4) generating information on a second partial-product-sum circuit for receiving the output signals from said second partial-product generating circuit, the output signals from said first logic NOT circuit, and a first correction signal, calculating the sum thereof, and outputting the sum as the product of the multiplier factor A and the multiplicand X.

23. A method of automatically designing a logic circuit according to claim 22, wherein with respect to each bit of the constant A1, the step (c-1) has the steps of:
  (c-1-1) judging whether or not the value of a bit of concern in the constant A1 is 1;
  (c-1-2) if the value of said bit in the constant A1 is 1, generating information on a circuit for outputting a signal indicating the multiplicand X as a partial product; and
  (c-1-3) after executing the steps (c-1-1) and (c-1-2), generating information on a first shift circuit for shifting the signal indicating the multiplicand X by one bit and newly setting the output signal from said first shift circuit as the multiplicand X to be used in the steps (c-1-1) and (c-1-2), with respect to all the bits of the constant A1, the steps (c-1-1) to (c-1-3) being repeatedly executed so as to generate the first partial-product generating circuit, and with respect to each bit of the constant A1, the step (d-1) has the steps of:
  (d-1-1) judging whether or not the value of a bit of concern in the constant A1 is 1;
  (d-1-2) if the value of said bit in the constant A1 is 1, generating information on a circuit for outputting the signal indicating the multiplicand X as a partial product; and
  (d-1-3) after executing the steps (d-1-1) and (d-1-2), generating information on a second shift circuit for shifting the signal indicating the multiplicand X by one bit and newly setting the output signal from said second shift circuit as the multiplicand X to be used in the steps (d-1-1) and (d-1-2), with respect to all the bits of the constant A1, the steps (d-1-1) to (d-1-3) being repeatedly executed so as to generate the second partial-product generating circuit, and with respect to each bit of the constants A2 and A3, the step (d-2) has the steps of:
  (d-2-1) judging whether or not the value of a bit of concern in the constants A2 and A3 is 1;
  (d-2-2) if the value of said bit in the constants A2 and A3 is 1, generating information on a circuit for outputting the signal indicating the multiplicand X as a partial product;
  (d-2-3) after executing the steps (d-2-1) and (d-2-2), generating information on a third shift circuit for shifting the signal indicating the multiplicand X by one bit and newly setting the output signal from said third shift circuit as the multiplicand X to be used in the steps (d-2-1) and (d-2-2), with respect to all the bits of the constants A2 and A3, the steps (d-2-1) to (d-2-3) being repeatedly executed so as to generate the third partial-product generating circuit.

24. A method of automatically designing a logic circuit according to claim 22, wherein with respect to each group consisting of n partial products which was obtained by evenly dividing a plurality of first partial products composed of the output signals from said first partial-product generating circuit, the step (c-2) has the steps of:
  (c-2-1) generating information on an adding circuit for receiving the n partial products in a group of concern and outputting the sum of said n partial products as m ($<$n) partial products; and with respect to all said plurality of first partial products,
  (c-2-2) after repeatedly executing the step (c-2-1), newly setting all the partial products that are the outputs of the adding circuit generated in the step (c-2-1) and those partial products of said plurality of first partial products which were not received by the adding circuit generated in the step (c-2-1) as the plurality of first partial products to be processed in the step (c-2-1), the steps (c-2-1) and (c-2-2) being repeatedly executed so as to generate information on the first partial-product-sum circuit, and with respect to each group consisting of n partial products which was obtained by evenly dividing a plurality of second partial products composed of the output signals from said second partial-product generating circuit, the output signals from said first logic NOT circuit, and the first correction signal, the step (d-4) has the steps of:
  (d-4-1) generating information on an adding circuit for receiving the n partial products in a group of concern and outputting the sum of said n partial products as m ($<$n) partial products; and with respect to all said plurality of second partial products,
  (d-4-2) after repeatedly executing the step (d-4-1), newly setting all the partial products that are the outputs of the adding circuit generated in the step (d-4-1) and those partial products of said plurality of second partial products which were not received by the adding circuit generated in the step (d-4-1) as the plurality of second partial products to be processed in the step (d-4-1), the steps (d-4-1) and (d-4-2) being repeatedly executed so as to generate information on the second partial-product-sum circuit.

25. A method of automatically designing a logic circuit according to claim 22, further comprising the steps of:

(e) judging whether or not the constant A2 is equal to the logic NOT of the multiplier factor A and the constant A3 is 1; and (f) if the constant A2 is equal to the logic NOT of the multiplier factor A and the constant A3 is 1, (f-1) generating information on a fourth partial-product generating circuit for receiving the constant A2 and the multiplicand X and outputting their partial products, (f-2) generating information on a partial-product adding circuit for receiving all the output signals from said fourth partial-product generating circuit and a signal indicating the multiplicand X and outputting the addition results as partial products, (f-3) generating information on a second logic NOT circuit for receiving the output signals from said partial-product adding circuit and outputting the logic NOT signals thereof;

(f-4) producing a second correction signal from the multiplicand X, and (f-5) receiving said second correction signal and the output signals from said second logic NOT circuit, calculating the sum thereof, and outputting the sum as the product of the multiplier factor A and the multiplicand X.

26. A method of automatically designing a logic circuit according to claim 25, wherein with respect to each bit of the constant A1, the step (c-1) has the steps of:
(c-1-1) judging whether or not the value of a bit of concern in the constant A1 is 1;
(c-1-2) if the value of said bit in the constant A1 is 1, generating information on a circuit for outputting a signal indicating the multiplicand X as a partial product; and
(c-1-3) after executing the steps (c-1-1) and (c-1-2), generating information on a first shift circuit for shifting the signal indicating the multiplicand X by one bit and newly setting the output of said first shift circuit as the multiplicand X to be used in the steps (c-1-1) and (c-1-2), with respect to all the bits of the constant A1, the steps (c-1-1) to (c-1-3) being repeatedly executed so as to generate the first partial-product generating circuit, with respect to each bit of the constant A1, the step (d-1) has the steps of:
(d-1-1) judging whether or not the value of a bit of concern in the constant A1 is 1;
(d-1-2) if the value of said bit in the constant A1 is 1, generating information on a circuit for outputting the signal indicating the multiplicand X as a partial product; and
(d-1-3) after executing the steps (d-1-1) and (d-1-2), generating information on a second shift circuit for shifting the signal indicating the multiplicand X by one bit and newly setting the output of said second shift circuit as the multiplicand X to be used in the steps (d-1-1) and (d-1-2), with respect to all the bits of the constant A1, the steps (d-1-1) to (d-1-3) being repeatedly executed so as to generate the second partial-product generating circuit, and with respect to each bit of the constants A2 and A3, the step (d-2) has the steps of:
(d-2-1) judging whether or not the value of a bit of concern in the constants A2 and A3 is 1;
(d-2-2) if the value of said bit in the constants A2 and A3 is 1, generating information on a circuit for outputting the signal indicating the multiplicand X as a partial product;
(d-2-3) after executing the steps (d-2-1) and (d-2-2), generating information on a third shift circuit for shifting the signal indicating the multiplicand X by one bit and newly setting the output signals from said third shift circuit as the multiplicand X to be used in the steps (d-2-1) and (d-2-2), with respect to all the bits of the constants A2 and A3, the steps (d-2-1) to (d-2-3) being repeatedly executed so as to generate the third partial-product generating circuit; and with respect to each bit of the constant A2, the step (f-1) has the steps of:
(f-1-1) judging whether or not the value of a bit of concern in the constant A2 is 1;
(f-1-2) if the value of a bit of concern in the constant A2 is 1, generating information on a circuit for outputting the signal indicating the multiplicand X as a partial product; and
(f-1-3) after executing the steps (f-1-1) and (f-1-2), generating information on a fourth shift circuit for shifting the signal indicating the multiplicand X by one bit and newly setting the output signal from said fourth shift circuit as the multiplicand X to be used in the steps (f-1-1) and (f-1-2), with respect to all the bits of the constant A2, the steps (f-1-1) to (f-1-3) being repeatedly executed so as to generate the fourth partial-product generating circuit.

27. A method of automatically designing a logic circuit according to claim 25, wherein with respect to each group consisting of n partial products which was obtained by evenly dividing a plurality of first partial products composed of the output signals from said first partial-product generating circuit, the step (c-2) has the steps of:
(c-2-1) generating information on an adding circuit for receiving the n partial products in a group of concern and outputting the sum of said n partial products as m (<n) partial products; and with respect to all said plurality of first partial products,
(c-2-2) after repeatedly executing the step (c-2-1), newly setting all the partial products that are the outputs of the adding circuit generated in the step (c-2-1) and those partial products of said plurality of first partial products which were not received by the adding circuit generated in the step (c-2-1) as the plurality of first partial products to be processed in the step (c-2-1), the steps (c-2-1) and (c-2-2) being repeatedly executed so as to generate information on the first partial-product-sum circuit, with respect to each group consisting of n partial products which was obtained by evenly dividing a plurality of second partial products composed of the output signals from said second partial-product generating circuit, the output signals from said first logic NOT circuit, and the first correction signal, the step (d-4) has the steps of:
(d-4-1) generating information on an adding circuit for receiving the n partial products in a group of concern and outputting the sum of said n partial products as m (<n) partial products; and with respect to all said plurality of second partial products,
(d-4-2) after repeatedly executing the step (d-4-1), newly setting all the partial products that are the outputs of the adding circuit generated in the step (d-4-1) and those partial products of said plurality of second partial products which were not received by the adding circuit generated in the step (d-4-1) as the plurality of second partial products to be processed in the step (d-4-1), the steps (d-4-1) and (d-4-2) being repeatedly executed so as to generate information on the second partial-product-sum circuit, and with respect to each group consisting of n partial products which was obtained by evenly dividing a plurality of third partial products composed of the output signals from said fourth partial-product generating circuit and the signal indicating the multiplicand X, the step (f-2) has the steps of:
(f-2-1) generating information on an adding circuit for receiving the n partial products in a group of concern and outputting the sum of said n partial products as m (<n) partial products; and with respect to all said plurality of third partial products,
(f-2-2) after repeatedly executing the step (f-2-1), newly setting all the partial products that are the outputs of the adding circuit generated in the step (f-2-1) and those partial products of said plurality of third partial products which were not received by the adding circuit generated in the step (f-2-1) as the plurality of third partial products to be processed in the step (f-2-1), the steps (f-2-1) and (f-2-2) being repeatedly executed so as to generate information on the partial-product adding circuit.

28. A method of automatically designing a logic circuit for generating information on the logic circuit for calculating the product of a multiplier factor and a multiplicand, comprising the steps of:

(a) determining two constants A1 and A2 so that the difference (A1–A2) between the constants A1 and A2 equals the constant multiplier factor A;

(b) judging which is the smaller of the number of the bits having the value of 1 in the multiplier factor A and the sum of the numbers of the bits having the value of 1 in the constants A1 and A2;

(c) if the number of the bits having the value of 1 in the multiplier factor A is the smaller, (c-1) generating information on a first partial-product generating circuit for receiving the multiplier factor A and the multiplicand X and outputting the products of the individual bits in the multiplier factor A and the multiplicand X as partial products, and (c-2) generating information on a first partial-product-sum circuit for receiving all the output signals from said first partial-product generating circuit, calculating the sum thereof, and outputting the sum as the product of the multiplier factor A and the multiplicand X; and (d) if the sum of the numbers of the bits having the value of 1 in the constants A1 and A2 is the smaller, (d-1) generating information on a second partial-product generating circuit for receiving the constant A1 and the multiplicand X and outputting their partial products, (d-2) generating information on a third partial-product generating circuit for receiving the constant A2 and the multiplicand X and outputting their partial products, (d-3) generating information on a logic NOT circuit for receiving the output signals from said third partial-product generating circuit and outputting the logic NOT signals thereof, and (d-4) generating information on a second partial-product-sum circuit for receiving the output signals from said second partial-product generating circuit, the output signals from said logic NOT circuit, and a correction signal, calculating the sum thereof, and outputting the sum as the product of the multiplier factor A and the multiplicand X.

29. A system for automatically designing a logic circuit, comprising:

an input means for receiving various information;

a storage means for storing the various information being processed;

a processing means for producing information on the logic circuit for calculating the product of a multiplier factor and the multiplicand inputted from said input means; and an output means for outputting the information on the logic circuit produced by said processing means, wherein said processing means executes the steps of:

(a) determining two constants A1 and A2 so that the difference (A1–A2) between the constants A1 and A2 equals the constant multiplier factor A;

(b) judging which is the smaller of the number of the bits having the value of 1 in the multiplier factor A and the sum of the numbers of the bits having the value of 1 in the constants A1 and A2;

(c) if the number of the bits having the value of 1 is the smaller, (c-1) generating information on a first partial-product generating circuit for receiving the multiplier factor A and the multiplicand X and outputting the products of the individual bits in the multiplier factor A and the multiplicand X as partial products, and (c-2) generating information on a first partial-product-sum circuit for receiving all the output signals from said first partial-product generating circuit, calculating the sum thereof, and outputting the sum as the product of the multiplier factor A and the multiplicand X; and (d) if the sum of the numbers of the bits having the value of 1 in the constants A1 and A2 is the smaller, (d-1) generating information on a second partial-product generating circuit for receiving the constant A1 and the multiplicand X and outputting their partial products, (d-2) generating information on a third partial-product generating circuit for receiving the constant A2 and the multiplicand X and outputting their partial products, (d-3) generating information on a logic NOT circuit for receiving the output signals from said third partial-product generating circuit and outputting the logic NOT signals thereof, and (d-4) generating information on a second partial-product-sum circuit for receiving the output signals from said second partial-product generating circuit, the output signals from said logic NOT circuit, and a correction signal, calculating the sum thereof, and outputting the sum as the product of the multiplier factor A and the multiplicand X.

30. A system for automatically designing a logic circuit according to claim 29, wherein the first partial-product generating circuit generated in the step (c-2) to be executed by said processing means has:

a first partial-product adding circuit for adding up inputted signals and outputting the addition results as partial products; and a first final-sum circuit for receiving at least the output signals from said first partial-product adding circuit, calculating the sum thereof, and outputting the sum as the product of the multiplier factor A and the multiplicand X and the second partial-product generating circuit generated in the step (d-2) to be executed by said processing means has:

a second partial-product adding circuit for adding up inputted signals and outputting the addition results as partial products; and a second final-sum circuit for receiving at least the output signals from said second partial-product adding circuit, calculating the sum thereof, and outputting the sum as the product of the multiplier factor A and the multiplicand X.

31. A system for automatically designing a logic circuit, comprising:

an input means for receiving various information;

a storage means for storing the various information being processed;

a processing means for producing information on the logic circuit for calculating the product of a multiplier factor and multiplicand inputted from said input means; and an output means for outputting the information on the logic circuit produced by said processing means, wherein said processing means executes the steps of:

(a) determining two constants A1 and A2 so that the difference (A1–A2) between the constants A1 and A2 equals the constant multiplier factor A;

(b) judging which is the smallest of the number of the bits having the value of 1 in the multiplier factor A, the sum of the numbers of the bits having the value of 1 in the constants A1 and A2, and the sum of the number of the bits having the value of 0 in the multiplier factor A and 2;

(c) if the number of the bits having the value of 1 in the multiplier factor A is the smallest, (c-1) generating information on a first partial-product generating circuit for receiving the multiplier factor A and the multiplicand X and outputting the products of the individual bits in the multiplier factor A and the multiplicand X as partial products, and (c-2) generating information on a first partial-product-sum circuit for receiving all the output signals from said first partial-product generating circuit, calculating the sum thereof, and outputting the sum as the product of the multiplier factor A and the multiplicand X;

(d) if the sum of the numbers of the bits having the value of 1 in the constants A1 and A2 is the smallest, (d-1) generating information on a second partial-product generating circuit for receiving the constant A1 and the multiplicand X and outputting their partial products, (d-2) generating information on a third partial-product generating circuit for receiving the constant A2 and the multiplicand X and outputting their partial products, (d-3) generating information on a first logic NOT circuit for receiving the output signals from said third partial-product generating circuit and outputting the logic NOT signals thereof, and (d-4) generating information on a second partial-product-sum circuit for receiving the output signals from said second partial-product generating circuit, the output signals from said first logic NOT circuit, and a first correction signal, calculating the sum thereof, and outputting the sum as the product of the multiplier factor A and the multiplicand X; and (e) if the sum of the number of the bits having the value of 0 in the multiplier factor A and 2 is the smallest, (e-1) generating, from the multiplier factor A, the logic NOT signal thereof, (e-2) generating information on a fourth partial-product generating circuit for receiving said logic NOT signal of the multiplier factor A and the multiplicand X and outputting the products of the individual bits in said logic NOT signal of the multiplier factor A and the multiplicand X as partial products;

(e-3) generating information on a partial-product adding circuit for receiving all the output signals from said fourth partial-product generating circuit and a signal indicating the multiplicand X and outputting the addition results as partial products;

(e-4) generating information on a second logic NOT circuit for receiving the output signals from said partial-product adding circuit and outputting the logic NOT signals thereof;

(e-5) producing a second correction signal from the multiplicand X, and (e-6) generating information on a final sum circuit for receiving said second correction signal and the output signals from said second logic NOT circuit, calculating the sum thereof, and outputting the sum as the product of the multiplier factor A and the multiplicand X.

32. An apparatus for automatically designing a logic circuit having the multiplying function for calculating the product of a multiplier factor and a multiplicand, comprising:

a first means for receiving, from the outside, various information including information on the multiplier factor A, information on the multiplicand X, and information on the product P;

a second means for receiving the information on the multiplier factor A and determining information on a number A1 and information on a constant A2 so that the difference (A1–A2) between the number A1 and constant A2 equals the multiplier factor A;

a third means for receiving the information on the number A1 and the information on the multiplicand X and generating information on a first partial-product generating circuit which receives the number A1 and the multiplicand X and outputs, as partial products, the products of the individual bits the value of which is not 0 in the multiplier factor A and the multiplicand X;

a fourth means for receiving the information on the constant A2 and the information on the multiplicand X and generating information on a second partial-product generating circuit which receives the constant A2 and the multiplicand X and outputs, as partial products, the products of the individual bits the value of which is not 0 in the constant A2 and the multiplicand X;

a fifth means for receiving information on the output signals from said second partial-product generating circuit and generating information on a logic NOT circuit which receives the output signals from said second partial-product generating circuit and outputs the logic NOT signals thereof;

a sixth means for detecting the total number of the output signals from said first partial-product generating circuit and from the logic NOT circuit;

a seventh means for receiving information on the output signals from said first partial-product generating circuit and information on the output signals from the logic NOT circuit and generating information on a partial-product adding circuit which receives all the output signals from said first partial-product generating circuit and from the logic NOT circuit and outputs the addition results as partial products;

an eighth means for receiving either the information on the output signals from said logic NOT circuit or the information on the output signals from the second partial-product generating circuit and generating a correction signal based on the number of the output signals indicated by said received information; and a ninth means for receiving information on the output signals from said partial-product adding circuit, information on said correction signal, and the information on the product P and generating information on a partial-product-sum generating circuit which calculates the sum of the output signals from said partial-product adding circuit and said correction signal, sets said sum to the product P as the product of the multiplier factor A and the multiplicand X, and outputs said product P.

33. An apparatus for automatically designing a logic circuit according to claim 32, wherein said seventh means generates information on a partial-product adding circuit consisting of adders arranged in a tree structure.

34. An apparatus for automatically designing a logic circuit having the multiplying function for calculating the product of a multiplier factor and a multiplicand, comprising:

a first means for receiving, from the outside, various information including information on the multiplier factor A, information on the multiplicand X, and information on the product P;

a second means for receiving the information on the multiplier factor A and determining information on a number A1 and information on a constant A2 so that the difference (A1–A2) between the number A1 and constant A2 equals the multiplier factor A;

a third means for receiving the information on the number A1 and the information on the multiplicand X and generating information on a first partial-product generating circuit which receives the number A1 and the multiplicand X and outputs, as partial products, the products of the individual bits the value of which is not 0 in the number A1 and the multiplicand X;

a fourth means for receiving the information on the constant A2 and the information on the multiplicand X and generating information on a second partial-product generating circuit which receives the constant A2 and the multiplicand X and outputs, as partial products, the products of the individual bits the value of which is not 0 in the constant A2 and the multiplicand X;

a fifth means for receiving information on the output signals from said second partial-product generating circuit and generating information on a logic NOT circuit which receives the output signals from said second partial-product generating circuit and outputs the logic NOT signals thereof;

a sixth means for detecting the total number of the output signals from said first partial-product generating circuit and from the logic NOT circuit;

a seventh means for receiving either information on the output signals from said logic NOT circuit or information on the output signals from the second partial-product generating circuit and generating a correction signal based on the number of the output signals indicated by said received information; and an eighth means for receiving the information on the output signals from said first partial-product generating circuit, the information on the output signals from the logic NOT circuit, and information on said correction signal and generating information on a partial-product adding circuit which receives all the output signals from said first partial-product generating circuit and from the logic NOT circuit and said correction signal and outputs the addition results as partial products; and a ninth means for receiving information on the output signals from said partial-product adding circuit and the information on the product P and generating information on a partial-product-sum generating circuit which calculates the sum of the output signals from said partial-product adding circuit, sets said sum to the product P as the product of the multiplier factor A and the multiplicand X, and outputs said product P.

35. An apparatus for automatically designing a logic circuit according to claim 34, wherein said eighth means generates information on a partial-product adding circuit consisting of adders arranged in a tree structure.

36. An apparatus for automatically designing a logic circuit having the multiplying function for calculating the product of a multiplier factor and a multiplicand, comprising:

a first means for receiving, from the outside, various information including information on the multiplier factor A, information on the multiplicand X, and information on the product P;

a second means for receiving the information on the multiplier factor A and producing the logic NOT signal of the multiplier factor A;

a third means for receiving information on said logic NOT signal of the multiplier factor A and the information on the multiplicand X and generating information on a partial-product generating circuit which receives said logic NOT signal of the multiplier factor A and the multiplicand X and outputs, as partial products, the products of the individual bits the value of which is not 0 in said logic NOT signal of the multiplier factor A and the multiplicand X;

a fourth means for receiving information on the partial products outputted from said partial-product generating circuit and the information on the multiplicand X and generating information on a partial-product adding circuit which receives all the partial products outputted from said partial-product generating circuit and the multiplicand X and outputs the addition results as partial products;

a fifth means for receiving information on the output signals from said partial-product adding circuit and generating information on a logic NOT circuit which receives the output signals from said partial-product adding circuit and outputs the logic NOT signals thereof;

a sixth means for receiving the information on the multiplicand X and generating a correction signal from the multiplicand X; and a seventh means for receiving information on said correction signal, the information on the output signals from said partial-product adding circuit, and the information on the product P and generating information on a partial-product-sum circuit which calculates the sum of said correction signal and the output signals from said partial-product adding circuit, sets said sum to the product P as the product of the multiplier factor A and the multiplicand X, and outputs said product P.

37. An apparatus for automatically designing a logic circuit according to claim 36, wherein said fourth means generates information on a partial-product adding circuit consisting of adders arranged in a tree structure.

38. An apparatus for automatically designing a logic circuit having the multiplying function for calculating the product of a multiplier factor and a multiplicand, comprising:

a first means for receiving from the outside various information including information on the multiplier factor A, information on the multiplicand X, and information on the product P;

a second means for receiving the information on the multiplier factor A and the information on the multiplicand X and generating information on a partial-product generating circuit which receives the multiplier factor A and the multiplicand X and outputs, as partial products, the products of the individual bits the value of which is not 0 in the multiplier factor A and the multiplicand X;

a third means for detecting the number of the output signals from said partial-product generating circuit;

a fourth means for receiving information on the output signals from said partial-product generating circuit and generating information on a partial-product adding circuit which receives all the output signals from said partial-product generating circuit and outputs the addition results as partial products; and a fifth means for receiving information on the output signals from said partial-product adding circuit and the information on the product P and generating information on a partial-product-sum circuit which receives all the output signals from said partial-product adding circuit, calculates the sum thereof, sets said sum to the product P as the product of the multiplier factor A and the multiplicand X, and outputs said product P.

39. An apparatus for automatically designing a logic circuit according to claim 38, wherein said fourth means generates information on a partial-product adding circuit consisting of adders arranged in a tree structure.

40. A multiplier for outputting the product of a multiplier factor A, which satisfies A=A1–A2 with respect the constants A1 and A2, and a multiplicand X, comprising:

a first partial-product generating means for receiving the constant A1 and the multiplicand X and outputting partial products only with respect to the bits having the value of 1 in the constant A1;

a second partial-product generating means for receiving the constant A2 and the multiplicand X and outputting partial products only with respect to the bits having the value of 1 in the constant A2;

a logic NOT means for receiving the output signals from said second partial-product generating means and outputting the logic NOT signals thereof; and a partial-product-sum means for receiving the output signals from said first partial-product generating means, the output signals from said logic NOT means, and a correction signal, calculating the sum thereof, and outputting the sum as the product of the multiplier factor A and the multiplicand X.

41. A multiplier according to claim 40, wherein said partial-product-sum means has:

a partial-product adding means for receiving the output signals from said first partial-product generating means and the output signals from said logic NOT means, adding up the output signals from said first partial-product generating means and the output signals from said logic NOT means by using a single-stage or multi-stage adding means, and outputting the addition results as partial products; and a final sum means for receiving the output signals from said partial-product adding means and the correction signal, calculating the sum thereof, and outputting the sum as the product of the multiplier factor A and the multiplicand X.

42. A multiplier according to claim 41, wherein said adding means includes a carry-save adder.

43. A multiplier for outputting the product of a multiplier factor A and a multiplicand X, comprising:

a partial-product generating means for receiving the logic NOT signal of the multiplier factor A and the multiplicand X and outputting partial products only with respect to the bits having the value of 1 in the logic NOT signal of said multiplier factor A;

a partial-product adding means for receiving the output signals from said partial-product generating means and the multiplicand X, adding up the output signals from said partial-product generating means and the multiplicand X by using a single-stage or multi-stage adding means, and outputting the addition results as partial products;

a logic NOT means for receiving the output signals from said partial-product adding means and outputting the logic NOT signals thereof; and a partial-product-sum means for receiving the output signals from said logic NOT means and a correction signal which can be generated from the multiplicand X, calculating the sum of the output signals from said logic NOT means and said correction signal, and outputting the sum as the product of the multiplier factor A and the multiplicand X.

44. A multiplier according to claim 43, wherein said adding means includes a carry-save adder.

* * * * *

UNITED STATES PATENT AND TRADEMARK OFFICE
CERTIFICATE OF CORRECTION

PATENT NO. : 5,600,569
DATED : February 4, 1997
INVENTOR(S) : NISHIYAMA et al.

It is certified that error appears in the above-identified patent and that said Letters Patent is hereby corrected as shown below:

Col. 41, line 55: Delete "or" and insert --of--

Col. 63, line 33: After "respect", insert --to--

Signed and Sealed this

Sixth Day of October, 1998

Attest:

BRUCE LEHMAN

Attesting Officer

Commissioner of Patents and Trademarks